US009710587B2

(12) United States Patent
Sekido et al.

(10) Patent No.: US 9,710,587 B2
(45) Date of Patent: Jul. 18, 2017

(54) ELECTRIC-SUBSTRATE ELECTRICAL DESIGN APPARATUS USING THREE-DIMENSIONAL SPACE, ELECTRICAL DESIGN METHOD, PROGRAM AND COMPUTER-READABLE RECORDING MEDIUM

(71) Applicant: ZUKEN INC., Kanagawa (JP)

(72) Inventors: Kazuhiko Sekido, Kanagawa (JP); Shinji Takahashi, Kanagawa (JP); Kouki Minami, Kanagawa (JP)

(73) Assignee: Zuken Inc., Kanagawa (JP)

( * ) Notice: Subject to any disclaimer, the term of this patent is extended or adjusted under 35 U.S.C. 154(b) by 254 days.

(21) Appl. No.: 14/007,886

(22) PCT Filed: Oct. 4, 2012

(86) PCT No.: PCT/JP2012/075755
§ 371 (c)(1),
(2) Date: Sep. 26, 2013

(87) PCT Pub. No.: WO2013/058117
PCT Pub. Date: Apr. 25, 2013

(65) Prior Publication Data
US 2014/0303939 A1     Oct. 9, 2014

(30) Foreign Application Priority Data

Oct. 20, 2011  (JP) .................................. 2011-230346

(51) Int. Cl.
*G06F 17/50* (2006.01)
*H05K 3/00* (2006.01)
(Continued)

(52) U.S. Cl.
CPC ...... *G06F 17/5068* (2013.01); *G06F 17/5072* (2013.01); *G06F 17/5077* (2013.01);
(Continued)

(58) Field of Classification Search
CPC ............ G06F 17/5068; G06F 17/5072; G06F 17/5077; H05K 1/0298; H05K 3/0005; G06T 15/00
See application file for complete search history.

(56) References Cited

U.S. PATENT DOCUMENTS 4,496,793 A * 1/1985 Hanson .................. B32B 15/14
174/259
4,658,332 A * 4/1987 Baker .................. H05K 1/0271
174/255
(Continued)

FOREIGN PATENT DOCUMENTS

JP        03-171260 A       7/1991
JP        06-60148 A        3/1994
(Continued)

OTHER PUBLICATIONS

Jeff Tharp, "HFSS 14 Update for SI and RF Applications," Sep. 6, 2011, ANSYS, Inc., 66 pages.*
(Continued)

*Primary Examiner* — Kamini S Shah
*Assistant Examiner* — Russ Guill
(74) *Attorney, Agent, or Firm* — Muncy, Geissler, Olds & Lowe, P.C.

(57) ABSTRACT

The electronic-substrate electrical design apparatus has: a user interface for setting a first position coordinate and a first direction coordinate with respect to a predetermined layer constituting a multilayer electronic substrate, the first position coordinate indicating a viewpoint position when viewing the layer, the first direction coordinate indicating a visual line direction; a controller for controlling the generation of a three dimensional display image of the electronic substrate obtained when viewing the layer on the basis of the first position coordinate and the first direction coordinate set by the user interface; a display for displaying the three-dimen-
(Continued)

sional display image generated by the control of the controller; and an editor for performing an electrical design of the electronic substrate on the three-dimensional display image displayed by the display. This electronic-substrate electrical design apparatus can easily verify a complicated electrical design of an electronic substrate and can also reduce design errors.

9 Claims, 42 Drawing Sheets

(51) Int. Cl.
*G06T 15/00* (2011.01)
*H05K 1/02* (2006.01)

(52) U.S. Cl.
CPC ........... *G06T 15/00* (2013.01); *H05K 3/0005* (2013.01); *H05K 1/0298* (2013.01)

(56) References Cited

U.S. PATENT DOCUMENTS

| | | | |
|---|---|---|---|
| 5,519,632 A | 5/1996 | Chen et al. | |
| 6,077,309 A * | 6/2000 | Lin | G06F 17/5077 716/130 |
| 6,889,367 B1 * | 5/2005 | Frank | G06F 17/5036 716/112 |
| 2005/0091626 A1 | 4/2005 | Okano et al. | |

FOREIGN PATENT DOCUMENTS

| | | |
|---|---|---|
| JP | 06-251107 A | 9/1994 |
| JP | 07-175835 A | 7/1995 |
| JP | 11-184907 A | 7/1999 |
| JP | 2001-175697 A | 6/2001 |
| JP | 2002-1633136 A | 6/2002 |
| JP | 2009-54008 A | 3/2009 |

OTHER PUBLICATIONS

"Pulsonix Design System V7.0 Update Notes," Oct. 8, 2011, WestDev Ltd., 65 pages.*
"Getting Started with PCB Design Creating a New PCB Project", Mar. 21, 2008, pp. 1-28, XP055185243, Retrieved from the Internet: URL: http://www.altium.com/files/altiumdesigner/s08/learning-guides/tu0117%20getting%20started%20with%20pcb%20design.pdf [last retrieved on Apr. 22, 2015].
"Integrating MCAD Objects and PCB Designs ECAD", Jul. 14, 2008, pp. 1-21, Retrieved from the Internet: URL: http://www.altium.com/files/altiumdesigner/s08/learningguides/tu0132%20 integrating%20mcad%20objects%20and%20pcb%20designs.pdf [last retrieved on Apr. 23, 2015].

* cited by examiner

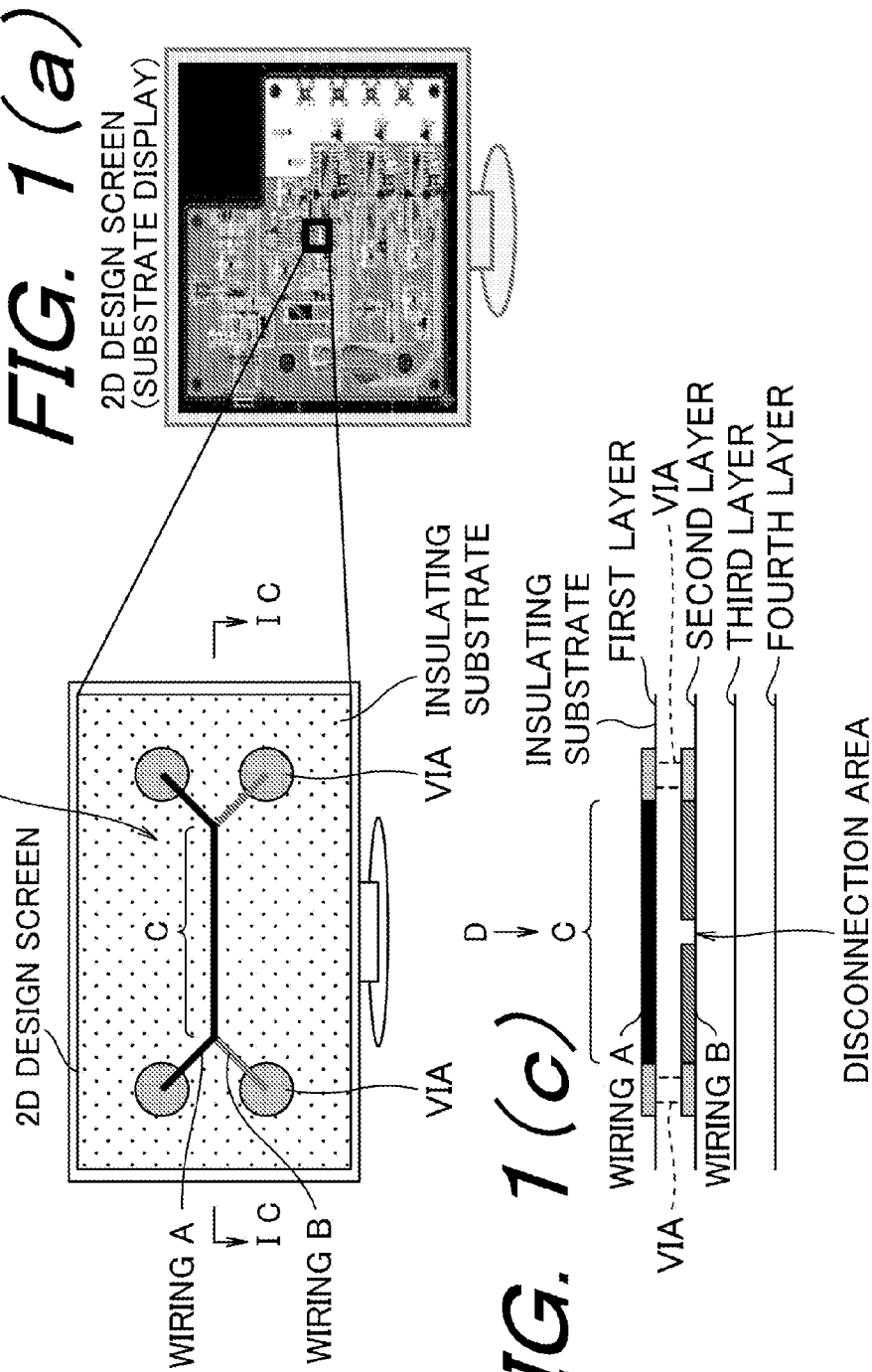

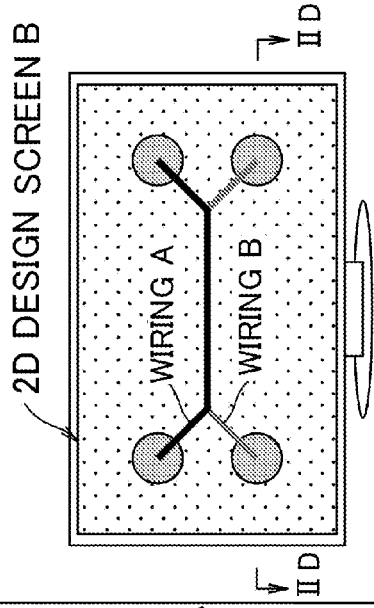
FIG. 2(a) BEFORE CHANGE
2D DESIGN SCREEN A
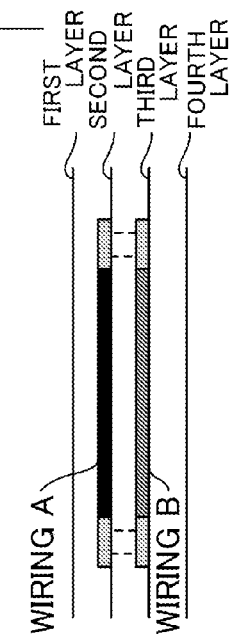
FIG. 2(b)
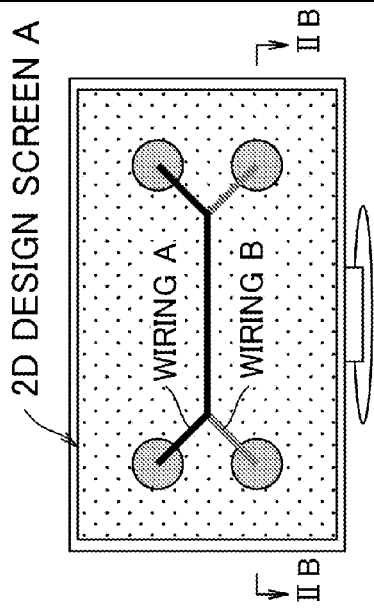
FIG. 2(c) AFTER CHANGE
2D DESIGN SCREEN B
FACT THAT WIRING LAYER MOVED CANNOT BE RECOGNIZED ON 2D DESIGN SCREEN
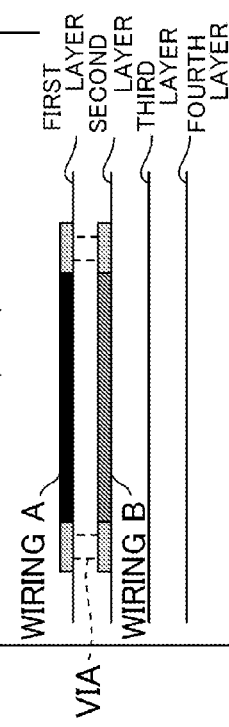
FIG. 2(d)

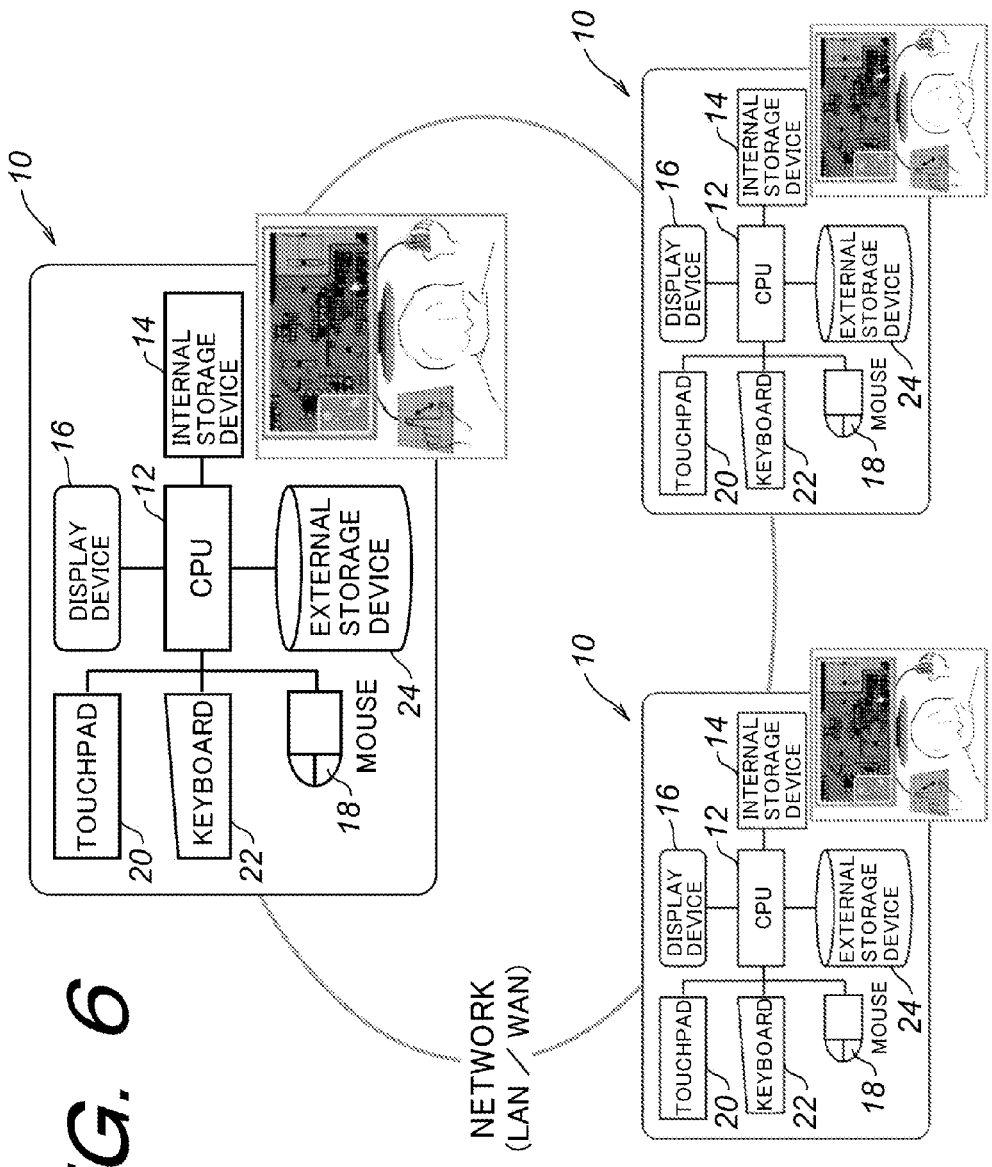

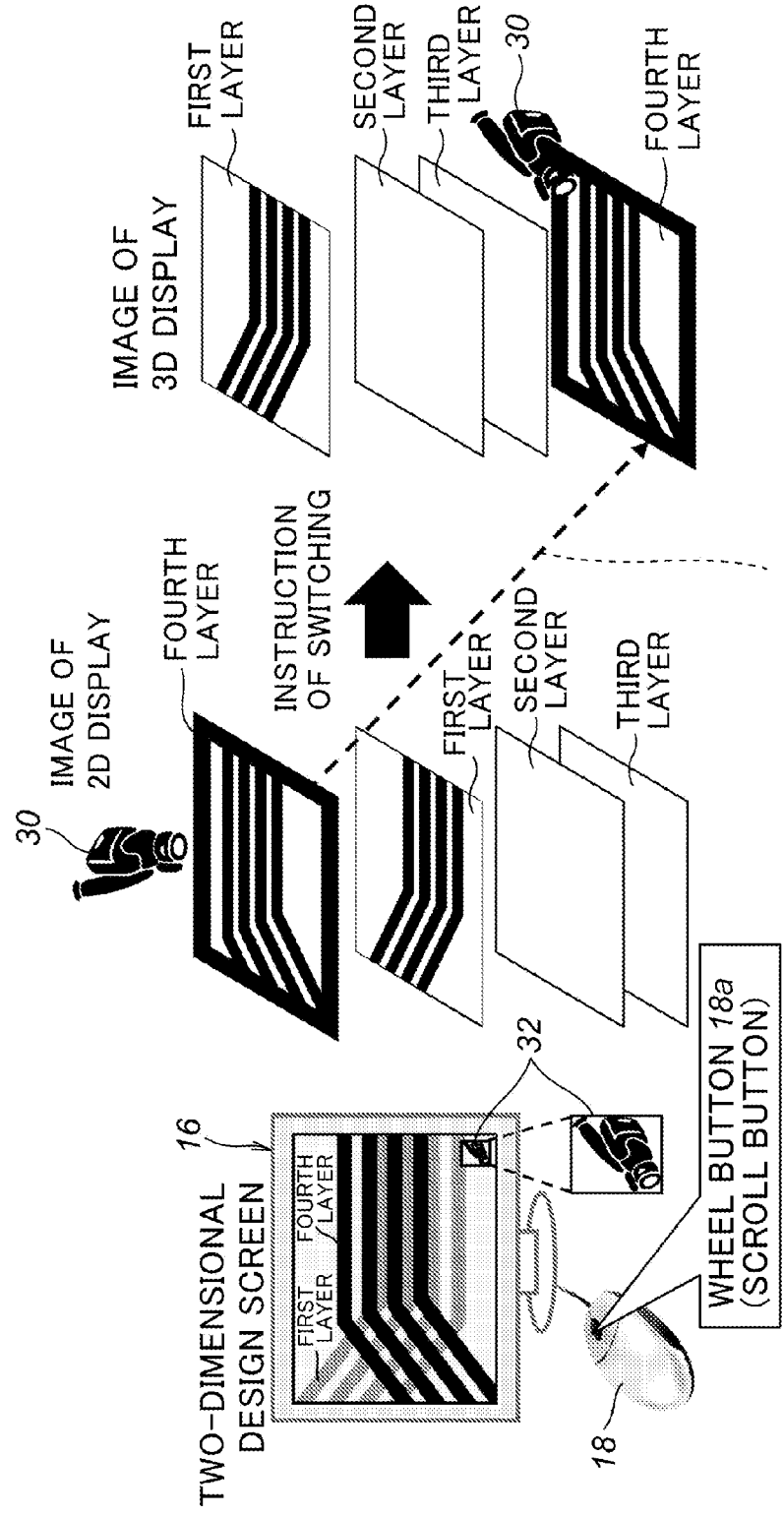

| LAYER INFORMATION | | | | | SHAPE DATA |
|---|---|---|---|---|---|
| EDITING LAYER | PHYSICAL ORDER | DISPLAY ORDER | LAYER NAME | DISPLAY COORDINATES (x, y, z) | |
| | 1 | 2 | FIRST LAYER | (0, 0, 10) | ORIGIN |
| | 2 | 3 | SECOND LAYER | (0, 0, 5) | ORIGIN |
| | 3 | 4 | THIRD LAYER | (0, 0, 0) | ORIGIN |
| ON | 4 | 1 | FOURTH LAYER | (0, 0, 15) | ORIGIN |

VIEWPOINT INFORMATION

| DISPLAY MODE | VIEWPOINT COORDINATES (x, y, z) | VIEWPOINT DIRECTION (x, y, z) |
|---|---|---|
| 2D | (50, 50, 40) | (0, 0, -1) |

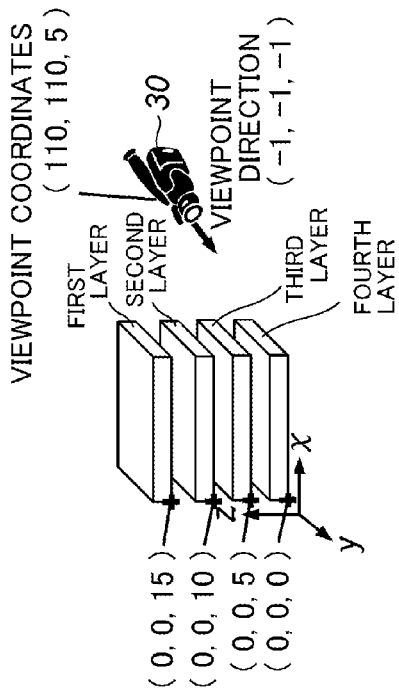

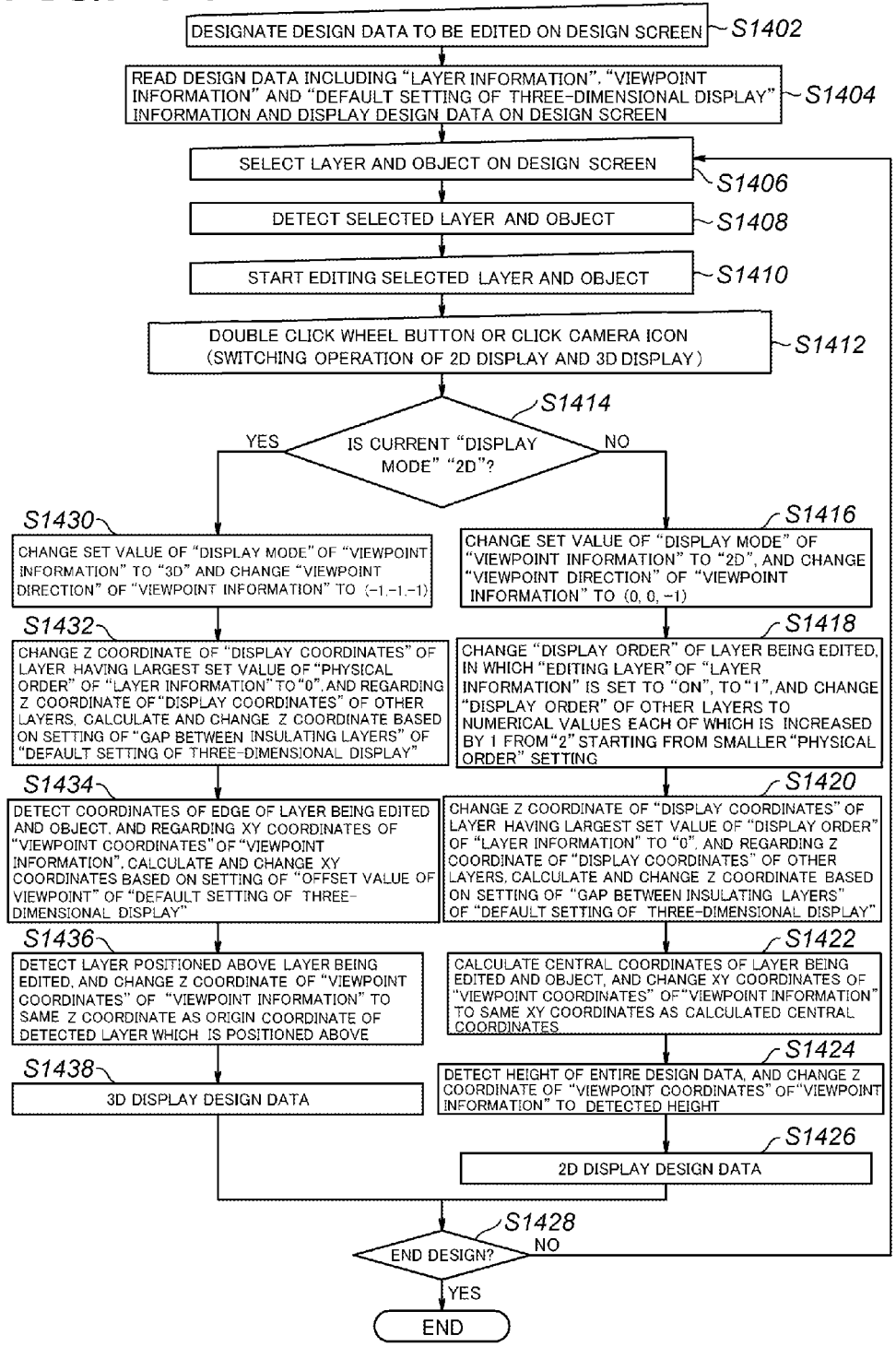

BOUNDARY BETWEEN EACH LAYER CANNOT BE DISCRIMINATED ON DISPLAY OF FULL SCALE VALUE

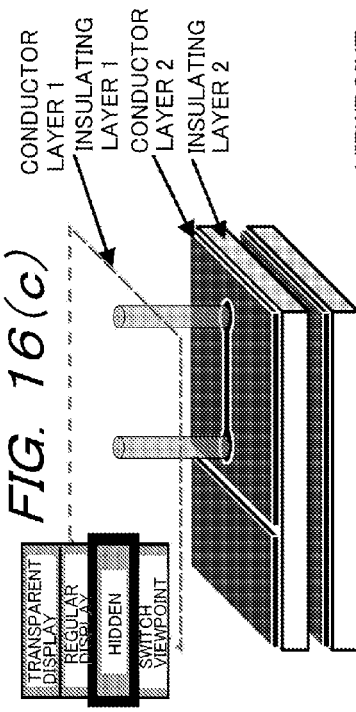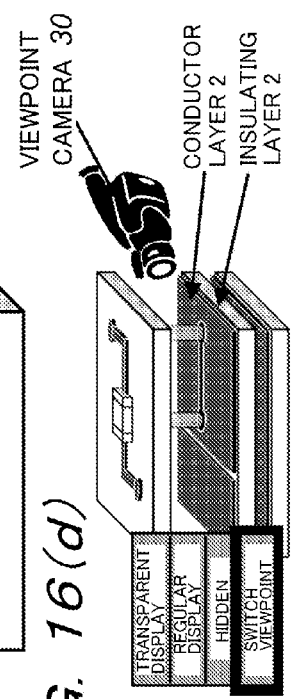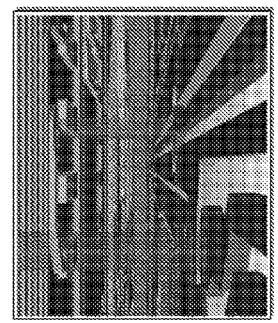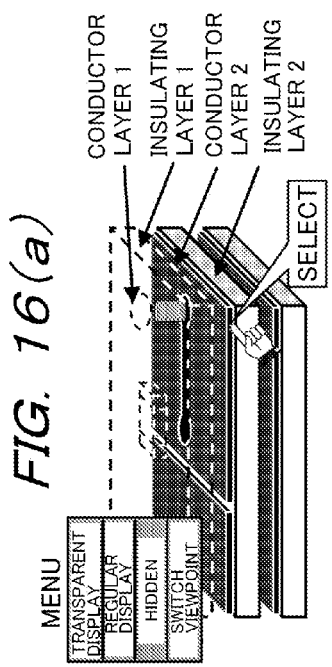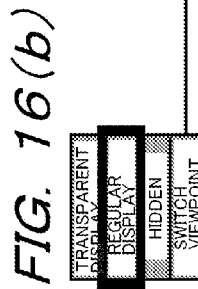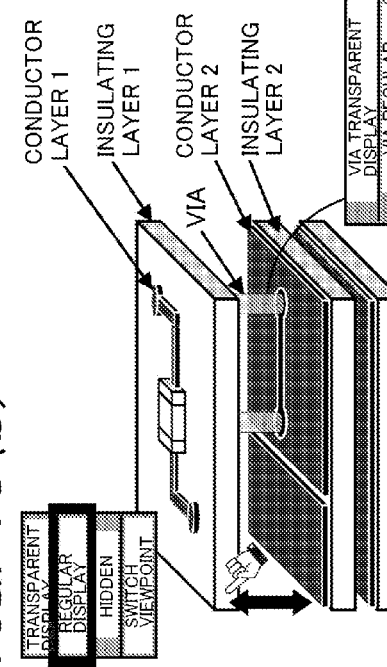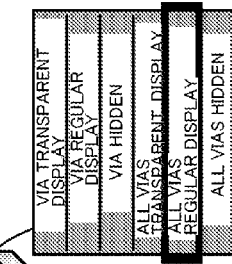

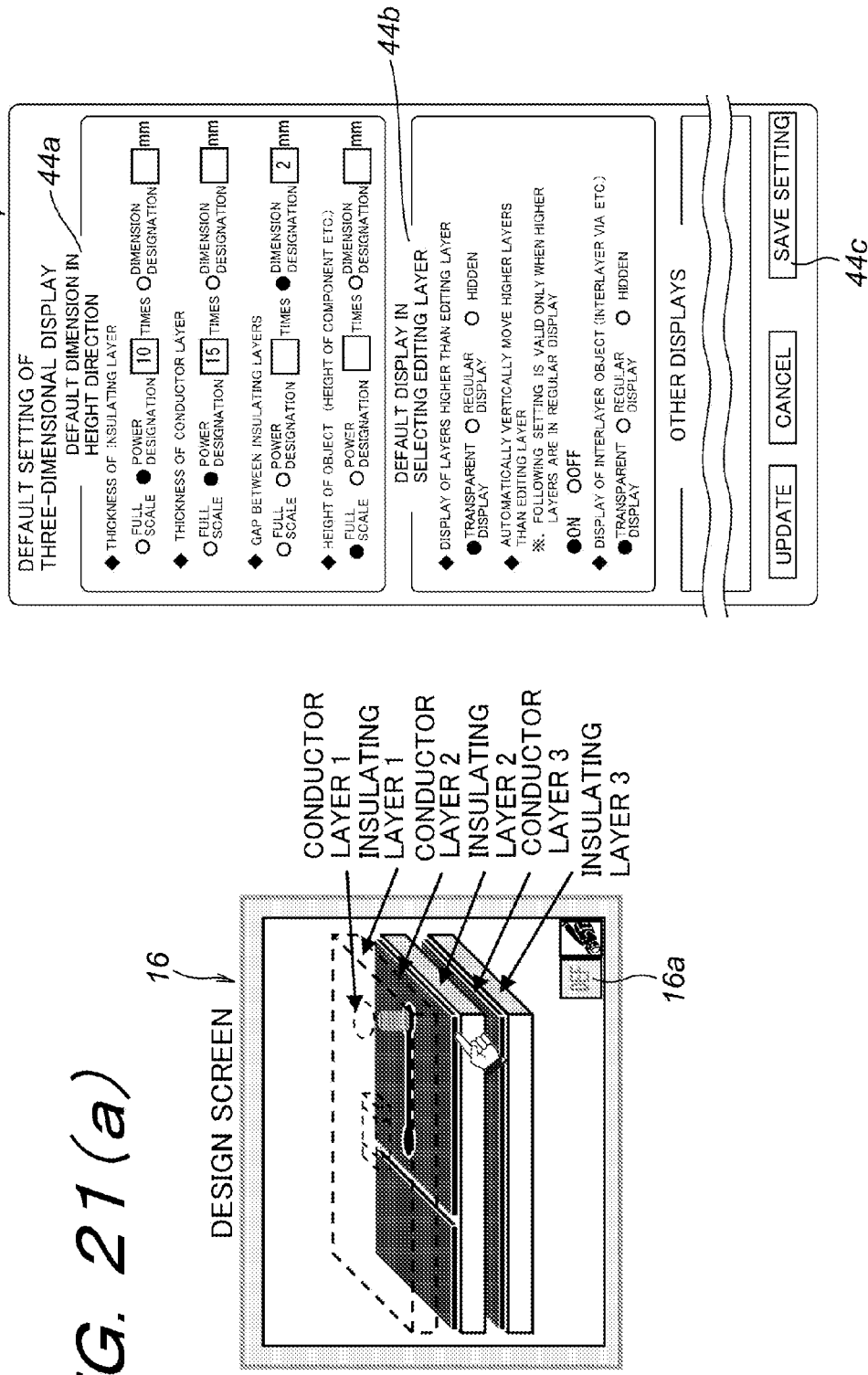

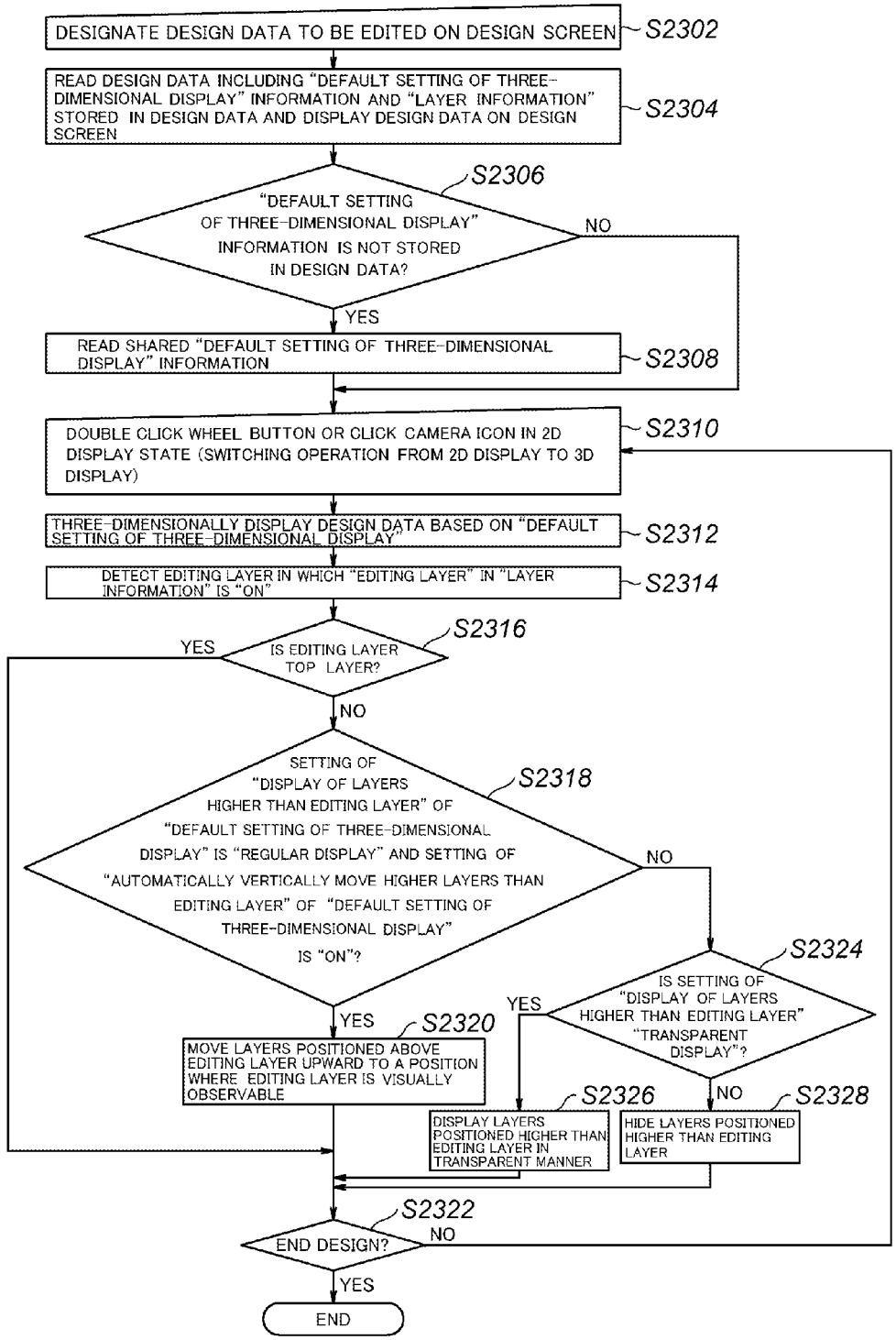
FIG. 23 PROCESSING FLOW OF "THREE-DIMENSIONAL DISPLAY"

THICKNESS AND MATERIAL ARE NOT SET

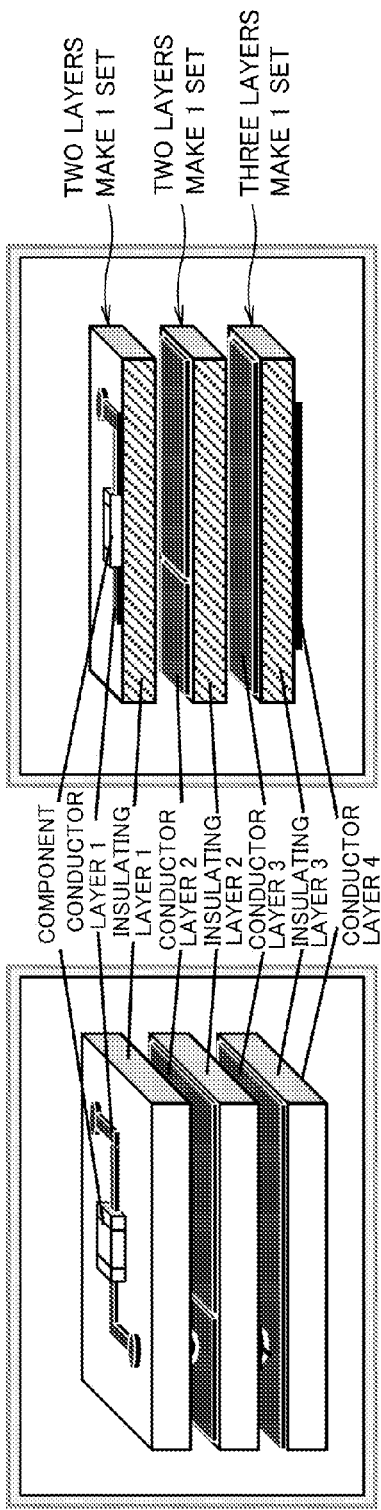
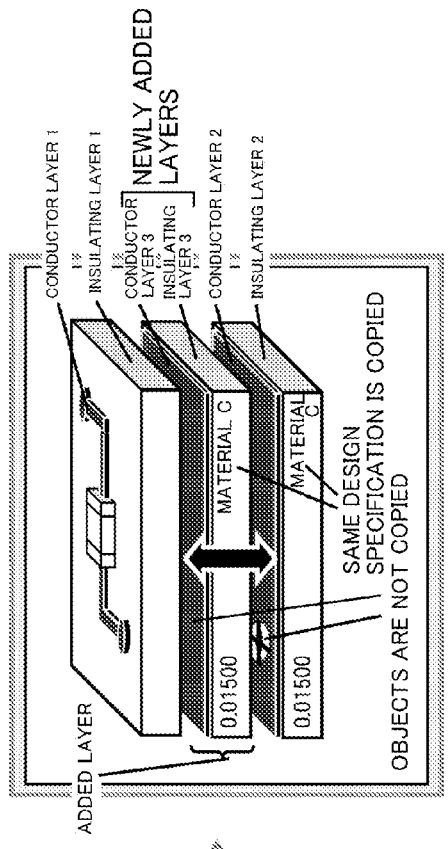
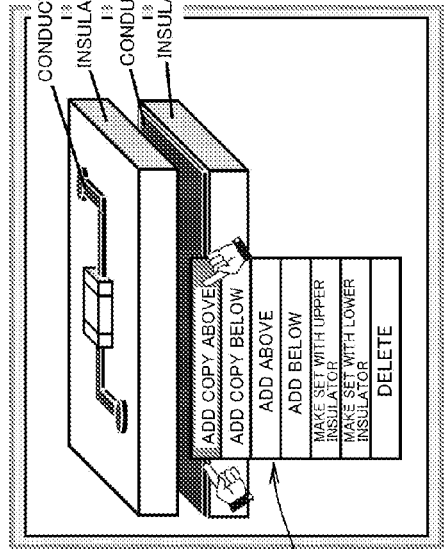
FIG. 27(a)
FIG. 27(b)
FIG. 27(c)

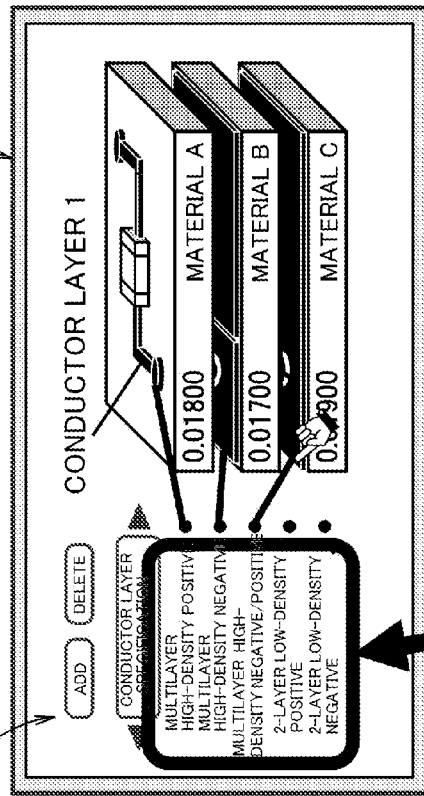

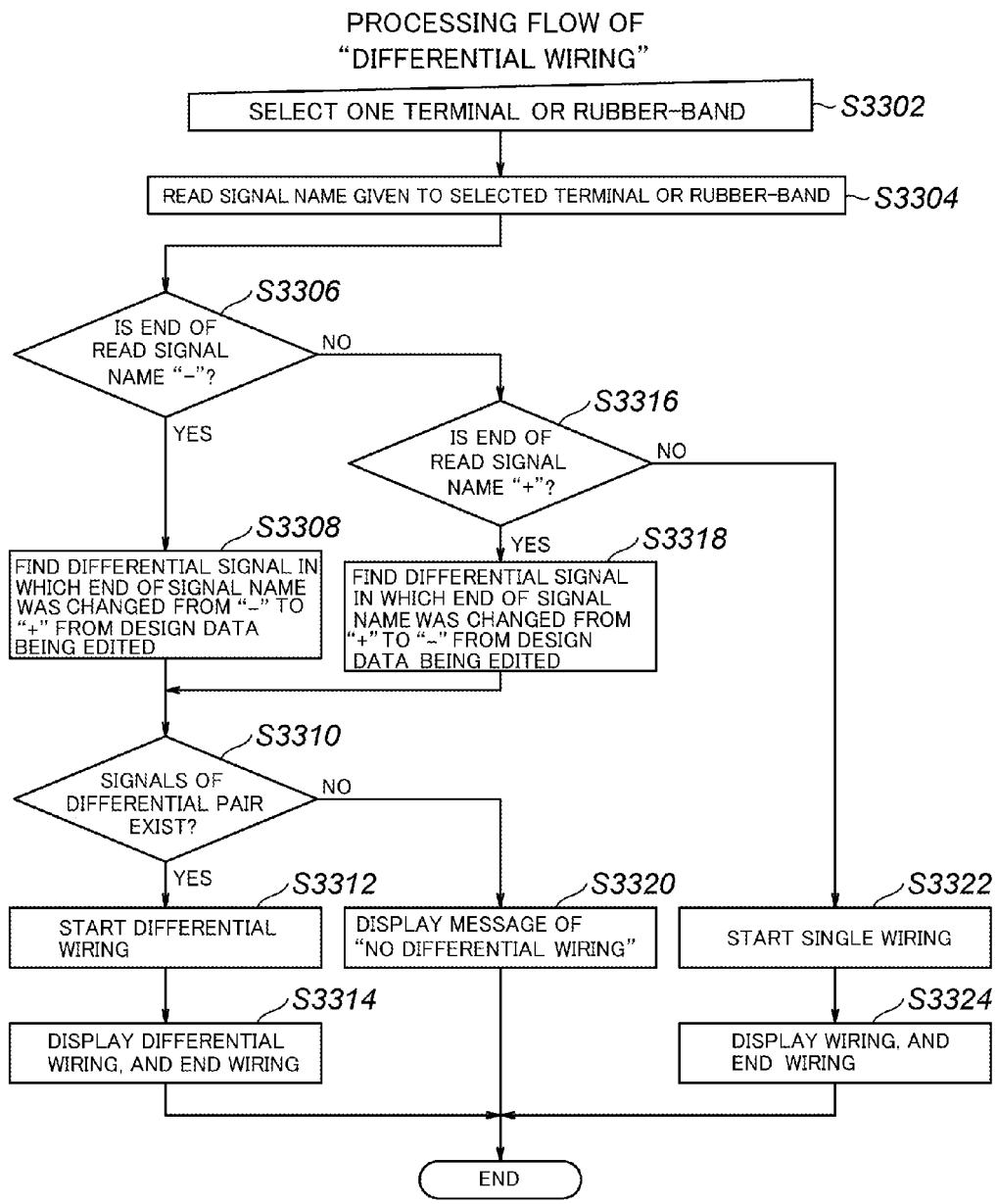

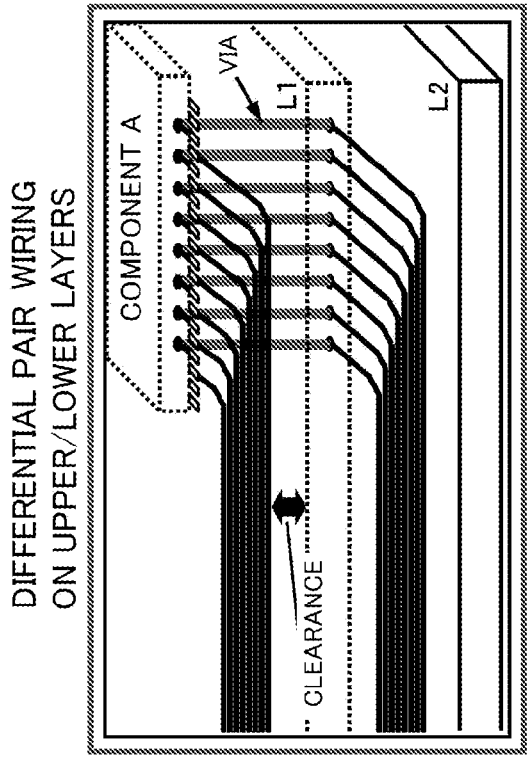
FIG. 35(a) DIFFERENTIAL PAIR WIRING ON SAME LAYER
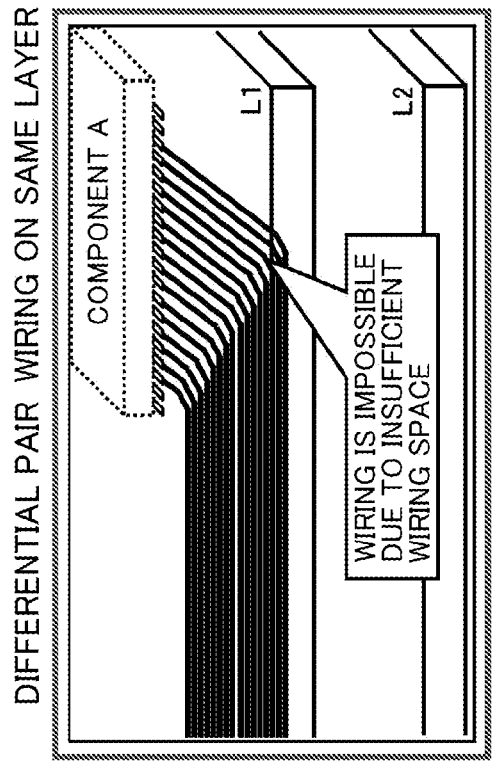
FIG. 35(b) DIFFERENTIAL PAIR WIRING ON UPPER/LOWER LAYERS

FIG. 36(a)
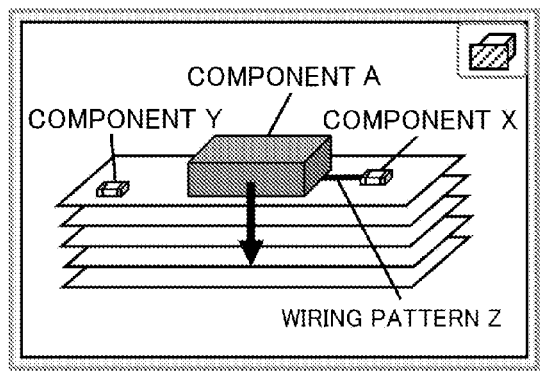
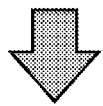
FIG. 36(b)
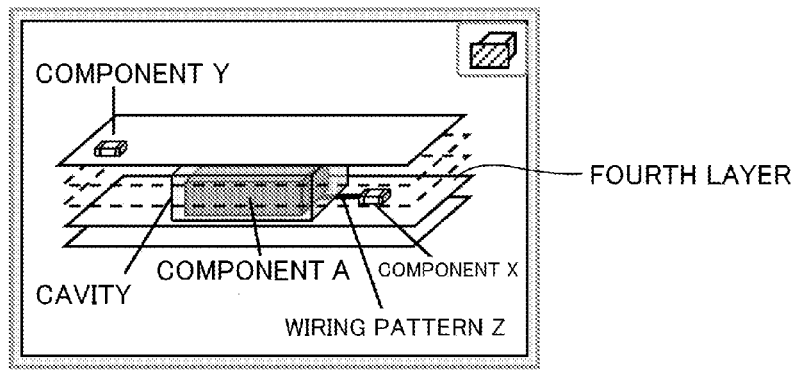
FIG. 36(c)
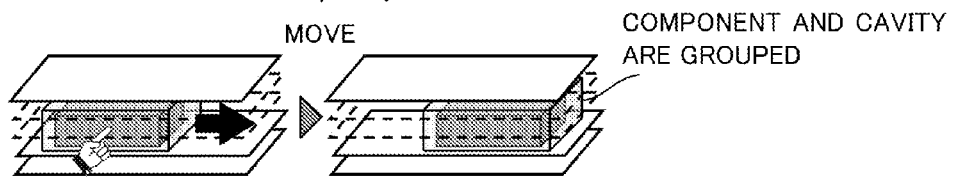

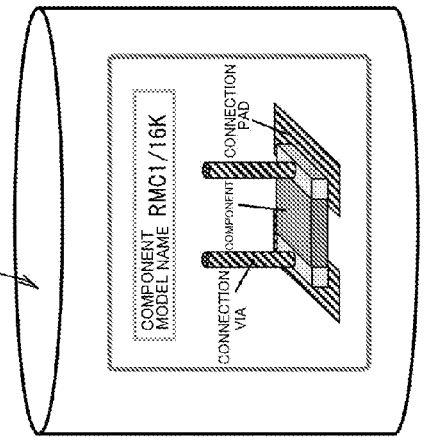
FIG. 38(b)
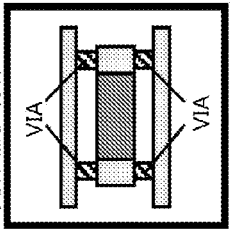
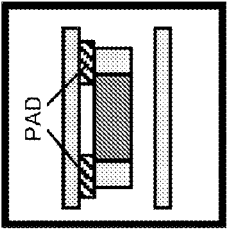
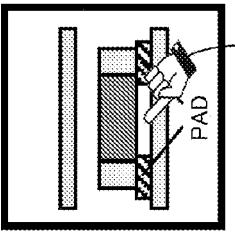
FIG. 38(a)

COMPONENT-EMBEDDED SUBSTRATE DESIGN PROCEDURE OF TWO-DIMENSIONAL ELECTRICAL DESIGN CAD

DESIGN SCREEN OF TWO-DIMENSIONAL ELECTRICAL DESIGN CAD

DESIGN SCREEN OF PRESENT INVENTION

ELECTRIC-SUBSTRATE ELECTRICAL DESIGN APPARATUS USING THREE-DIMENSIONAL SPACE, ELECTRICAL DESIGN METHOD, PROGRAM AND COMPUTER-READABLE RECORDING MEDIUM

TECHNICAL FIELD

The present invention relates to an electronic-substrate electrical design apparatus using three-dimensional space, an electrical design method, a program and a computer-readable recording medium, more particularly, the invention relates to an electronic-substrate electrical design apparatus using three-dimensional space, an electrical design method, a program and a computer-readable recording medium which are preferable for using in designing an electronic substrate which is a design stage for manufacturing the electronic substrate.

BACKGROUND TECHNOLOGY

Conventionally, electrical design of an electronic substrate has been generally performed by using an electrical design CAD (Computer Aided Design) system for designing an electronic substrate (hereinafter, appropriately referred to as a "two-dimensional electrical design CAD system") which displays two-dimensionally (hereinafter, appropriately referred to as "2D") an electronic substrate to be designed.

However, various problems as shown below occurred in recent years in design technique using the two-dimensional electrical design CAD system which two-dimensionally displays the electronic substrate to be designed, and limit of electrical design using the two-dimensional electrical design CAD system was pointed out.

Hereinafter, such various problems will be explained, and description will be made first for a case of performing electrical design having differential wiring in a substrate having a multilayer structure.

It is to be noted that the differential wiring is a wiring technique of wiring two clock signals whose polarities are inversed in a pair, by which electromagnetic wave noise that occurs in the case of wiring by one clock signal can be reduced.

Herein, FIG. 1(a) shows a view illustrating a display example of substrate display on a 2D design screen in the two-dimensional electrical design CAD system as a display example of the two-dimensional electrical design CAD system. The 2D design screen displays the entire electronic substrate being designed on the two-dimensional electrical design CAD system.

Further, FIG. 1(b) shows a view illustrating a part of FIG. 1(a) in an enlarged manner. The view shown in FIG. 1(b) shows a differential wiring area on the 2D design screen shown in FIG. 1(a) in an enlarged manner.

Furthermore, FIG. 1(c) shows a view illustrating the cross-section of the 2D design screen in line IC-IC shown in FIG. 1(b).

As described above, FIG. 1(b) shows the differential wiring area in an enlarged manner, and as shown in the cross-sectional view of FIG. 1(c), a wiring A is a wiring pattern arranged for a first layer of a multilayer substrate, and a wiring B is a wiring pattern arranged for a second layer of the multilayer substrate.

Specifically, the wiring A and the wiring B are differential wiring patterns each of which is severally arranged on different layers.

Incidentally, on the 2D design screen displayed by the two-dimensional electrical design CAD system, even in the case of handling a multilayer substrate in which a plurality of substrates are stacked, a state viewed from an arrow D direction shown in FIG. 1(c), that is, only the plan views seen from above the substrate shown in FIG. 1(a) and FIG. 1(b) were displayed.

Then, in the display mode of the two-dimensional electrical design CAD system, the surface of the first layer is displayed on the 2D design screen and the second and further layers are displayed in a state hidden by the rear surface of the wiring pattern or the like arranged on the first layer, for example.

Therefore, regarding a region shown by numerical character C where the wiring A and the wiring B are overlapped in FIG. 1(b), the wiring A is preferentially displayed on the screen.

Thus, the entire wiring A is displayed, but since the wiring B is positioned on a layer under the wiring A, only areas of the wiring B which are not overlapped with the wiring A in a planar view seen from above the substrate are displayed.

Specifically, since display is performed by the above-described method on the 2D design screen, the wiring B is not displayed for the region C of FIG. 1(b), for example, so there was a problem that even if the wiring B is disconnected whether or not the wiring B is disconnected could not be judged instantly on the 2D design screen.

Further, as another problem which could occur in the region C of the wiring B, there was a problem that, in the case where an instruction is given that a wiring width (pattern width) of the wiring B be designed in the same wiring width of a wiring width (pattern width) of the wiring A, for example, even if the wiring width of the wiring B is designed in a width narrower than the wiring width of the wiring A, which is different from the instruction, the wiring B is hidden by the wiring A and cannot be checked only by viewing the 2D design screen, and whether or not design was performed according to the instruction could not be judged instantly on the 2D design screen.

Next, referring to FIGS. 2(a)(b)(c)(d), another problem in differential wiring will be explained.

Herein, FIGS. 2(a)(b) show a state where a pair of clock signals is wired on the first layer and the second layer of the multilayer substrate.

More particularly, FIG. 2(a) is a view showing the 2D design screen (2D design screen A) in the case where differential wiring is conducted extending across the first layer and the second layer, and FIG. 2(b) shows a cross-sectional view on line IIB-IIB of the 2D design screen A shown in FIG. 2(a).

As shown on the 2D design screen A of FIG. 2(a), it is difficult to specify from two-dimensional display to which wiring layer the differential wiring is wired.

However, in the differential wiring of FIG. 2(a), the wiring A is disposed on the first layer and the wiring B is disposed on the second layer as shown in FIG. 2(b), and herein, consideration is given to a case where each of the wiring layers of differential wiring made up of the wiring A and the wiring B is changed to the second layer and a third layer.

FIG. 2(c) is a view showing a 2D design screen (2D design screen B) after changing the wiring layers of differential wiring of the wiring A and the wiring B such that the wiring A is wired to the second layer and the wiring B is wired to the third layer.

Further, FIG. 2(d) shows a cross-sectional view on line IID-IID of the 2D design screen B shown in FIG. 2(c).

As in the cross-sectional view shown in FIG. 2(d), even if a designer instructed processing of moving the differential wiring between layers to change wiring layers, the fact that the differential wiring moved between layers cannot be visually judged on the actual 2D design screen B as shown in FIG. 2(c).

Specifically, as it is clear when the 2D design screen A is compared with the 2D design screen B, there is no change on the 2D design screen display even if the wiring layers of the differential wiring moved between layers, so there was a problem that the change could not be judged visually.

Now, as a technique of checking wiring layers of the differential wiring as described above, checking a disconnection area of wiring, or checking of design error possibility, a method other than the method by visual observation on the 2D design screen can also be used. For example, judgment can be made by checking a design state using a tool for checking a problem area on another screen, but the method required labor that screens had to be switched for checking each time when checking is performed.

For this reason, as a technique of avoiding the above-described problem, a technique is proposed in which wiring patterns are displayed in different colors for each wiring layer, and wiring layers are discriminated based on color of the wiring pattern.

However, in the case of displaying wiring patterns in different colors for each wiring layer, the designer needs to remember colors of the wiring patterns corresponding to all layers.

For this reason, in the case where the number of wiring layers is as many as 10 layers, for example, there is a fear that the designer could have lapse of memory or the like for the colors of wiring patterns, which caused a new problem that the designer could judge a wiring layer by mistake due to the lapse of memory or the like.

Further, when the number of wiring layers increased, a case could occur where types of usable colors exceeds a limit, and there was also a problem that measures had to be taken in such a case that the same colors were used twice, which made the judgment of wiring layer difficult.

Furthermore, even if the above-described discrimination by colors is applied, when a region where the wiring B cannot be seen exists as in the region C shown in FIG. 1(b) where the wiring A overlaps the wiring B, problems such that a wiring layer of each wiring, disconnection of wiring, a design error of pattern width or the like cannot be instantly checked are not overcome.

Next, as a problem of the design technique using the two-dimensional electrical design CAD system, a problem in an electrical design technique of mounting electronic components mounted on the surface of the electronic substrate into the electronic substrate, that is, on an inner layer of the electronic substrate will be explained.

It is to be noted that the electrical design technique is an electrical design technique of making an area of the electronic substrate smaller to enable high-density mounting by embedding electronic components in the inner layer of the electronic substrate including a multilayer layer constitution.

Then, an electronic component which is embedded in the inner layer of the electronic substrate and built in the electronic substrate is referred to as a "substrate-embedded component", and an electronic substrate in which electronic component is built is referred to as a "component-embedded substrate".

Herein, FIG. 3(a) shows a view illustrating a display example of substrate display on the 2D design screen of the two-dimensional electrical design CAD system as a display example of the two-dimensional electrical design CAD system. The 2D design screen displays the entire electronic substrate being designed on the two-dimensional electrical design CAD system.

Further, FIG. 3(b) shows a view illustrating a part of FIG. 3(a) in an enlarged manner. Specifically, the view shown in FIG. 3(b) illustrates a part of the 2D design screen shown in FIG. 3(a) in an enlarged manner.

Furthermore, FIG. 3(c) shows a view illustrating a cross-section of the 2D design screen shown in FIG. 3(b) on line IIIC-IIIC.

As described above, FIG. 3(b) shows a part of the substrate surface in an enlarged manner, in which an electronic component A is arranged on the surface of the electronic substrate, and the electronic component A is connected by a wiring pattern. Specifically, the electronic component A is arranged on the first layer of the electronic substrate equipped with a multilayered layer constitution, and connected by the wiring pattern.

Explanation will be made below for a work procedure of processing of moving the electronic component A to an inner layer of the electronic substrate, that is, a fourth layer (refer to FIG. 3(c)) to make the electronic component A a substrate-embedded component, in the two-dimensional electrical design CAD system, referring to FIGS. 4(a) to (i) which are display examples of the 2D design screen of the two-dimensional electrical design CAD system.

It is to be noted that FIG. 4(a) shows a cross-sectional view on line IVA-IVA shown in FIG. 4(b), that is, a cross-sectional view of an electronic substrate made up of 5 layers shown in FIGS. 4(b) to (i).

As described above, the electronic component arranged for the first layer of the electronic substrate is moved to the fourth layer, and in order to move the electronic component A from the first layer to the fourth layer, the first layer of the electronic substrate is selected first as a processing target of the two-dimensional electrical design CAD system, and displayed on the 2D design screen of a display device.

Then, electronic component data of the electronic component A arranged on the first layer and wiring data of a wiring pattern connected to the electronic component data are selected (refer to FIG. 4(b)), and the selected electronic component data and wiring data are deleted (refer to FIG. 4(c)).

Next, to secure a cavity for incorporating the electronic component A, the second layer of the electronic substrate is selected as a processing target of the two-dimensional electrical design CAD system and the layer is displayed on the 2D design screen of the display device, and cavity data of the cavity for incorporating the electronic component A is arranged on the second layer (refer to FIG. 4(d)).

Herein, the cavity is space generated by forming a hollow or a hole in the electronic substrate in order to embed an electronic component in the electronic substrate, and the electronic component is mounted in the cavity being the space. Then, after mounting the electronic component into the cavity, resin is flowed into the cavity to fix the electronic component, that is, a substrate-embedded component in the cavity.

Next, to secure a cavity for incorporating the electronic component A, the third layer of the electronic substrate is selected as a processing target of the two-dimensional electrical design CAD system and displayed on the 2D design screen of the display device, and cavity data of the cavity for incorporating the electronic component A is arranged on the third layer (refer to FIG. 4(e)).

Next, the fourth layer of the electronic substrate is selected as a processing target of the two-dimensional electrical design CAD system and displayed on the 2D design screen of the display device, and electronic component data of the electronic component A is arranged on the fourth layer (refer to FIG. 4(f)).

Next, to connect the electronic component data of the electronic component A mounted on the fourth layer to the wiring data of a wiring pattern to be wired to the first layer, the second layer of the electronic substrate is selected as a processing target of the two-dimensional electrical design CAD system and displayed on the 2D design screen of the display device, and via data of a via connected to a terminal of the electronic component data of the electronic component A being a substrate-embedded component is arranged into the cavity (refer to FIG. 4(g)).

Next, by selecting the first layer of the electronic substrate as a processing target of the two-dimensional electrical design CAD system to display the layer on the 2D design screen of the display device and arranging the via data on the first layer, the data is connected to the via data formed in the processing shown in FIG. 4(g) (refer to FIG. 4(h)).

Next, the wiring data of the wiring pattern which was deleted in the processing shown in FIG. 4(c) is arranged, and the data is connected to the via data arranged in the first layer for rewiring (refer to FIG. 4(i)).

A component-embedded substrate created according to the above-described work procedure, that is, the electronic substrate in which the electronic component A is built as a substrate-embedded component is shown in FIG. 5(a).

It is to be noted that FIG. 5(a) shows the 2D design screen displaying a substrate having an embedded component, and FIG. 5(b) shows a cross-sectional view on line VB-VB shown in FIG. 5(a).

Specifically, in the case where the above-described processing, which was explained referring to FIGS. 4(b) to (i) is conducted, data of the component-embedded substrate equipped with the constitution of the cross-sectional view shown in FIG. 5(b) is created as a result. In the electrical design by the two-dimensional electrical design CAD system, design is performed referring to the 2D design screen shown in FIG. 5(a), and in the case where the first layer is displayed as in FIG. 5(a), for example, only vias and wiring patterns which are arranged on the first layer are displayed, and data of the cavity and the electronic component A arranged on the inner layer as to on which layer and at what height they are formed cannot be instantly checked.

Specifically, in the case of performing processing of mounting an electronic component, which was mounted on the surface of the electronic substrate, on the inner layer of the electronic substrate, whether or not the electronic component was arranged on a right layer cannot be checked visually on the 2D design screen by the two-dimensional electrical design CAD system, and it took labor and time to judge whether or not the electronic substrate was correctly designed.

Now, in checking a three-dimensional shape of electrical design data in a conventional two-dimensional electrical design CAD system, data for three-dimensional display use added with height information to the two-dimensional electrical design data was generated, and displayed on a viewer.

Specifically, in the case of displaying conventional two-dimensional electrical design data in a three-dimensional shape, the shape needs to be displayed by software for three-dimensional display use which is different from the two-dimensional electrical design CAD system, and it was possible to check the three-dimensional shape of the electronic substrate only on such a viewer.

Further, the above-described software for three-dimensional display use supports display only and cannot edit data, so that editing of electrical design data needs to be performed on the two-dimensional electrical design CAD system, and in order to check electrical design data after editing in the three-dimensional shape, it was necessary to repeatedly perform a work of generating data for three-dimensional display use again and checking the data by the software for three-dimensional display use.

As described, in substrate design by using the conventional two-dimensional electrical design CAD system, much labor and time was required for performing electrical design of the electronic substrate while checking the three-dimensional shape, which caused deteriorated design efficiency.

Specifically, as explained above in various ways, in performing design of differential wiring in which wiring is performed extending across vertical two layers, design of a component-embedded substrate in which components are built inside a multilayer substrate, or the like by using the conventional two-dimensional electrical design CAD system, it is difficult and also takes labor to grasp a state of inner layers on the 2D display screen, so there was a problem of design environment that long time was required for design and a design error easily occurred.

Further, in a conventional two-dimensional electrical design CAD system, there was a problem that electrical design data could not be displayed in a three-dimensional shape and exclusive software or the like was required, and data editing could not be performed in the state where data was displayed in a three-dimensional shape.

It is to be noted that the example explained above merely a part of design example using the two-dimensional electrical design CAD system. Since there is a limit in performing electrical design of the electronic substrate that becomes more complicated every year by the two-dimensional electrical design CAD system, design environment and design technique capable of reducing a design error and easily performing complicated electrical design in recent years have been strongly desired.

It is to be noted that prior art that the present applicant knows at the point of filing a patent is not an invention known to the public through publication, so there is no prior art document information to be described in the present specification.

SUMMARY OF THE INVENTION

Problems to be Solved by the Invention

The present invention has been created in view of the above-described request that the conventional technique has, and it is an object of the invention to provide an electronic-substrate electrical design apparatus using three-dimensional space, an electrical design method, a program and a computer-readable recording medium by which complicated electrical design in an electronic substrate and verification of the design can be easily performed, and a design error can be reduced.

Means for Solving the Problems

To achieve the above-described object, the present invention has made it possible to display a design screen in both dimensions of two dimensions and three dimensions by switching the viewpoint on a design screen, and perform electrical design of the electronic substrate in two-dimensional display and three-dimensional display and verification of the design.

Therefore, according to the present invention, it becomes possible to instantly grasp a physical shape and a state between layers in height direction in the electronic substrate (Z axis direction to XY plane in the case where the surface of the electronic substrate is XY plane (refer to FIG. 7 (b)).

Further, according to the present invention, by making two-dimensional display and three-dimensional display easily switchable on the electrical design screen of the electronic substrate, a design error such as disconnection and arrangement error can be instantly found, and whether or not design corresponding to the specification of electrical design is secured can be easily judged.

Such a present invention may be built by a computer system so as to be installed into a CAD system for electronic substrate design use or the like, or may be built by a computer system independent of a CAD system for electronic substrate design use or the like.

Now, in the case of building the present invention independent of the CAD system for electronic substrate design, it is preferable to build the entire system so as to cooperate with a CAD system for electronic substrate design use or the like.

Specifically, the present invention is an electronic-substrate electrical design apparatus using three-dimensional space, which has: setting means for setting a first position coordinate indicating a viewpoint position when viewing a predetermined layer constituting a multilayer electronic substrate and a first direction coordinate indicating a visual line direction with respect to the layer; control means for controlling the generation of a three-dimensional display image of the electronic substrate in the state when the layer is viewed on the basis of the first position coordinate and the first direction coordinate set by the setting means; display means for displaying the three-dimensional display image generated by the control of the control means; and editing means for performing electrical design of the electronic substrate on the three-dimensional display image displayed by the display means.

Further, the present invention is the above-described invention, in which the setting means sets a second position coordinate indicating a viewpoint position when two-dimensionally displaying the electronic substrate and a second direction coordinate indicating a visual line direction, the control means, on the basis of the second position coordinate and the second direction coordinate which were set, controls the generation of a two-dimensional display image of the electronic substrate in the state when the electronic substrate is viewed, and the display means displays the two-dimensional display image generated by the control of the control means.

Further, the present invention is the above-described invention, in which the control means controls the display means so as to select and display the three-dimensional display image and the two-dimensional display image.

Further, the present invention is the above-described invention, in which the control means controls the generation of the three-dimensional display image by varying the position or the dimension of design data in height direction in the electronic substrate.

Further, the present invention is the above-described invention, in which the control means controls the generation of the three-dimensional display image by varying a gap between layers constituting the electronic substrate.

Further, the present invention is the above-described invention, in which the control means controls the generation of the three-dimensional display image by varying the dimension in height direction of layers constituting the electronic substrate.

Further, the present invention is the above-described invention, in which the display means displays specification information used for designing the electronic substrate together with a three-dimensionally displayed electronic substrate, and the editing means associates the specification information with the electronic substrate, and controls the display means so as to reflect the specification information on the display of the electronic substrate.

Further, the present invention is the above-described invention, in which with interlayer arrangement movement of electronic components constituting the electronic substrate by the editing means, the control means controls generation or movement of cavities by the editing means.

Further, the present invention is the above-described invention, in which with one wiring of wiring patterns which are differentially wired to the electronic substrate by the editing means, the control means controls so as to wire the other wiring to a layer adjacent to the wired layer.

An electrical design method in which design is performed by an electronic-substrate electrical design apparatus using three-dimensional space, in which a first position coordinate indicating a viewpoint position when viewing a predetermined layer constituting a multilayer electronic substrate and a first direction coordinate indicating a visual line direction are set with respect to the layer, the state when the layer is viewed is three-dimensionally displayed as a three-dimensional display image of the electronic substrate on the basis of the first position coordinate and the first direction coordinate which were set, and electrical design of the electronic substrate is performed on the three-dimensional display image.

Further, the present invention is a program for allowing a computer to function the electronic-substrate electrical design apparatus using three-dimensional space according to the above-described invention.

Further, the present invention is a computer-readable recording medium recording the program by the above-described invention.

Effect of the Invention

Since the present invention is constituted as explained above, it exerts an excellent effect that an electronic-substrate electrical design apparatus using three-dimensional space, an electrical design method, a program and a computer-readable recording medium which are capable of easily checking a state of electrical design between layers of a multilayer substrate can be provided.

More particularly, the present invention exerts an excellent effect that labor of repeating a work of finding an area of design error or an operation of switching screens, or the like, in performing electrical design of an electronic substrate are lightened, and design can be performed while checking whether or not it is done according to the specification of electrical design.

BRIEF DESCRIPTION OF THE DRAWINGS

FIG. 1(a) is a view showing a display example of substrate display on a 2D design screen in a two-dimensional electrical design CAD system, FIG. 1(*b*) is a view showing a part of FIG. 1(*a*) in an enlarged manner, and FIG. 1(*c*) is a view showing the cross-section of the 2D design screen shown in FIG. 1(*a*) on line IC-IC.

FIG. 2(*a*) is view illustrating the 2D design screen showing differential wiring, FIG. 2(*b*) is a view showing the cross-section on line IIB-IIB shown in FIG. 2(*a*), FIG. 2(*c*) is a view illustrating the 2D design screen showing a state in which a layer of differential wiring is changed, and FIG. 2(*d*) is a view showing the cross-section on line IID-IID shown in FIG. 2(*c*).

FIG. 6 is a block constitution explanatory view showing the hardware configuration of an embodiment example of the three-dimensional electrical design apparatus by the present invention.

FIG. 8(*a*) is a view in performing design of a multilayer electronic substrate in two-dimensional display by using the three-dimensional electrical calculating apparatus by the present invention, FIG. 8(*b*) is a view for explaining a method of obtaining an image for 2D display, and FIG. 8(*c*) is a view for explaining a method of obtaining an image for 3D display.

FIG. 13(*a*) is an explanatory view showing layer information and viewpoint information stored in the design data, and FIG. 13(*b*) a view showing viewpoint coordinates and viewpoint direction coordinates of the camera.

FIG. 14 is a flowchart showing a processing procedure for switching between two-dimensional display and three-dimensional display.

FIGS. 16(*a*)(*b*)(*c*)(*d*)(*e*) are view for explaining a display method of higher layers than a design target layer in performing three-dimensional display.

FIG. 21(*a*) and (*b*) are views for explaining a default setting of three-dimensional display.

FIG. 23 is a flowchart showing a processing procedure of three-dimensional display.

FIGS. 27(*a*)(*b*)(*c*) are explanatory views explaining an operation for changing a display condition of conductor layers in performing three-dimensional display.

FIGS. 31(*a*)(*b*) are views for explaining detail information of the technology information of three-dimensional display.

FIG. 33 is a flowchart regarding a processing procedure of differential wiring processing.

FIGS. 35(*a*)(*b*) are views for explaining a characteristic of broad band differential wiring of the three-dimensional electrical design apparatus by the present invention.

FIGS. 36(*a*)(*b*)(*c*) are views for explaining a design method of a component-embedded substrate by the three-dimensional electrical design apparatus by the present invention.

FIG. 38(*a*) is a view for explain a wiring method of the substrate-embedded component, and FIG. 38(*b*) is a view for explaining component database storing the substrate-embedded component.

MODES FOR IMPLEMENTING THE INVENTION

Figure 3A:
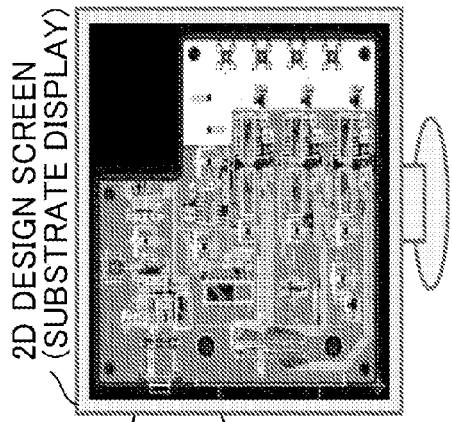
FIG. 3(*a*) is a view showing the display example of a substrate display of the 2D design screen in the two-dimensional electrical design CAD system, and FIG. 3(*b*) is a view showing a part of FIG. 3(*a*) in an enlarged manner, and FIG. 3(*c*) is a view showing the cross-section of the 2D design screen on line IIIC-IIIC shown in FIG. 3 (*b*).
Figure 3B:
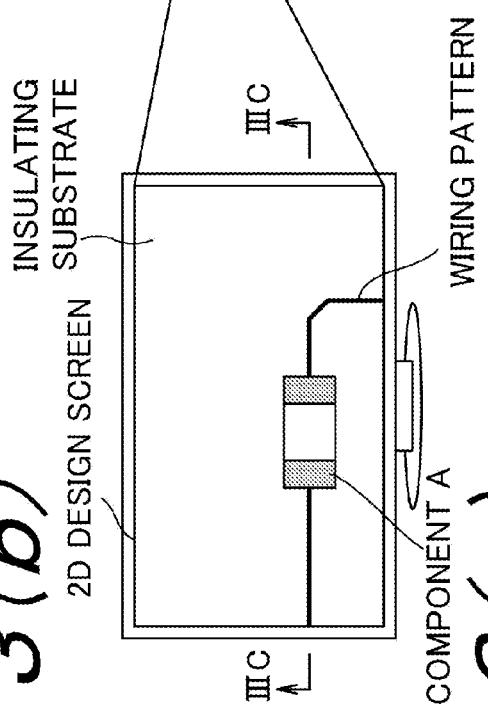
Figure 3C:
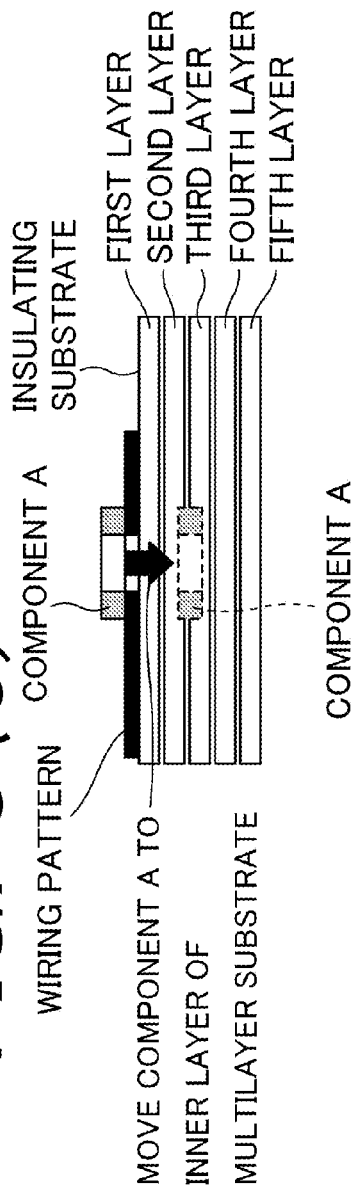
Figure 4A:
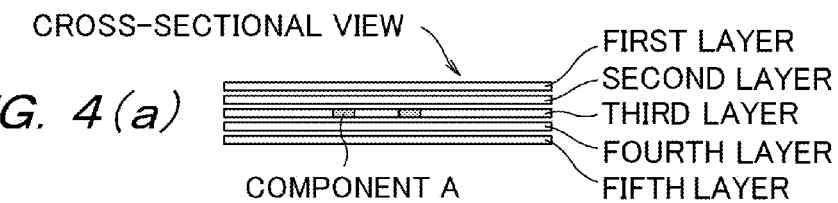
FIG. 4(*a*) is a view showing the cross-section on line IVA-IVA shown in FIG. 4(*b*), and FIGS. 4(*b*) to (*i*) are views showing display examples of the 2D design screen regarding the movement of a substrate-embedded component.
Figure 4B:
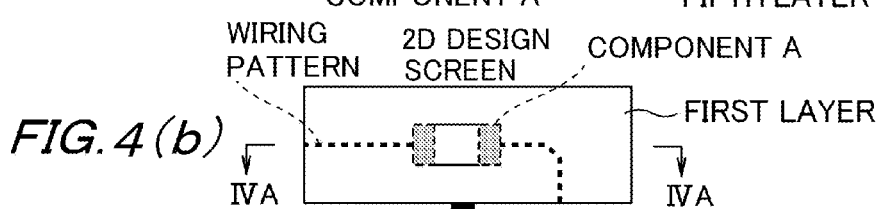
Figure 4C:
Figure 4D:
Figure 4E:
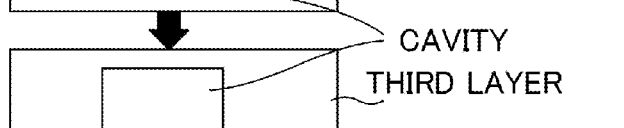
Figure 4F:
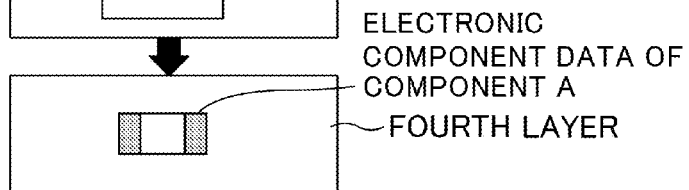
Figure 4G:
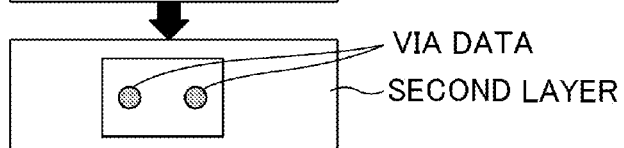
Figure 4H:
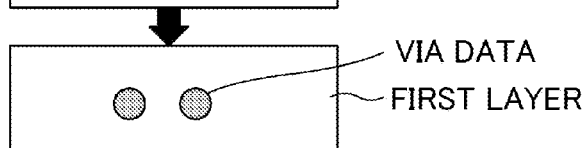
Figure 4I:
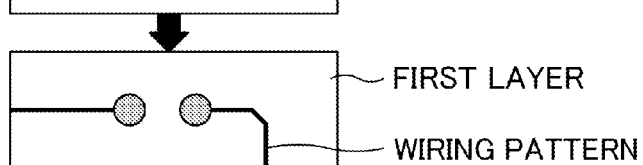
Figure 5A:
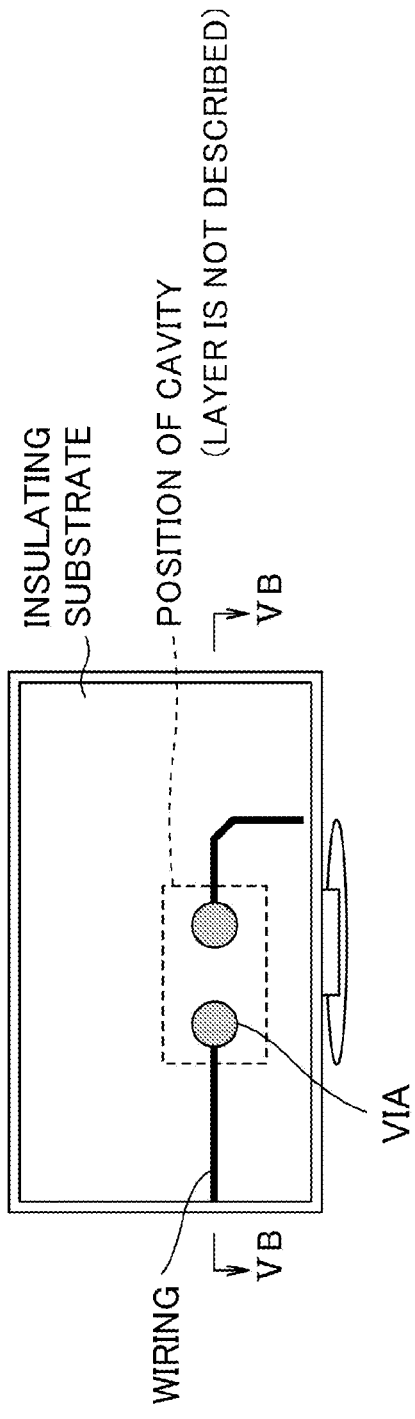
FIG. 5(*a*) is a view of the 2D design screen displaying a component-embedded substrate, and FIG. 5 (*b*) is a view showing the cross-section on line VB-VB shown in FIG. 5(*a*).
Figure 5B:
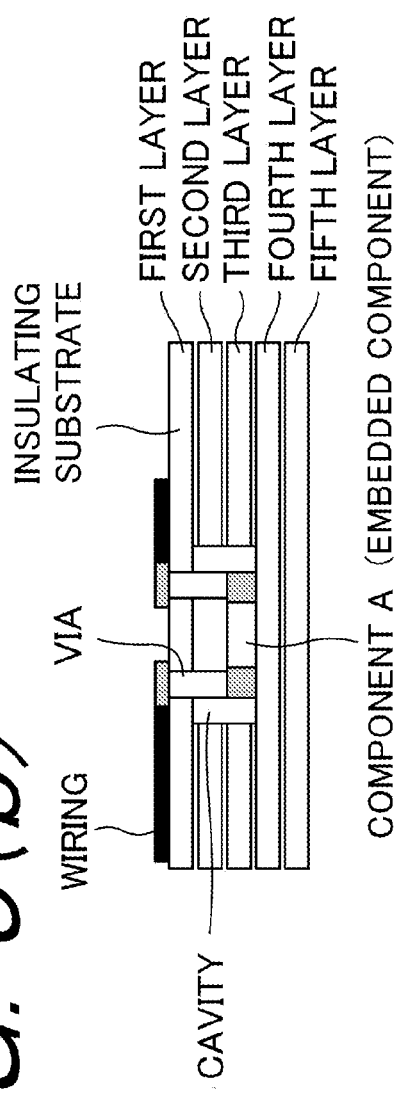

Hereinafter, referring to the attached drawings, an embodiment example of the electronic-substrate electrical design apparatus using three-dimensional space, the electrical design method, the program and the computer-readable recording medium by the present invention will be explained in detail.

First, FIG. 6 shows a block constitution explanatory view showing the hardware configuration of an example of an embodiment of the electronic-substrate electrical design apparatus using three-dimensional space by the present invention.

Specifically, the electrical design method and the electrical design apparatus (hereinafter, simply appropriately referred to as a "three-dimensional electrical design apparatus") 10 of the electronic substrate using three-dimensional space by the present invention, are built on a CAD system for electronic substrate design use or the like, for example, and the hardware configuration is realized by a publicly known personal computer system, a general-purpose computer system or the like, which is constituted so as to control the entire action of the system by using a central processing unit (CUP) 12.

Then, to the CPU 12, an internal storage device (memory) 14 which is made up of a read only memory (ROM) storing program for controlling the CPU 12, various kinds of data (described later) or the like, a random access memory (RAM) equipped with a storage region used as a working area of the CPU 12, or the like, a display device 16 equipped with a screen such as a CRT (Cathode Ray Tube: Braun tube) and a liquid crystal panel which performs various kinds of display on the basis of the control of the CPU 12, a mouse 18 and a touchpad 20 being input devices which designate an arbitrary position on the display screen of the display device 16, a keyboard 22 for inputting arbitrary characters, and an external storage device 24 such as a hard disc capable of storing various kinds of information by the control of the CPU 12 and reading the stored various kinds of information to transfer the information to the internal storage device 14 are connected.

It is to be noted that the mouse 18 having a wheel button (scroll button) 18*a* should be used in the present invention.

Further, such a three-dimensional electrical design apparatus 10 may be connected to another three-dimensional electrical design apparatus 10 via a LAN (Local Area Network) or a WAN (Wide Area Network) to exchange data such as design information.

In the above-described constitution, the contents of processing executed by the three-dimensional electrical design apparatus 10 will be explained in detail, and herein, a switching method of two-dimensional display and three-dimensional display in the present invention will be explained.

(1) Switching Between Two-dimensional Display and Three-dimensional Display (1-1) Summary of a Switching Method Between Two-dimensional Display and Three-dimensional Display Herein, as an object of the claimed invention, not only design of a two-dimensional display screen, design on a three-dimensional display screen is made possible.

Figure 7A:
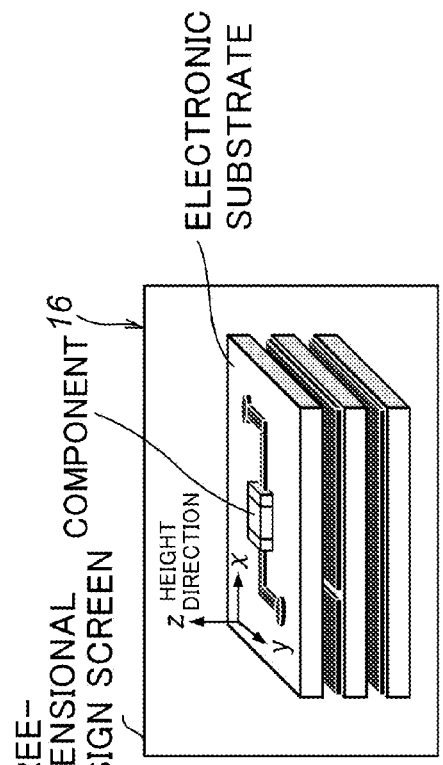
FIGS. 7(*a*)(*b*) are views explaining switching between two-dimensional display and three-dimensional display of the three-dimensional electrical design apparatus by the present invention.
Figure 7B:
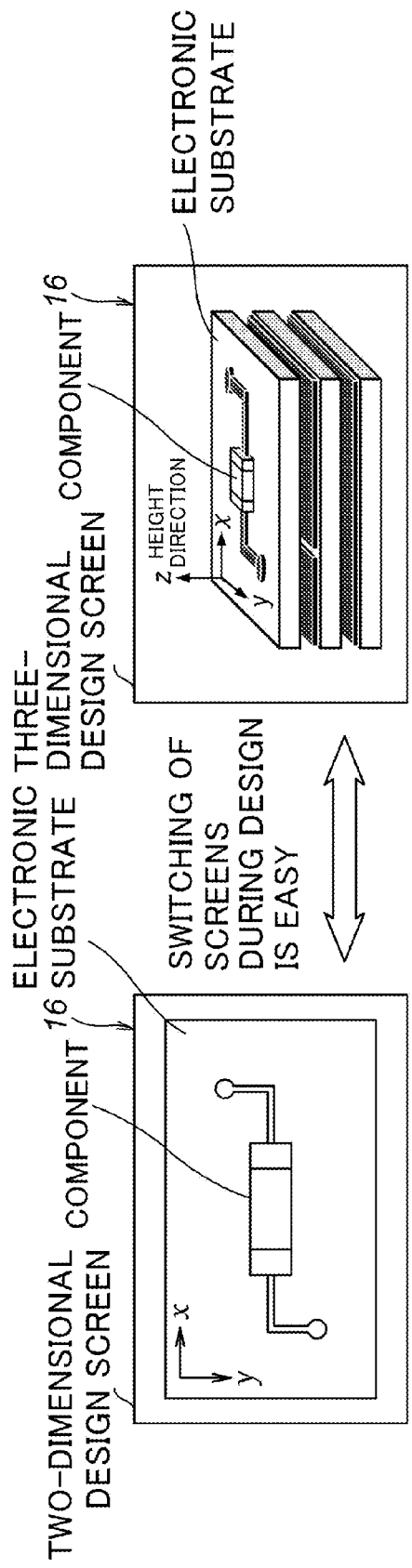

Furthermore, not only design on the three-dimensional display screen is made possible, but switching between two-dimensional display and three-dimensional display becomes easy, so that two-dimensional display and three-dimensional display can be switched at arbitrary timing (refer to FIGS. 7(*a*) and (*b*)).

Therefore, not only electrical design data is simply three-dimensionally displayed, but also three-dimensional display suitable for various conditions (described later) specific to electrical design is made possible, so that design can be smoothly moved forward.

In the following, summary of a switching method between two-dimensional display and three-dimensional display which enables the design on the three-dimensional display screen will be explained.

FIG. 8(*a*) shows a view in performing design of a multilayer electronic substrate on a two-dimensional display by using the three-dimensional electrical calculating apparatus 10 by the present invention.

Herein, assuming that a fourth layer out of a multilayer substrate is designed for example, two-dimensional display is designed to preferentially display a layer currently being designed, so in this case, the fourth layer being the bottom layer is preferentially displayed on the display screen 16, the first layer is displayed in a state hidden by the rear surface of wiring patterns or the like arranged on the fourth layer.

In such a two-dimensional display, images to be displayed are obtained by a method of displaying as the image of 2D in FIG. 8(*b*).

More particularly, two-dimensional display is display in which a camera 30 is installed virtually on the top portion of a multilayer electronic substrate and a state viewed from the camera 30 is shown as shown in FIG. 8(*b*).

Then, in two-dimensional display, the fourth layer being an editing target is moved to the highest level, the state of the substrate of the top layer is displayed by virtually viewing with the camera 30, and objects of other layers (indicating components such as electronic component, wiring pattern and via) are displayed on a design screen in the state where editing is not interrupted.

Specifically, for example, each layer of the electronic substrate is rearranged in the order of the fourth layer→the first layer→the second layer→the third layer from the top layer, a state where the rearranged state is viewed from the top virtually by the camera 30 is displayed as a design screen on the display screen 16.

Therefore, the objects of the fourth layer are displayed on the 2D design screen of the display screen 16 shown in FIG. 8(*a*), and the objects of the first layer are displayed in the state hidden by the rear surface of the fourth layer.

On the other hand, in three-dimensional display, an image to be displayed is obtained by a method of showing as the image of 3D display in FIG. 8(*c*).

More particularly, three-dimensional display is display in which the camera 30 is virtually arranged corresponding to the height of a layer being an editing target of the multilayer substrate as shown in FIG. 8(*c*), and a state viewed from the camera 30 is shown.

Then, in three-dimensional display, the layer being the editing target is displayed virtually viewing by the camera 30 in an oblique direction to the layer being the editing target.

Specifically, since the editing target is the fourth layer, the virtual camera 30 is moved to a predetermined position (described later) corresponding to the height of the fourth layer, and a state where the entire fourth layer is viewed together with other layers by the virtual camera 30 with a visual line direction set to an oblique direction is displayed as a design screen on the display screen 16.

In this occasion, in response to an operation of an operator, the position of the virtual camera 30 is appropriately moved to a position where the object of the fourth layer being edited can be checked by three-dimensional display (for example, refer to the position of the camera 30 shown in FIG. 8(c)), and a state where the layer is viewed so as to change the viewpoint of the virtual camera 30 is displayed as a design screen on the display screen 16.

In the three-dimensional electrical design apparatus 10 by the present invention, regarding such switching between two-dimensional display and three-dimensional display in which two-dimensional display and three-dimensional display are selected and displayed, two-dimensional display and three-dimensional display are designed to be seamlessly switched by double clicking the wheel button (scroll button) 18a of the mouse 18 or clicking a camera icon 32 at the lower right of the design screen.

Then, as an instruction of switching from two-dimensional display to three-dimensional display is made, in the above-described example, rearrangement of layers is performed from the above-described order of two-dimensional display (the fourth layer→the first layer→the second layer→the third layer) to a physical order (the first layer→the second layer→the third layer→the fourth layer) being a regular order regarding the fourth layer being the editing target out of the multilayer electronic substrate at the timing of the instruction.

Further, by double clicking the wheel button 18a of the mouse 18 or clicking the camera icon again, display is switched from three-dimensional display to two-dimensional display.

As described above, since the three-dimensional electrical design apparatus 10 by the present invention holds the information of all positions and shapes of electrical design data (indicating components such as insulating substrate, electronic component, wiring pattern and via) in height direction, a state when the electronic substrate is viewed from above is set as two dimensions and a state when the substrate is viewed from an oblique direction is set as three dimensions and by switching the viewpoints of both obtained images, it becomes possible to easily switch two-dimensional display and three-dimensional display.

(1-2) Data Structure of a Switching Method Between Two-dimensional Display and Three-dimensional Display Next, a data structure of switching between two-dimensional display and three-dimensional display of the three-dimensional electrical design apparatus 10 by the present invention will be explained below in detail.

Figure 9A:
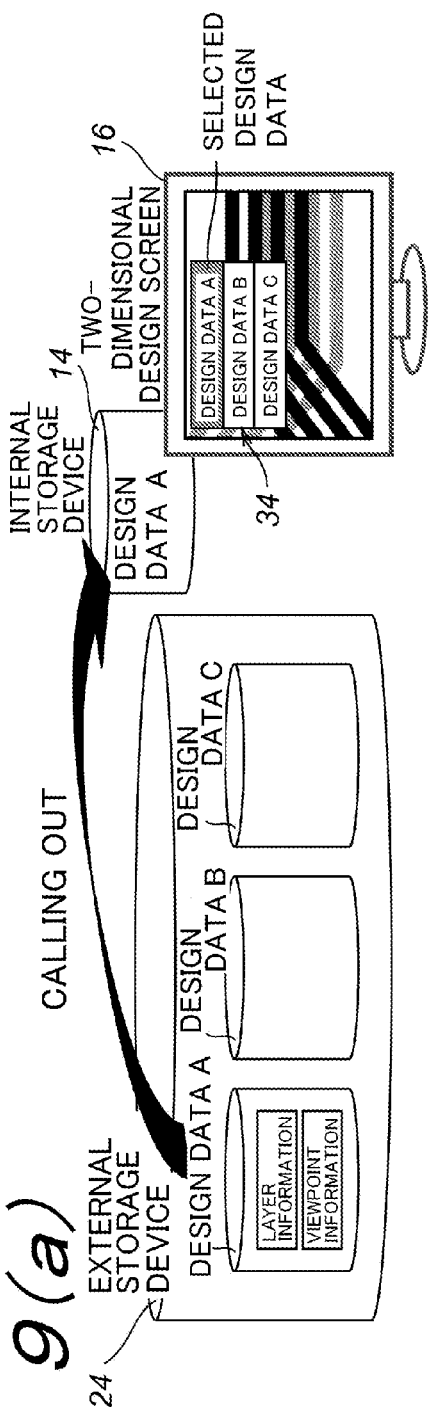
FIG. 9(*a*) is a view showing the data structure of design data used in performing design, and FIG. 9(*b*) is an explanatory view showing layer information and viewpoint information stored in design data.

FIG. 9(a) shows a view describing design data used in performing design in the three-dimensional electrical design apparatus 10 by the present invention.

Each of the design data used for electrical design of the electronic substrate is stored in the external storage device 24 by each design data as shown in FIG. 9(a), design data selected on the display screen 16 is called out from the external storage device 24 onto the internal storage device 14 in performing editing, and editing is performed.

Figure 9B:
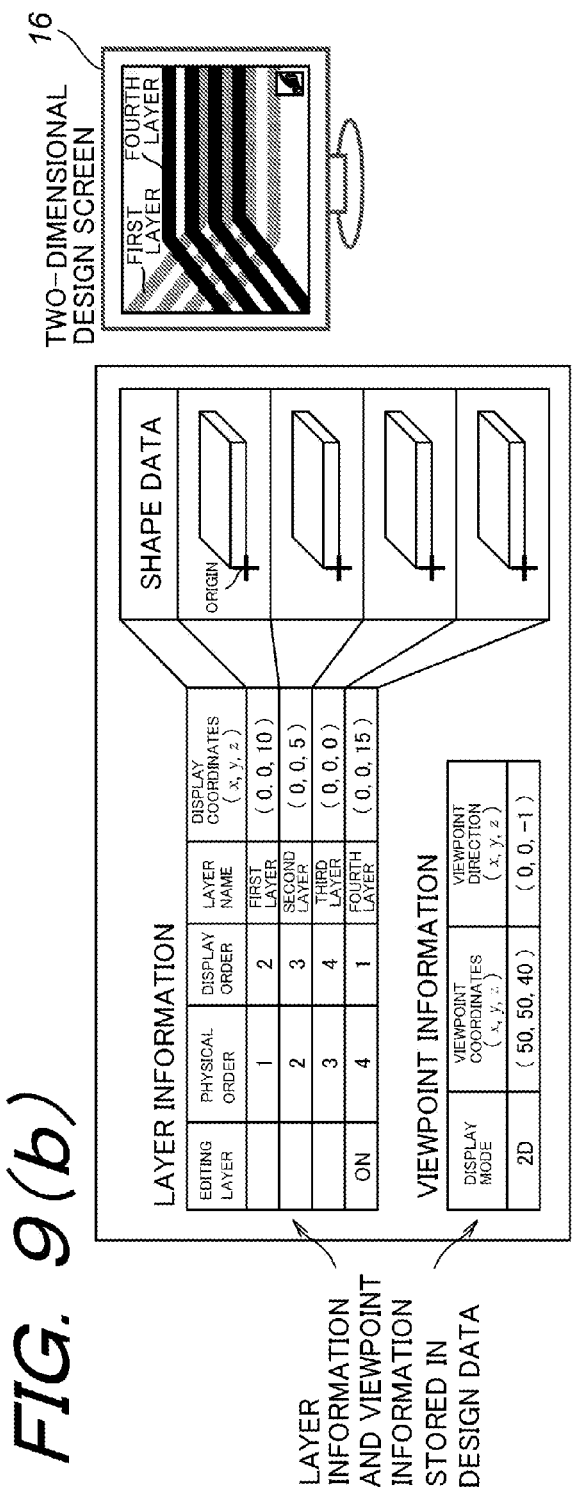

Further, layer information, viewpoint information or the like is stored in such design data, and FIG. 9(b) shows an example of the layer information and the viewpoint information.

In FIG. 9(b), in the case where design data A is designated out of a menu 34 on the design screen, database of the design data A in the external storage device 24 is read out, and information described in the design data A is two-dimensionally displayed on the display screen 16.

The layer information and the viewpoint information are stored in the database of the design data A. The layer information and the viewpoint information are shown in FIG. 9(b).

As shown in FIG. 9(b), the layer information has information regarding layers including shape data of each layer, and there are editing layer information, display order information, layer name information, display coordinate information or the like as the information that the layer information has, which will be explained below in detail.

First, the editing layer information of the layer information is information specifying a target layer to be edited, and is information indicating which layer is an editing target out of a plurality of layers of the multilayer substrate. For a target layer to be edited, a column for the editing layer is displayed as "ON" as shown in FIG. 9(b). Herein, the figure shows that the fourth layer is a target layer to be edited.

Next, the display order information of the layer information is information indicating a display order of each layer. As explained in FIGS. 8(a)(b), when two-dimensionally displaying a substrate to be designed on the display device 16, explanation was made that layer data is arranged in the order of the fourth layer→the first layer the second layer→the third layer from the top layer in order to display objects of other layers on the screen in the state where editing is not interrupted, and an arranging order of layers by which design can be easily performed is stored as a display order in such a display method.

Specifically, FIG. 9(b) shows that the fourth layer having 1 for the column in the display order is displayed at the highest level (in the case of two-dimensional display, the forefront on the design screen), and the first layer having 2 for the column in the display order is displayed on a layer under the fourth layer (in the case of two-dimensional display, the rear surface of the fourth layer on the design screen).

Actually, on the display screen 16, and as shown in FIG. 9(b), the fourth layer is displayed on the forefront, the first layer is displayed in a state hidden by the rear surface of the object arranged on the fourth layer.

Now, as a determining method of such a display order, the display order of the editing layer is 1 to bring the editing layer on the top layer, and as a display order of layers after the editing layer, the second and further layers are displayed in a descending order of the physical order.

Next, the layer name information of the layer information is information of names applied to each layer, and in this embodiment, numbers in the physical order are used as the names of each layer.

Next, the display coordinates information of the layer information is information indicating the coordinate of a position at which the shape data of each layer is displayed.

Figures 10A, 10B:
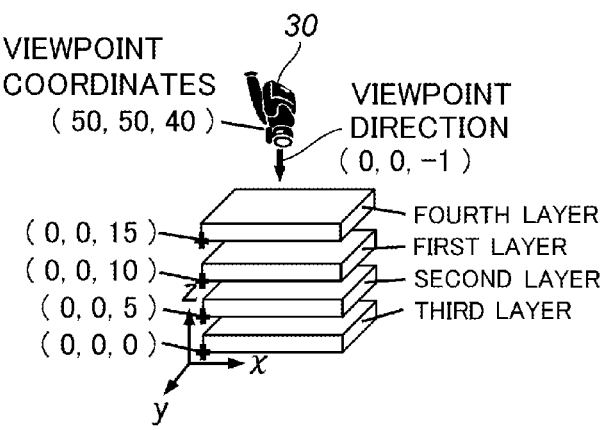
FIG. 10(*a*) is an explanatory view showing layer information and viewpoint information stored in the design data, and FIG. 10(*b*) is a view showing positional relation between a camera and an electronic substrate.

More particularly, FIG. 10(a) has information that the display coordinates of the first layer (x,y,z)=(0,0,10), the display coordinates of the second layer (x,y,z)=(0,0,5), the display coordinates of the third layer (x,y,z)=(0,0,0), and the display coordinates of the fourth layer (x,y,z)=(0,0,15).

Each of the above-described display coordinates indicates the origin position of each layer, and in the case where the display coordinates of the fourth layer are (0,0,15) for example, it means that the origin of a layer of shape data for the fourth layer is positioned at (x,y,z)=(0,0,15).

In the example of FIG. 10(a), the fact that the display coordinates of the third layer is (x,y,z)=(0,0,0) indicates that the third layer is the bottom layer. Then, the fact that the display coordinates of the second layer are (x,y,z)=(0,0,5) indicates that the second layer is arranged at a higher position than the third layer. Further, the fact that the display coordinates of the first layer are (x,y,z)=(0,0,10) indicates that the first layer is arranged at a higher position than the second layer, and the fact that the fourth layer are (x,y,z)=(0,0,15) as described above, the fourth layer is arranged at a higher position than the second layer.

Specifically, the display coordinates of each layer indicates that the layers are arranged in the order of the fourth layer→the first layer→the second layer→the third layer from the top. It is to be noted that a setting method of display coordinates will be described later.

Such a multilayer substrate is shown as in FIG. 10(b), in which the third layer is the bottom layer, the origin of the second layer is positioned 5 mm above the origin (0,0,0) of the third layer in height direction (Z axis direction shown in FIG. 10(b)), the origin of the first layer is positioned 10 mm above in height direction, and the origin of the fourth layer is positioned 15 mm above in height direction.

The display coordinates indicate the origin position of each layer as described above.

Next, referring to FIGS. 10(a)(b), the viewpoint information of the design data A will be explained below.

The viewpoint information has display mode information, viewpoint coordinates information and viewpoint direction information.

First, the display mode information of the viewpoint information is information indicating in which one of two-dimensional display and three-dimensional display a substrate design screen is displayed. The information is stored as "3D" in the case of three-dimensional display, and is stored as "2D" in the case of two-dimensional display. Herein, assuming that the substrate design screen is displayed in two-dimensional display, the "display mode" column of the viewpoint information is stored as "2D" as shown in FIG. 10(a).

Next, the viewpoint coordinates information of the viewpoint information is information regarding position coordinates indicating from which viewpoint position design data to be displayed on the substrate design screen is viewed.

Herein, as shown in FIG. 10(a), the viewpoint coordinates are (x,y,z)=(50,50,40).

The viewpoint coordinates are coordinate indicating the position of the camera 30 which virtually views a substrate surface to be designed, and show the state that design data is viewed from the position of the camera 30 is displayed on the design screen shown in FIG. 10(b).

Specifically, seen from the origin (0,0,0) of the bottom layer, viewing by the virtual camera 30 is performed at the position of (x,y,z)=(50,50,40).

Next, the viewpoint direction information of the viewpoint information is information regarding direction coordinates indicating a visual line direction (angle) viewing substrate design data from viewpoint coordinates being the viewing position of the above-described camera 30.

In FIG. 10(a), a viewpoint direction is (x,y,z)=(0,0,−1), which means that a vector direction having a start-point as (x,y,z)=(0,0,0) and an end-point as (x,y,z)=(0,0,−1) is the direction of the viewpoint.

In this embodiment, in the case of two-dimensional display, viewpoint coordinates are automatically set so as to set XY coordinates of the viewpoint coordinates as the central XY coordinates of an object being edited such that Z coordinate of the viewpoint coordinates viewing substrate design data positioned above the substrate.

For example, in the case where an electronic substrate has the dimension in XY directions of 100 mm×100 mm and the entire 4 layers is edited on the two-dimensional display screen, (x,y)=(50,50) which are the central coordinates of 100 mm×100 mm are automatically set as XY coordinates of the viewpoint coordinates.

Further, in editing other objects such as components and wiring patterns as well, the central coordinates of an object being edited are set as XY coordinates of the viewpoint coordinates in the same manner.

Next, a data structure in the case of enlarging display and reducing display of the design screen which are performed by using the viewpoint coordinates information in two-dimensional display will be explained.

Figure 11A:
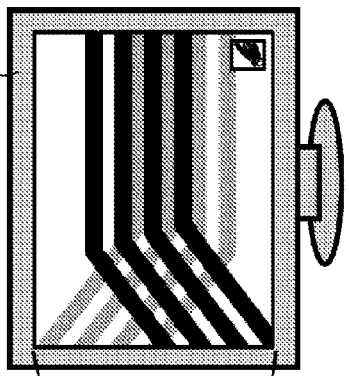
FIGS. 11(*a*)(*c*) are views showing display examples of two-dimensional design screen, and FIGS. 11(*b*)(*d*) are views for explaining a method of obtaining an image used in enlarging/reducing display.

As shown in FIG. 11(a), the designer can select enlarging display or reducing display of the design screen.

Then, regarding enlarging display and reducing display, enlarging display or reducing display is performed on the design screen by changing Z coordinate of the viewpoint coordinates information.

In the example of FIG. 11(a), the entire electronic substrate is displayed on the design screen. Viewpoint coordinates at this point are set to (x,y,z)=(50,50,80) using the origin (0,0,0) of the bottom layer as an origin as shown in FIG. 11(b).

Figure 11C:
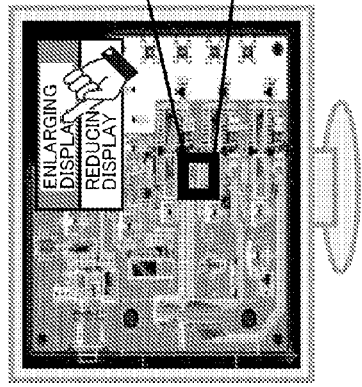
Figure 11D:
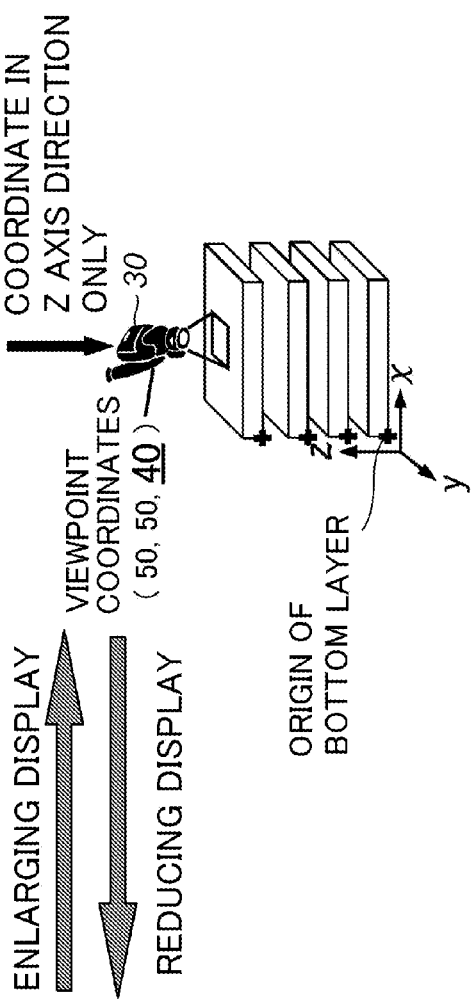
Figure 11B:
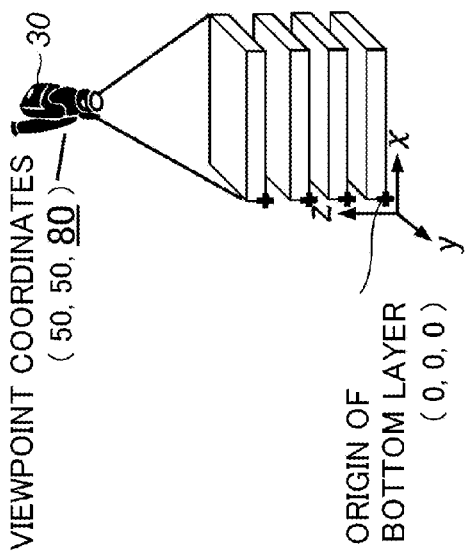

Herein, as enlarging display is selected by the designer, the design screen is displayed in an enlarged manner from the state of FIG. 11(a), and the display screen 16 is changed to the display of FIG. 11(c). In this occasion, the viewpoint of the camera 30 is changed to the position of FIG. 11(d) (x,y,z)=(50,50,40) so as to approach an object being edited. Specifically, only Z coordinate of the viewpoint coordinates are changed from 80 mm to 40 mm.

As explained above, in performing enlarging display on the design screen, a Z coordinate value of the viewpoint coordinates becomes smaller such that the viewpoint coordinates of the camera 30 approach the object being edited.

On the other hand, in performing reducing display on the design screen, a Z coordinate value of the viewpoint coordinates becomes greater such that the viewpoint coordinates of the camera 30 recede from the object being edited.

In performing enlarging display and reducing display, XY coordinates of the viewpoint coordinates are not changed and only the Z coordinate value is changed, so that the viewpoint coordinates of the camera 30 parallelly move with respect to Z axis.

As described above, in performing two-dimensional display, by arranging the viewpoint of the camera 30 at a position where substrate design data of three-dimensional shape is seen from above, design data is two-dimensionally displayed on the design screen.

(1-3) Example of a Switching Method Between Two-dimensional Display and Three-dimensional Display Next, referring to FIG. 12 to FIG. 15, a display method of three-dimensional display in the three-dimensional electrical design apparatus 10 by the present invention will be explained.

FIG. 12 shows a view for explaining positions of the camera 30 in two-dimensional display and three-dimensional display.

As described above, even if the three-dimensional electrical design apparatus 10 by the present invention performs two-dimensional display on the display screen 16, the apparatus can switch between two-dimensional display and three-dimensional display, select and display by changing the viewpoint coordinates and viewpoint direction coordinates of the camera 30 because the apparatus holds information of three-dimensional shape as design information.

Figures 12A, 12B:
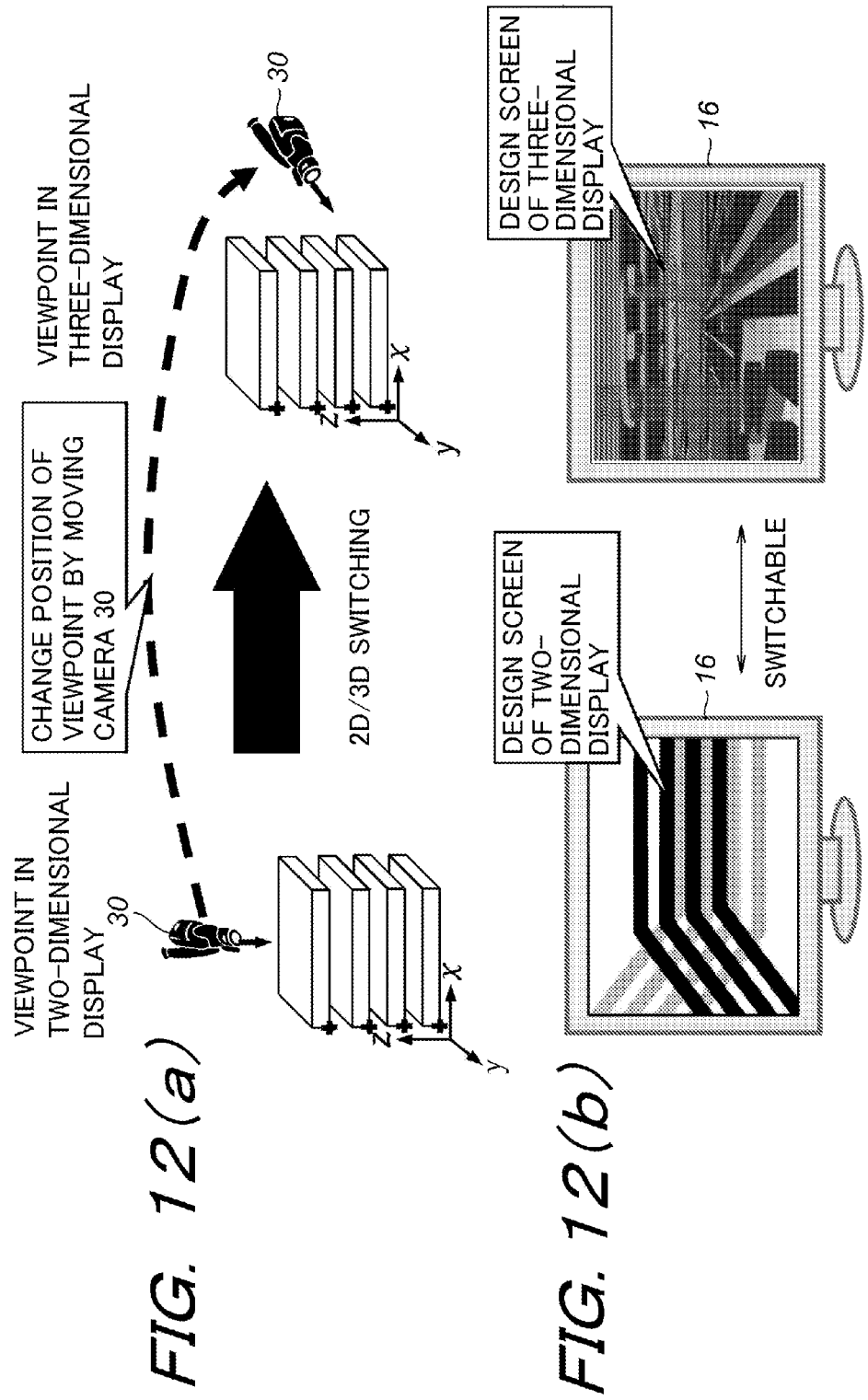
FIG. 12(*a*) is a view showing viewpoint in two-dimensional display and viewpoint in three-dimensional display, and FIG. 12(*b*) is a view showing switching between a two-dimensional display screen and a three-dimensional display screen.

More particularly, as explained above, in the case of two-dimensional display, the viewpoint coordinates of the camera 30 were positioned above the top surface of design data in such a manner that the top surface can be virtually viewed as shown in FIG. 12(a), but three-dimensional display is realized by changing the position of the camera 30 to make the viewpoint coordinates position in an oblique direction of design data.

Hereinafter, the viewpoint coordinates of the camera 30 in performing three-dimensional display will be explained in detail.

First, in the case of switching from two-dimensional display to three-dimensional display, regarding the display coordinates of each layer, this apparatus automatically changes the display coordinates of each layer on the basis of set values of physical order shown in the layer information of FIG. 13(a) and set values of default setting of three-dimensional display (described later).

For example, in the example of FIGS. 13(a)(b), the fourth layer is selected as the editing layer, and Z coordinate of the fourth layer is 0 because the physical order shown in FIG. 13(a) is 4. Then, as shown in FIG. 13(b), a position in Z axis direction is set to be the bottom layer.

Further, Z coordinate of the third layer having the physical order of 3 is set to a position keeping a fixed gap comparing to the display coordinates of the fourth layer in a plus direction of Z axis direction as shown in FIG. 13(b) based on a value designated as a gap between insulating layers (gap of 5 mm for example) of default setting of three-dimensional display (described later).

Further in the same manner, Z coordinate of the second layer having the physical order of 2 is set to a position keeping a fixed gap comparing to the display coordinates of the third layer in a plus direction of Z axis direction, and Z coordinate of the first layer having the physical order of 1 is set to a position keeping a fixed gap comparing to the display coordinates of the second layer in a plus direction of Z axis direction.

Then as a result, the display coordinates of each layer are set as shown in FIG. 13(b).

Based on values designated by such default setting of three-dimensional display, X coordinate and Y coordinate of each layer are not changed, but only the setting of Z coordinate is changed as described above.

On the other hand, in switching from two-dimensional display to three-dimensional display, the display mode of the viewpoint information of the three-dimensional electrical design apparatus 10 by the present invention is set to "3D" as shown in FIG. 13(a).

Then, in this occasion, the viewpoint direction coordinates are set to (x,y,z)=(−1,−1,−1).

The case where the viewpoint direction coordinates are (x,y,z)=(−1,−1,−1) indicates that a vector direction having a start-point as (x,y,z)=(0,0,0) and an end-point as (x,y,z)=(−1,−1,−1) is a direction of the visual line direction (refer to FIG. 13(b)).

Further, in switching from two-dimensional display to three-dimensional display, the viewpoint coordinates of the viewpoint information shown in FIG. 13(a) are set as shown below.

First, from the editing layer information of the layer information, which layer is an editing target is detected. Since the fourth layer is ON in the example shown in FIG. 13(a), the fact that the fourth layer is a target layer to be edited is detected.

Then, from the physical order information of the layer information, layers positioned above the target layer to be edited and the display coordinates of the layers positioned above the target layer are detected, and Z coordinate of the viewpoint coordinates is set based on the information.

For example, in the example of FIG. 13(a), since the physical order of the fourth layer being edited is set to "4", the fact that the third layer whose physical order is set to "3" is a layer positioned above the fourth layer is recognized. Then, the fact that Z coordinate of the display coordinates of the third layer (x,y,z)=(0,0,5) has the gap of 5 mm from the origin of the bottom layer is detected, and Z coordinate of the viewpoint coordinates of the camera 30 is set to the position of 5 mm height which is the same as the display coordinates of the third layer (refer to FIG. 13(b)).

Then, XY coordinates of the viewpoint coordinates of the camera 30 are set to a position apart from the edge of an object being edited by a distance designated as an "offset value of viewpoint" of "default setting of three-dimensional display".

For example, in the case where "offset value of viewpoint" of "default setting of three-dimensional display" is set to 10 mm both in X direction and Y direction, the position of (x,y)=(100,100) is the end portion of the object (the fourth layer) in editing the (entire) fourth layer having the dimension in XY directions of 100 mm×100 mm, and the position of coordinate (x,y)=(110, 110) being a point apart from the end portion of the fourth layer in XY directions severally by 10 mm is set as XY coordinates of the viewpoint coordinates.

Due to XY coordinates set on the basis of the default setting of three-dimensional display and Z coordinate set as described above, the viewpoint coordinates shown in FIG. 13(a) are set as (x,y,z)=(110,110,5) (FIG. 13(b)).

It is to be noted that setting regarding the above-described default setting of three-dimensional display is called out from the external storage device 24.

As described above, the camera 30 is adapted to view the layer of a target layer by adjusting the position of the camera to enable three-dimensional display, and actually, the screen shown as a design screen of three-dimensional display in FIG. 12(b) is displayed on the display screen 16, which enables three-dimensional display.

Now, in performing three-dimensional display, in the case where an operation of enlarging display or reducing display is performed on the design screen, the viewpoint coordinates are changed such that the viewpoint parallelly moves with respect to the vector indicated by the viewpoint direction.

More particularly, in performing two-dimensional display, the viewpoint coordinates parallelly move with respect to Z axis only to adjust a height direction as explained above, by which enlarging display or reducing display is performed. On the other hand, in performing three-dimensional display, enlarging display or reducing display is performed by parallelly moving only in a vector direction of the viewpoint direction.

By the method explained above, according to the three-dimensional electrical design apparatus 10 by the present invention, performing electrical design of the electronic substrate while seamlessly switching two-dimensional display and three-dimensional display is made possible.

Herein, referring to the flowchart of FIG. 14, a processing procedure in actually performing the switching processing of the above-described two-dimensional display and three-dimensional display will be explained.

(It is to be noted that a processing flow regarding such switching processing of two-dimensional display and three-dimensional display will be appropriately referred to as a processing flow of 2D/3D display switching).

First, the processing flow of 2D/3D display switching is started by an operation of designating design data to be edited on the design screen by the designer (step S1402).

Next, processing of reading design data including the layer information, the viewpoint information and the default setting information of three-dimensional display, and displaying design data on the design screen is performed (step S1404).

Herein, design data that the designer selected is called out from the external storage device 24, and processing of displaying design data on the display screen 16 is performed.

Next, as the designer selects a layer and an object on the design screen (step S14006), procedure proceeds to step S1408, and processing of detecting the selected layer and object is performed.

Herein, a target layer and a target object which are targets to be designed are detected.

Next, in step S1410, editing is started for the layer and the object which the designer selected.

Then, as the designer performs a switching operation between two-dimensional display and three-dimensional display by double clicking the wheel button 18a of the mouse 18 or clicking the camera icon 32 in an editing work (step S1412), procedure proceeds to step S1414.

Next, in step S1414, judgment processing whether or not the current display mode is "2D" is performed.

Herein, assuming that the display mode of the current editing screen is three-dimensional display (3D), the mode is judged as NO in the judgment processing of step S1414, and procedure proceeds to step S1416.

Then, in step S1416, processing of changing the set value of the display mode of the viewpoint information to "2D" and changing the viewpoint direction of the viewpoint information to (0,0,−1) is performed.

Herein, the display mode of the viewpoint information explained in FIG. 10(a) is set to two dimension (2D), the viewpoint direction of the viewpoint information is (x,y,z)=(0,0,−1), and processing of changing the angle of the camera 30 to a downward direction is performed as shown in FIG. 10(b).

Furthermore, as the processing of step S1416 ends, then in step S1418, processing of changing the display order of a layer being edited in which the editing layer of the layer information is set to ON to "1", and regarding the display order of other layers, changing to numerical values each of which is increased by 1 from "2" starting from a smaller physical order setting are performed.

Herein, as explained in FIG. 10(a), processing is performed so as to set the display order to 1 such that a layer, in which ON is set to the column for the editing layer of the layer information, is positioned at the top layer out of the multilayer substrate and to arrange other layers other than the editing layer in order in the physical order after the editing layer.

Next, procedure proceeds to step S1420, in which processing of changing Z coordinate of the display coordinates of a layer having the largest set value of the display order in the layer information to "0", and calculating and changing Z coordinate of the display coordinates of other layers based on the setting of a gap between insulating layers of the default setting of three-dimensional display is performed.

Specifically, herein, processing of setting Z coordinate of the display coordinates of a layer having the largest set value of the display order to "0" to make the layer as the bottom layer, and regarding other layers, arranging each layer by providing a predetermined gap in Z axis direction on the basis of the setting of a gap between insulating layers of the default setting of three-dimensional display is performed as shown in FIG. 10(b).

Then, as step S1420 ends, then in step S1422, processing of calculating the central coordinates of a layer being edited and an object and changing XY coordinates of the viewpoint coordinates of the viewpoint information to the same XY coordinates of the calculated central coordinates is performed.

Herein, as shown in FIG. 11(b), processing of arranging the camera 30 so as to be positioned at the center of substrate data being edited is performed.

Next, in step S1424, processing of detecting the height of the entire design data and changing Z coordinate of the viewpoint coordinates of the viewpoint information to a detected height is performed.

Herein, in order to view the entire design data from above, processing of changing Z coordinate of the viewpoint coordinates out of the viewpoint information of the camera 30 to a height from which the highest layer is viewable, that is, to the detected height is performed.

Next, in step S1426, processing of two-dimensionally displaying the design data is performed.

Herein, processing of displaying design data, to which the processing from the step S1416 to step S1424 was executed, on the display screen 16 is performed.

Then, in step S1428, processing of judging whether or not design should be ended is performed.

Herein, design should be continued, and processing is judged as No to return to the processing of step S1406.

It is to be noted that the processing same as the processing explained above is performed in steps from step S1406 to step S1410.

Then, in step S1412, as an operation of double clicking the wheel button 18a or clicking the camera icon 32 is performed by the designer, in step S1414, processing of judging whether or not the current display mode is "2D" is performed.

Herein, since the current display mode is two-dimensional display, it is judged as Yes in the judgment processing of step 1414, and procedure proceeds to step S1430.

Next, in step S1430, processing of changing the set value of the display mode of the viewpoint information to "3D", and changing the viewpoint direction of the viewpoint information to (−1,−1,−1) is performed.

Herein, as shown in FIG. 13(a), the display mode of the viewpoint information is set to "3D", and processing of changing a direction of the camera 30 is performed by setting the viewpoint direction of the viewpoint information to (x,y,z)=(−1,−1,−1).

Then, in step S1432, processing of changing Z coordinate of the display coordinates of a layer having the largest set value of the physical order in the layer information to "0", and calculating and changing Z coordinate of the display coordinates of other layers based on the setting of a gap between insulating layers of the default setting of three-dimensional display is performed.

Herein, as shown in FIG. 13(b), processing of setting Z coordinate of the display coordinates of a layer having the largest set value of the physical order in the layer information to "0" to make the layer as the bottom layer, and regarding other layers, arranging each layer by providing a predetermined gap in Z axis direction on the basis of the setting of a gap between insulating layers of the default setting of three-dimensional display is performed as shown in FIG. 13(b).

Next, in step S1434, processing of detecting the coordinate of the edge of the layer being edited and the object, and, regarding XY coordinates of the viewpoint coordinates of the viewpoint information, calculating and changing XY coordinates based on the setting of an offset value of the viewpoint of the default setting of three-dimensional display is performed.

Herein, the position of the camera 30 is adjusted to enable the editing layer to be three-dimensionally displayed.

Then, in step S1436, processing of detecting a layer positioned on the layer being edited, and changing Z coordinate of the viewpoint coordinates of the viewpoint information to the same Z coordinate as the origin coordinates of the detected layer positioned above is performed.

Herein, by matching Z coordinate of a layer positioned directly above the target layer with Z coordinate of the viewpoint coordinates, the position of the camera 30 is adjusted so as to make the entire target layer easily viewed.

Then, as the processing of step S1436 ends, processing of three-dimensionally displaying the design data is performed in the processing of step S1438.

Herein, processing of displaying design data, to which the processing from the step S1430 to step S1436 was executed, on the display screen 16 is performed.

Then, in step S1428, processing of judging whether or not design should be ended is performed.

Herein, design should be ended, and processing is judged as Yes to end the processing flow of 2D/3D display switching.

As explained above, by the above-described processing procedure, switching two-dimensional display or three-dimensional display is made possible in performing electrical design of the electronic substrate.

Then, in the three-dimensional electrical design apparatus 10 by the present invention, electrical design of the electronic substrate can be performed while seamlessly switching two-dimensional display and three-dimensional display by the mechanism explained above, so that it becomes possible to improve design efficiency of the electronic substrate.

Further, not only by enabling switching of two-dimensional display and three-dimensional display, but also enabling display switching specific to electrical design, in which layers are displayed after rearranging into the physical order in switching design data for displaying the layer being edited in performing two-dimensional display on the top surface to three-dimensional display, editing electrical design data more efficiently is made possible.

What has been described is above the explanation regarding the switching method between two-dimensional display and three-dimensional display.

Next, various functions executed in design using the three-dimensional electrical design apparatus 10 will be explained.

(2) Three-dimensional Display of Electrical Design Data

The display switching of two-dimensional display and three-dimensional display was explained above, and various functions regarding three-dimensional display after display switching (three-dimensional display specific to electrical design data) will be explained here.

(2-1) Display Method of Layers

A three-dimensional display method of the thickness of the electronic substrate will be explained below.

Herein, the thickness of the electronic substrate is approximately 0.1 mm to 3 mm in the case of a rigid substrate, and is as extremely thin as several 10 μm (10 μm=10/1000=0.01 mm) in the case of a flexible substrate for example. Then, when an attempt is made to three-dimensionally display the data of a four-layer substrate, in which the thickness of an insulating layer corresponding to an insulating substrate is 0.2 mm and the thickness of a conductor layer corresponding to copper foil is 35 μm, in the dimension of full scale, a thin shape having little thickness is displayed, and boundary between each layer is difficult to be judged as shown in FIG. 15(a).

Figure 15A:
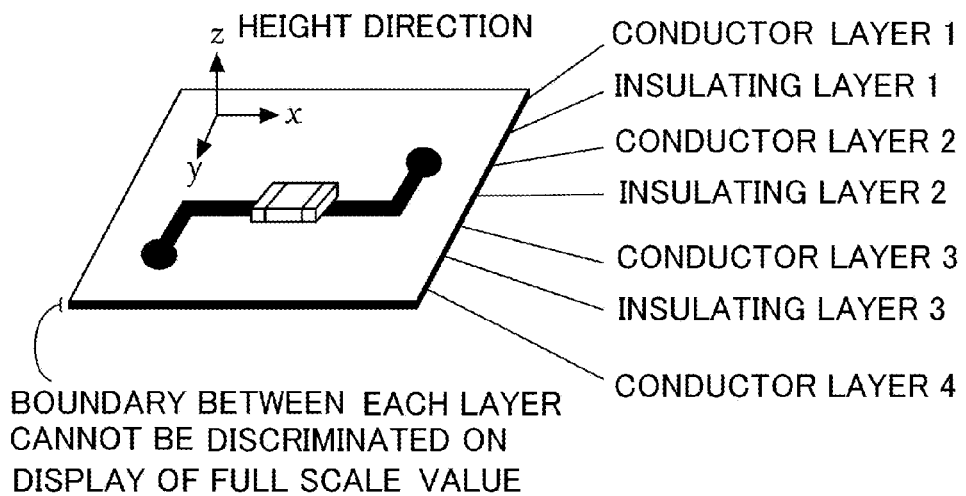
FIG. 15(*a*) is a view showing an example of an electronic substrate displayed by conventional three-dimensional display, and FIG. 15(*b*) is a view showing an example of an electronic substrate displayed by three-dimensional display of the present invention.

Further, in FIG. 15(a), conductor layers and insulating layers are alternately arranged and layers from an insulating layer 1 to an insulating layer 3 exist between a conductor layer 1 and a conductor layer 4, and in height direction (Z axis direction in FIG. 15(a)), a region of the conductor layer 1 and a region of the insulating layer 1 cannot be judged from full scale display.

Therefore, the three-dimensional electrical design apparatus 10 by the present invention made it possible to enlarge dimension in height direction from the full scale, and also made it possible to designate power or a visually observable real value on in increments of mm.

Figure 15B:
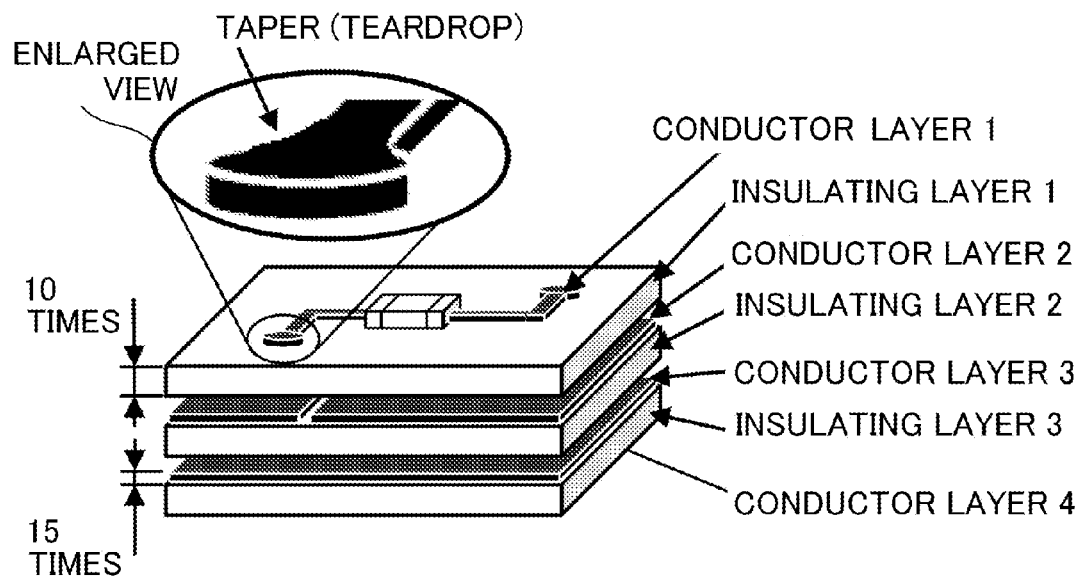

Consequently, dimension in height direction can be displayed in a visually observable 3D shape as shown in FIG. 15(b).

Herein, FIG. 15(b) shows an example in which the thickness of the insulating layer is 10 times the original size, the thickness of the conductor layer is 15 times the original size, a gap between each insulating layer is 2 mm, and objects such as components are displayed in the height of the full scale.

Further, dimension in height direction is displayed in a multiplied state based on a power or a dimension set as a default value.

Furthermore, since simplified three-dimensional display by simple circle, straight line or square shape is different from an electronic substrate after manufacture, so that as in the enlarged view of FIG. 15(b), three-dimensional shapes where taper (taper or arc by teardrop processing) and the thickness of copper foil are taken in consideration are displayed.

Then, the conductor layer 1 is an editing target in FIG. 15(b). For example, in the case where the conductor layer 2 is selected on the design screen while the conductor layer 1 is designed, the conductor layer 1 and the insulating layer 1 which are upper layers of the conductor layer 2 are displayed in a transparent manner as shown in FIG. 16(a) at the same time when the conductor layer 2 is set as an editing target, and display is automatically switched to a state where an object of the conductor layer 2 being an editing target can be visually checked.

Further, in the case of changing a display state of the conductor layer 1 and the insulating layer 1 which are displayed in a transparent manner, by selecting a desired display method out of a menu shown in FIG. 16(a), which is displayed in selecting the conductor layer 1 or the insulating layer 1, switching of a display state of layers which exist above the editing target is made possible.

More particularly, for example, in the case where "regular display" is selected out of the menu displayed in selecting the conductor layer 1 or the insulating layer 1, the conductor layer 1 and the insulating layer 1 turn to regular display as shown in FIG. 16(*b*). At the same time, the conductor layer 1 and the insulating layer 1 which are upper layers of the conductor layer 2 automatically move to an upper side, and the whole picture of the conductor layer 2 being edited is displayed in a visually checkable state.

Further, it is possible to display objects arranged across a plurality of layers, which are vias or the like connecting the conductor layer 1 and the conductor layer 2, for example, in a transparent manner as shown in FIG. 16(*c*).

Now, since vias are set to be displayed in the case of default setting and displayed as in FIG. 16(*c*), but it is also possible to select the conductor layer 1 or the insulating layer 1 to vertically drag and move on the screen or set vias to "regular display" or "hidden" by a menu operation. Furthermore, it is also possible to set a display state of all vias connecting the conductor layer 1 and the conductor layer 2 to "regular display" or "hidden" collectively by selecting a single via and selecting "all vias regular display" or "all vias hidden" out of the menu displayed.

Further, as "hidden" is selected out of the menu after selecting the conductor layer 1 or the insulating layer 1, the conductor layer 1 and the insulating layer 1 are displayed in a transparent manner such that only the outer frame of the conductor layer is displayed in a dashed line as shown in FIG. 16(*d*).

Further, as "viewpoint switching" is selected out of the menu after selecting the conductor layer 2, a viewpoint camera 30 in the shape of video camera on the screen is displayed on the design screen as shown in FIG. 16(*d*). The viewpoint camera 30 can be moved to a position which one desires to set as a viewpoint while dragging by the mouse 18. For example, as the camera is moved to the position shown in FIG. 16(*d*), the display screen switched to an image (FIG. 16(*e*)) which is three-dimensional display in which the conductor layer 2 is seen from the position of the viewpoint camera 30.

Now, in FIG. 16(*e*), all vias connecting the conductor layer 1 and the conductor layer 2 are set to be displayed in a transparent manner and the conductor layer 1 or the insulating layer 1 are set to make regular display.

(2-2) Automatic Vertical Movement of Layer

Figure 17A:
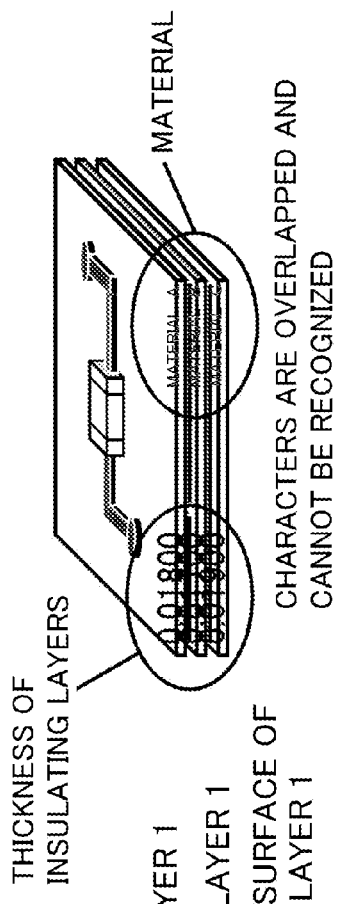
FIGS. 17(*a*)(*b*)(*c*) are views for explaining a display method of layers in performing three-dimensional display.
Figure 17B:
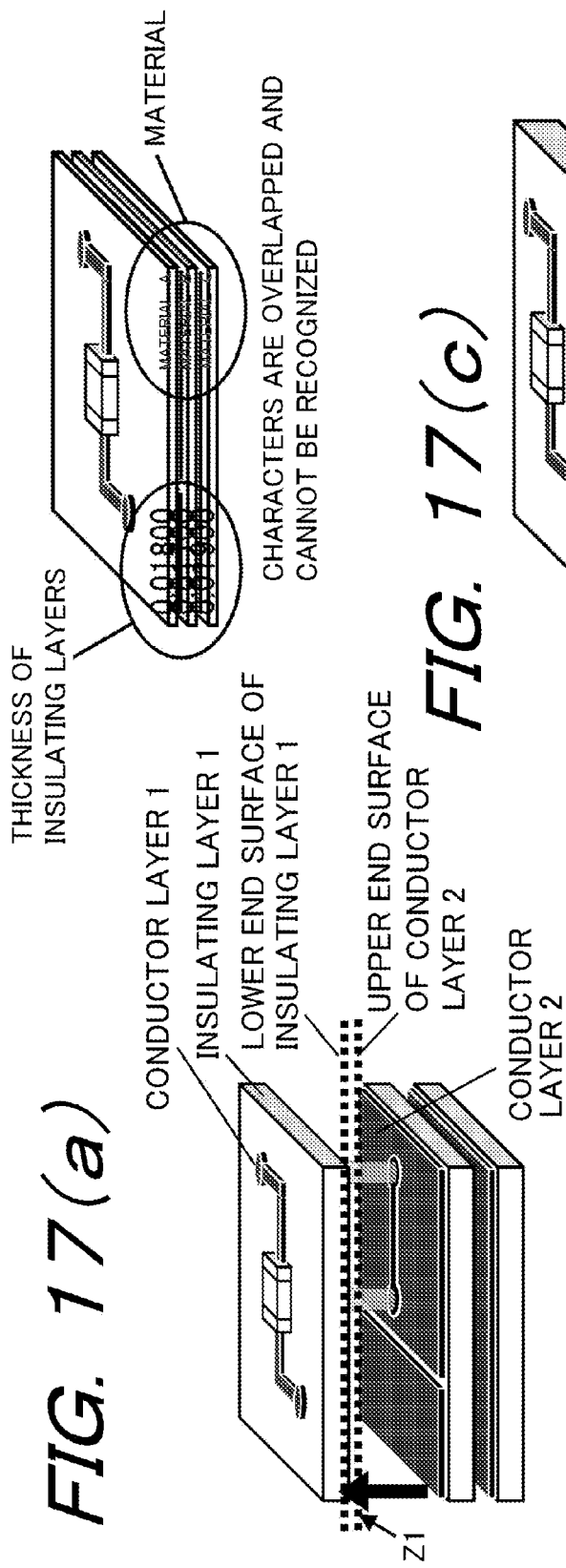
Figure 17C:
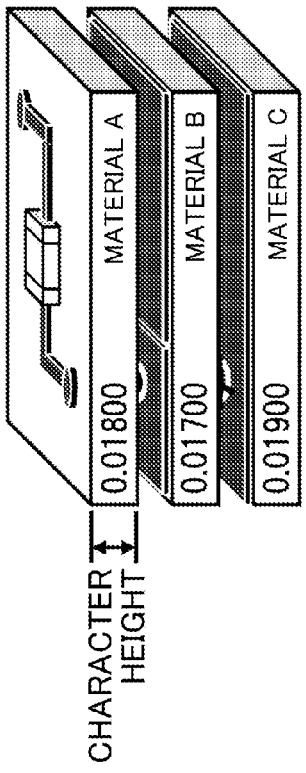

The three-dimensional electrical design apparatus 10 by the present invention has a function of, in the case of selecting a target layer to be edited, automatically vertically moving layers which exist above the target layer and displaying the entire target layer to be edited without being hidden by upper layers in a visually checkable state as shown in FIG. 17(*a*).

A vertical moving mechanism of upper layers will be explained below referring to FIG. 17.

For example, as the conductor layer 2 shown in FIG. 17(*a*) is selected as a target layer to be edited by the mouse 18, simultaneously, in the three-dimensional electrical design apparatus 10 by the present invention, at which position on the design screen the end surface of the conductor layer 2 is displayed is detected.

For example, in the case where the upper end surface of the conductor layer 2 is detected to be displayed at the position of coordinate Z1 in a vertical direction, the conductor layer 1 and the insulating layer 1 are automatically moved such that the lower end surface of the insulating layer 1 which is an upper layer of the conductor layer 2 comes above coordinate Z1.

Therefore, it is possible that the conductor layer 2 which is an editing target is three-dimensionally displayed in the state where the conductor layer 2 can be viewed without being hidden by the rear surface of the conductor layer 1 and the insulating layer 1 which are upper layers.

Next, referring to FIGS. 17(*b*) and (*c*), correction regarding character height of thickness displayed on the insulating layers will be explained.

In the case where the thickness of an insulating layer is displayed in a thickness closer to the full scale in performing three-dimensional display, a problem occurred as shown in FIG. 17(*b*) that characters indicating thickness and material which were described on the side surface of each layer overlapped adjacent layers, and character contents could not be checked.

To solve the problem, the three-dimensional electrical design apparatus 10 by the present invention is configured to be capable of displaying by varying distance in height direction in the electronic substrate.

This embodiment has a function that the three-dimensional electrical design apparatus 10 detects the height of characters indicating the thickness and material which are described on the side surface of each layer by turning setting that "Set the thickness of insulating layers to character height or more" (described later) to ON, and automatically corrects the minimum dimension of the thickness of the insulating layer for the character height.

By having such a function, it is possible to perform three-dimensional display in the state where the characters indicating the thickness and material which are displayed on the side surface of the layers are checkable as shown in FIG. 17(*c*).

In the three-dimensional display of electrical design data explained above, it is possible to obtain desired three-dimensional display by changing various settings to make them associate with the current design data in a default setting screen of three-dimensional display (described later).

(2-3) Storing Method of Design Data

Next, referring to FIG. 1B, a data structure of design data related to the default setting of three-dimensional display will be explained.

For example, in this embodiment, electrical design of the electronic substrate is performed using design data A as design data.

Figure 18:
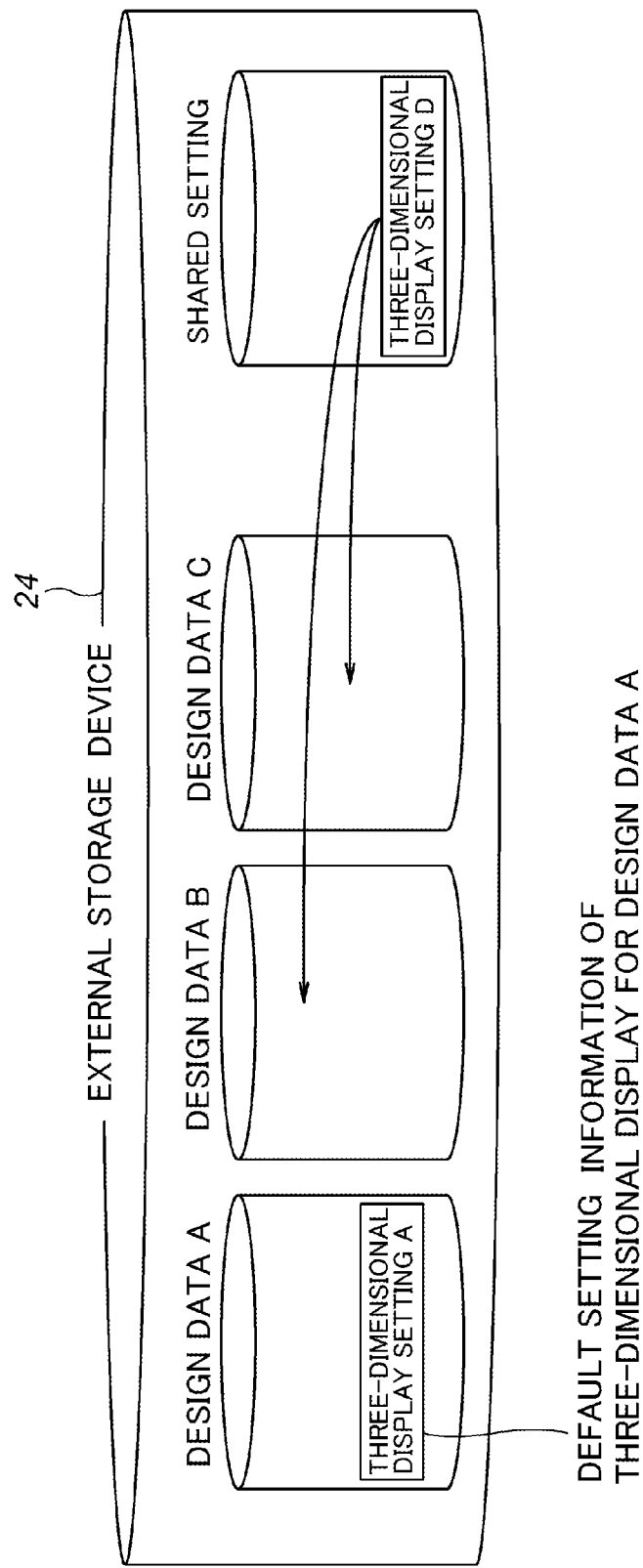
FIG. 18 is a view for explaining a data structure of design data used in performing three-dimensional display.

In such a case, as shown in FIG. 18, it is possible store the default setting information of three-dimensional display regarding the setting of three-dimensional display in addition to the above-described layer information and viewpoint information in the design data A stored in the external storage device 24, and such default setting information of three-dimensional display (hereinafter, appropriately referred to as three-dimensional display setting information) is used for design.

It is to be noted that three-dimensional display setting information A stored in such the design data A is effective only for the design data A.

In such three-dimensional display setting information, either storing different setting by each design data or storing setting information equivalent to shared setting can be selected.

Herein, although three-dimensional display setting information is not stored in design data B and design data C shown in FIG. 18 above, shared three-dimensional display setting information D, which is stored in the data of shared setting, is allocated to data in which the three-dimensional display setting information is not stored, and design data is adapted to be three-dimensionally displayed on the basis of the three-dimensional display design information D.

As described above, according to the three-dimensional electrical design apparatus 10 by the present invention, the three-dimensional display setting information is stored to each design data, so three-dimensional display setting used for editing is can be stored by each design data, and the saved three-dimensional display setting is stored in each design data even if editing is ended.

Therefore, when three-dimensional display setting is stored in the design data in advance as in the design data A, the design data is three-dimensionally displayed based on the contents of the stored three-dimensional display setting at the time when design is restarted.

Further, even in the case where the three-dimensional display setting information is not stored in the design data, the design data is adapted to be three-dimensionally displayed based on the three-dimensional display setting information stored in the shared setting shown in FIG. 18.

By the function, in the case where design is performed while setting the dimension of the substrate in height direction to 10 times in three-dimensional display for example, information of the dimension multiplied by 10 times maintained as three-dimensional display setting information that the design data has, so that each time when the design data is switched to the three-dimensional display screen, setting of displaying the dimension in height direction by 10 times is maintained, and there is no need to newly set dimension.

As described above, in performing three-dimensional display, data is configured to be three-dimensionally displayed in the power and dimension based on the once stored three-dimensional display setting to eliminate the need for resetting a three-dimensional display method such as making upper layers of the editing layer transparent display each time when data is opened for restarting design or the like, and it is possible to prevent reduction of design efficiency.

Herein, a function of storing changes to a specific object in the design data will be explained below.

According to the three-dimensional electrical design apparatus 10 by the present invention, it is possible to set a display method only to a specific object different from other objects in performing design in three-dimensional display.

For example, as three-dimensional display setting, setting of transparent display to interlayer objects is possible.

This case is setting of displaying all objects that exist between layers in a transparent manner, and for example, executing setting of regular display only to a certain specific interlayer object such as an interlayer via makes it possible to designate only a certain object to perform specific setting.

Figure 19:
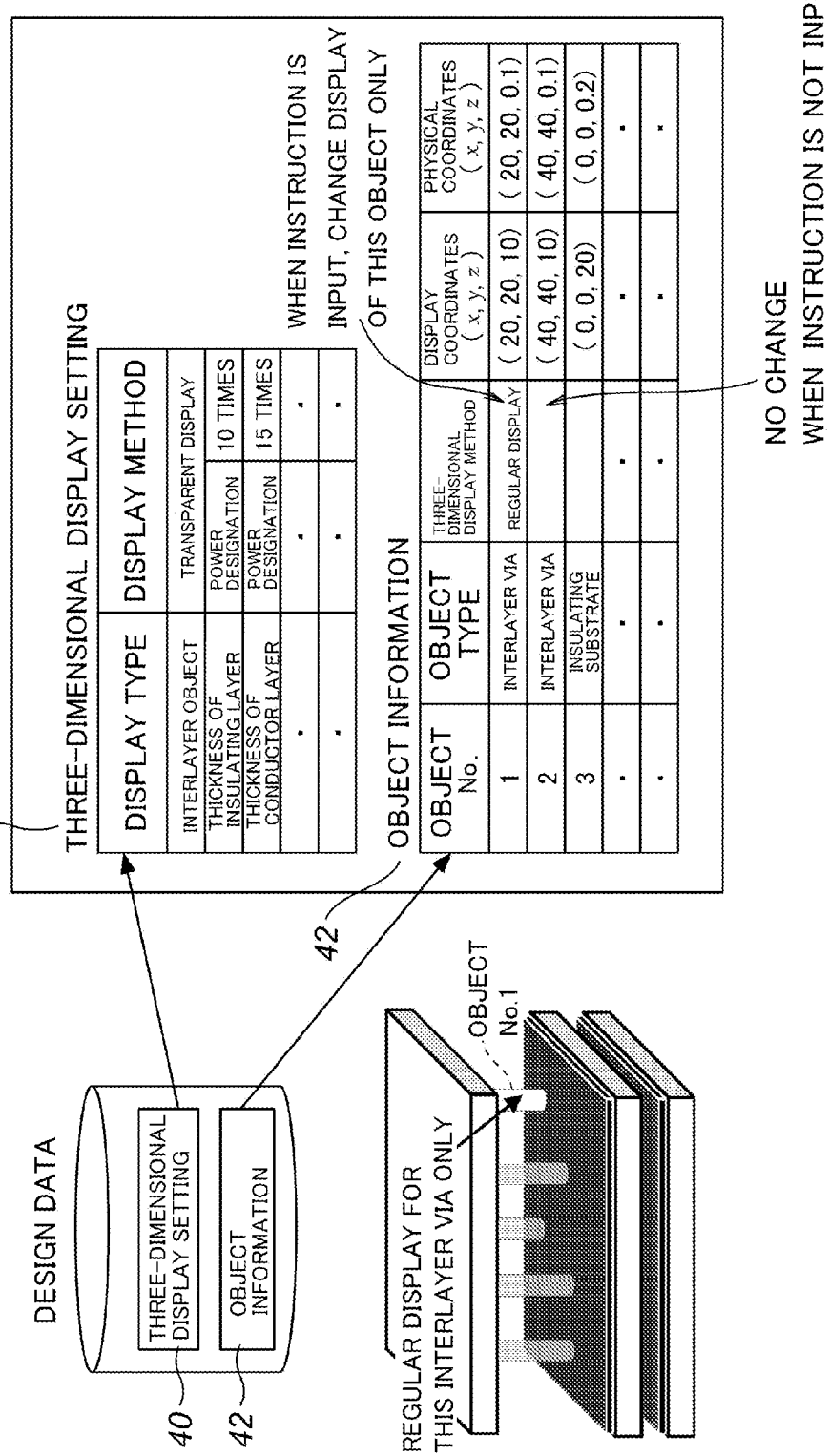
FIG. 19 is an explanatory view showing an example of three-dimensional display setting information and object information stored in the design data.

Furthermore, explanation is made in detail referring to FIG. 19, in which FIG. 19 shows an example of three-dimensional display setting information and object information stored in the design data.

As three-dimensional display setting information 40, display methods are set to the interlayer object, the thickness of the insulating layer, the thickness of the conductor layer or the like.

Herein, all interlayer objects are set to be displayed in transparent display.

Herein, in the case where the designer selects a certain specific object and designates a three-dimensional display method, three-dimensional display setting information of the designated object is stored in object information 42 in the design data shown in FIG. 19.

More particularly, information of each object is stored in the object information 42 shown in FIG. 19, in which information of object number, object type, three-dimensional display method, display coordinates and physical coordinates is stored.

Normally, as stored in the three-dimensional display setting 40, a display method of interlayer objects is set to display all objects in transparent display collectively, and herein, by changing the object information 42, it becomes possible to change a display method of a specific object.

For example, as the three-dimensional display method is changed from transparent display to regular display to the interlayer via having object No. 1, a three-dimensional display method designated only to the interlayer via is set into the object information 42, and a column for the three-dimensional display method becomes regular display.

Further, objects No. 2 and No. 3 is an object to which the designer did not make designation of a three-dimensional display method. Regarding the objects to which no designation was made, a display method is not stored in the column for the three-dimensional display method of the object information 42, which indicates that there was no designation of a display method.

In the three-dimensional electrical design apparatus 10 by the present invention, an object, for which a display method is stored in the column for the three-dimensional display method in the object information 42 shown in FIG. 19, is three-dimensionally displayed by a display classification (display method) described in the three-dimensional display method, and an object, for which a display method is not stored in the column for the three-dimensional display method in the object information 42, is three-dimensionally displayed on the basis of information stored as three-dimensional display setting.

Specifically, in FIG. 19, only the interlayer via having object No. 1 is in regular display, and other interlayer objects are displayed in a transparent manner according to the three-dimensional display setting 40.

By the function explained above, the three-dimensional electrical design apparatus 10 by the present invention is capable of displaying only a specific object by a different three-dimensional display method.

Further, even in the case of setting a display method to the above-described specific object, object information is stored in the design data similarly to the three-dimensional display setting information, even in the case where editing of design data is temporarily ended and data is read out again for editing, stored contents is reflected and the specific object is adapted to be displayed in the same state as in the previous editing.

Next, a function of storing changes of the height of a layer in the design data will be explained below referring to FIG. 20.

In the three-dimensional electrical design apparatus 10 by the present invention, in the case where the designer manually varies to set a display position of an object such as a gap between layers which constitute the electronic substrate, the display positions after change is stored in the design data as described above, so that it is possible to display the object in the same state in performing the next editing.

Figure 20:
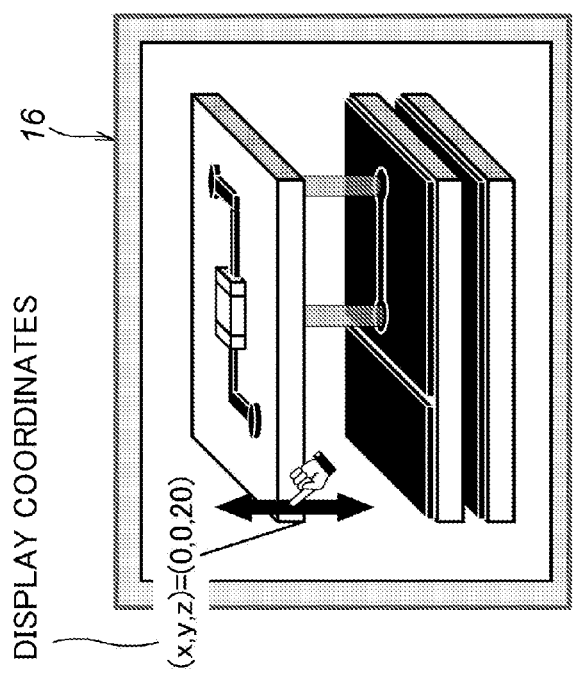
FIG. 20 is an explanatory view showing an example of object information in three-dimensional display.

To realize such a function, in the three-dimensional electrical design apparatus 10 by the present invention, coordinates for display use are stored separately from the physical coordinates of object information shown in FIG. 20.

Now, in the three-dimensional electrical design apparatus 10 by the present invention, coordinates for display use, which are set by adjusting space between layers through creating a gap to make an image easily be seen on the display screen 16, are stored as display coordinates, and physical coordinates to which no changed is made, that is, coordinates in the state where each layer is adhered with no gap in height direction and the state where dimension in height direction is in the full scale are stored as physical coordinates.

More particularly, as shown in FIG. 20, in the case where the designer vertically moves an insulating layer (insulating substrate) using the mouse 18 or the like on the display screen 16, changes of display coordinates of the layer are reflected in the object information 42 shown in FIG. 20.

Herein, in the object information 42 of FIG. 20, display coordinates of the insulating substrate having object No. 3 are changed and stored as (x,y,z)=(0, 0, 20).

Specifically, since new display coordinates are stored in the object information 42 and coordinate values after movement are stored in the design data, the insulating layer is displayed at the moved position in starting the next editing as well.

The above is the storing method of design data of the three-dimensional electrical design apparatus 10 by the present invention.

Because the method has the above-described function, it is possible to perform three-dimensional display on power and dimension based on the three-dimensional display setting, which was stored once in the previous designing, in performing three-dimensional display, so that it is not necessary to reset to the previous state each time when data is opened, and it is possible to prevent reduction in design efficiency.

(2-4) Setting Method of Three-dimensional Default Setting

Next, referring to FIG. 21 to FIG. 22, the default setting of three-dimensional display (three-dimensional display setting) will be explained.

Default setting contents of three-dimensional display in three-dimensional design can be changed or displayed on the screen. In the case of changing or displaying the default setting contents of three-dimensional display, as a default setting icon 16a displayed on the lower right of the display screen 16 shown in FIG. 21(a) is clicked, a default setting screen 44 shown in FIG. 21(b) is displayed.

Herein, various settings will be explained referring to the default setting screen 44 shown in FIG. 21(b).

A part of a default setting screen is displayed on the default setting screen 44 shown in FIG. 21(b), in which setting about default dimension in height direction and default display in selecting an editing layer can be performed.

Herein, regarding default dimension in height direction 44a, it is possible to set the thickness of an insulating layer, the thickness of a conductor layer, a gap between insulating layers, and the height of objects (height of component, etc.), and herein, it is assumed that setting is performed so as to display the thickness of the insulating layer in 10 times the full scale, the thickness of the conductor layer in 15 times the full scale, a gap between insulating layers in 2 mm, and the height of objects such as other components in the full scale.

Then, in performing three-dimensional display, dimension in height direction is calculated and displayed based on the above-described setting.

Now, in the case of displaying the conductor layer or the like flat, 0 mm is designated in designating a dimension.

Further, in the setting of a default display 44b in selecting editing layer shown in FIG. 21(b), in selecting an edit layer (the conductor layer 2 of an inner layer for example), how an upper layer of the selected layer (herein, the conductor layer 1 on the top layer) or an interlayer object arranged extending across a plurality of layers (such as interlayer via, for example) should be three-dimensionally displayed can be designated.

On the other hand, in the case where the conductor layer 2 is set as a target layer, and in the case where transparent display is selected as display of layers higher than the editing layer in the setting of the default display 44b in selecting an editing layer of FIG. 21(b), the conductor layer 1 and the insulating layer 1 which are upper layers of the conductor layer 2 are displayed in a transparent manner in performing editing.

Further, in the case where the conductor layer 3 is set as a target layer, the conductor layer 1, the insulating layer 1, the conductor layer 2 and the insulating layer 2 which are upper layers of the conductor layer 3 are displayed in a transparent manner at the time of editing.

In the case where regular display is selected as display of layers above the editing layer, upper layers are in regular display as shown in FIG. 15(b). Further, in the case where hidden is selected as display of layers above the editing layer, the external shape of the upper layers is displayed in a dashed line as shown in FIG. 16(c).

Next, out of the default display 44b in selecting an editing layer, setting of "automatically vertically move higher layers than editing layer" will be explained. Setting of the "automatically vertically move higher layers than editing layer" item is setting effective only when regular display is selected for display of layers higher than the editing layer. As explained above, when the layer to be edited is selected, layers positioned at a higher layer than the target layer automatically vertically move, and the target layer is displayed in a visually checkable state without being hidden by the upper layers.

Further, in the setting of display of interlayer objects (such as interlayer via), an object formed extending across a plurality of layers such as an interlayer via is displayed in a transparent manner in the case where transparent display is set.

Then, by displaying the interlayer object in a transparent manner, it also becomes possible to check from which layer to which layer the interlayer via is formed.

Further, in the case where regular display is selected as the setting of display of the interlayer object (such as interlayer via), the interlayer via or the like is in regular display, and the interlayer via or the like is not displayed in the case where hidden is selected.

Further, regarding the default setting of three-dimensional display 44, as setting contents different from the above, the thickness of the insulating layer can be set as the setting of "other displays".

Herein, by checking the check column of the item "set thickness of insulating layers to character height or more" described in the item of other displays and turning the setting to ON, it becomes possible to automatically correct the minimum dimension of the thickness of the insulating layer to character height, by which displaying characters indicating the thickness and material of the insulating layer without being overlapped with adjacent layers is made possible.

Figure 22A:
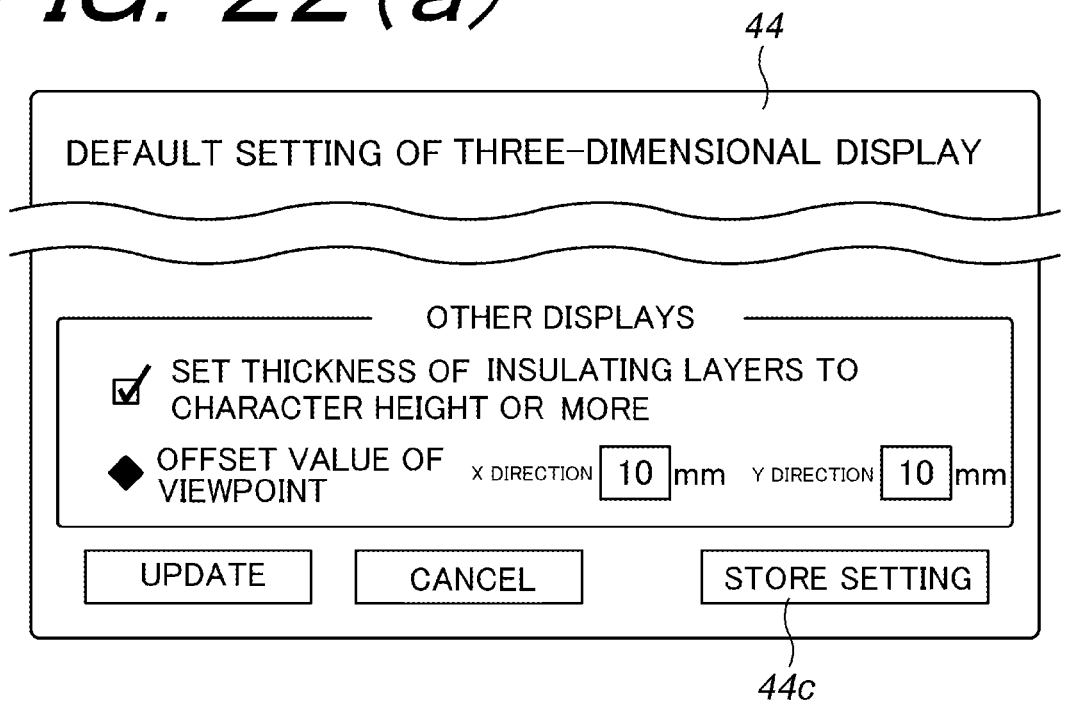
FIG. 22(*a*) and (*b*) are views for explaining a default setting of three-dimensional display.
Figure 22B:
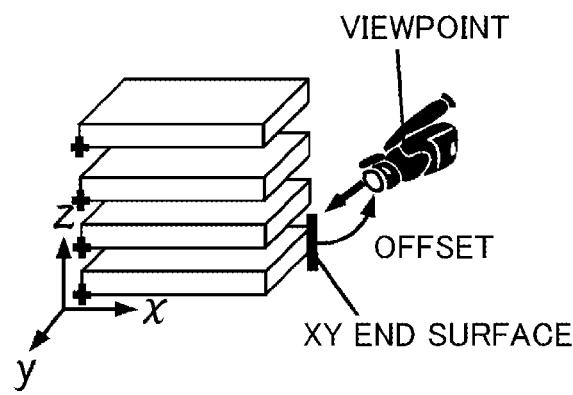

Further, as the setting of "offset value of viewpoint", it is adapted that an offset value used in switching from two-dimensional display to three-dimensional display explained in FIGS. 12(a) and (b), that is, a value for setting how far the position of the viewpoint of the camera 30 shown in FIG. 22(b) should be arranged from the XY end surface of an object being edited, can be set.

Herein, it is possible to fill specific numerical values for X direction and Y direction respectively.

As explained above, in the default setting of three-dimensional display, by performing setting of various types of design data and clicking a setting saving button 44c arranged on the lower right of a default setting screen 44 of three-dimensional display of FIG. 21(*a*) and FIG. 22(*a*), it becomes possible to store a different setting by each design data.

Design data which was set and saved by clicking the setting saving button 44c is reflected in starting the next editing, and is three-dimensionally displayed based on the saved setting.

Herein, referring to the flowchart shown in FIG. 23, a processing procedure in actually performing processing regarding three-dimensional display to which the above-described various settings were conducted will be explained.

It is to be noted that a processing flow regarding the three-dimensional display to which the above-described various settings were conducted should be appropriately referred to as the processing flow of three-dimensional display hereinafter.

First, in step S2302, as an operation of designating design data to be edited on the design screen by the designer is performed, the processing flow of three-dimensional display is started.

Next, in step S2304, processing of reading design data including the default setting information and the layer information of three-dimensional display stored in the design data and displaying the design data on the design screen is performed.

Herein, the design data is three-dimensionally displayed on the display screen 16 in the state where the default setting information and the layer information of three-dimensional display stored in the selected design data are reflected on three-dimensional display.

Next, in step S2306, judgment processing whether or not the default setting information of three-dimensional display is not stored in the design data is performed.

Herein, processing of checking the presence of the default setting information of three-dimensional display is performed to the selected design data by the designer.

Now, herein, in the case where the default setting information of three-dimensional display is stored in the design data and processing is judged as No in the judgment processing, procedure proceeds to step S2310.

On the other hand, in the case where the default setting information of three-dimensional display is not stored in the design data and processing is judged as Yes in the judgment processing, procedure proceeds to step S2308.

Then, in step S2308, processing of reading shared default setting information of three-dimensional display is performed.

Herein, since it was judged in step S2306 that the default setting of three-dimensional display was not stored in the design data selected by the designer, processing of reading out default setting of three-dimensional display common to the design data from the external storage device 24 and determining a three-dimensional display method is performed in step S2308.

Next, in step S2310, as the designer performs an operation of double clicking the wheel button or clicking the camera icon (switching operation from 2D display to 3D display) in the state of 2D display, processing of three-dimensionally displaying design data based on the default setting of three-dimensional display is performed in step S2312.

Herein, processing of switching two-dimensionally displayed design data into three-dimensional display is performed, in which the design data is three-dimensionally displayed on the basis of the information of the default setting of three-dimensional display detected above.

Next, in step S2314, an editing layer for which "editing layer" in "layer information" is ON is detected.

Herein, which layer out of the multilayer substrate of design data is a target layer is detected.

Next, in the judgment processing in step S2316, judgment processing whether or not the editing layer is the top layer is performed.

Herein, the case where the editing layer is the top layer is judged as Yes, and procedure proceeds to the judgment processing of step S2322. Herein, if the editing layer is not the top layer, it is judged as No in the judgment processing of step S2316, and procedure proceeds to step S2318.

Then, in step S2318, judgment processing whether or not the setting for "display of layers higher than the editing layer" of "default setting of three-dimensional display" is "regular display" and the setting for "automatically vertically move higher layers than the editing layer" of "default setting of three-dimensional display" is "ON" is performed.

Herein, processing of determining how the design data is displayed based on the information of the default setting of three-dimensional display is performed.

In the case where the setting for display of layers higher than the editing layer is regular display and "automatically vertically move higher layers than the editing layer" is ON, it is judged as Yes, and procedure proceeds to step S2320.

On the other hand, in the judgment processing of the step S2318, in the case where setting other than regular display is selected as the setting for display of layers higher than the editing layer and the column for "automatically vertically move higher layers than the editing layer" is not ON, it is judged as No, and procedure proceeds to step S2324.

Specifically, in the case where judgment is made as Yes in step S2318, procedure proceeds to step S2320, and processing of moving layers positioned higher than the editing layer upward to a position at which the editing layer can be visually observed is performed.

Herein, since upper layers of the target layer are set to make regular display without displaying in a transparent manner and vertical movement is ON, in the case where target layer is displayed hidden by the upper layer, it is detected that display should be made as shown in FIG. 17(*a*).

On the other hand, in the case where judgment is made as No in step S2318, procedure proceeds to step S2324, and judgment processing whether or not the setting for display of layers higher than the editing layer is transparent display is performed.

Then, when the setting is transparent display, it is judged as Yes, and processing of displaying layers positioned higher than the editing layer in a transparent manner is performed in step S2326.

Further, in the case where judgment is made as No in the judgment processing of step S2324, procedure proceeds to step 32328, and processing of making layers positioned higher than the editing layer hidden is performed.

Next, as either one of the above-described processing ends, each procedure proceeds to the judgment processing of step S2322.

Further, in step S2322, processing of judging whether or not design should be ended is performed.

Herein, in the case where design is continued, it is judged as No, and procedure proceeds to step S2310.

On the other hand, in the case where design is ended, it is judged as Yes, and processing ends.

The various functions of three-dimensional display explained above make it possible to efficiently perform electrical design on three-dimensional space.

As explained above, in the case of full-scale displaying the electronic substrate on the three-dimensional display screen, the thickness of the electronic substrate was displayed extremely thin into a thin shape having little thickness as shown in FIG. 15(a), the thickness of each layer could not be expressed in height direction and layers were difficult to be discriminated, so that design on three-dimensional space was difficult.

However, in the three-dimensional electrical design apparatus 10 by the present invention, as explained above, the electrical design on three-dimensional space as displayed in FIG. 15(b) is realized by including the display function specific to electrical design in which dimension in height direction is multiplied.

Further, by setting on the default setting screen of three-dimensional display, displaying the target layer without being hidden is made possible by vertically moving edit layers above the target layer, and by including the function which allows the target layer to be displayed in a visually checkable state by displaying layers above the target layer in a transparent manner, editing of the electrical design data of three-dimensional display is made more efficient.

Now, in order to realize electrical design on three-dimensional space, the negative effects explained above occur only by simply three-dimensionally displaying the electrical design data, and performing electrical design becomes difficult. In the three-dimensional electrical design apparatus 10 by the present invention, by including the switching function of two-dimensional display and three-dimensional display specific to electrical design and the three-dimensional display function specific to electrical design explained above, the negative effects are avoided to make it possible to perform efficient electrical design on three-dimensional space.

By the function used in three-dimensional display shown above, design regarding a component-embedded substrate or electrical design of three-dimensional display for differential wiring (described later) can be performed while visually checking, which is a necessary function in order to improve design efficiency.

(3) Technology Setting on Three-dimensional Electrical Design Data (3-1) Technology Setting Method Next, an electrical design function in the three-dimensional electrical design apparatus 10 by the present invention will be explained.

First, technology information indicates design information which is mainly made up of design specification such as a layer constitution or a structure in height direction of an electronic substrate or a semiconductor package, a thickness of each layer and each substrate of the electronic substrate, a size and a shape of land, resist, via, hole diameter and the like which are components used in performing electrical design, width of wiring patterns, clearance between components, wiring patterns and vias, and each substrate attribute such as negative, positive, and negative/positive.

Figure 24:
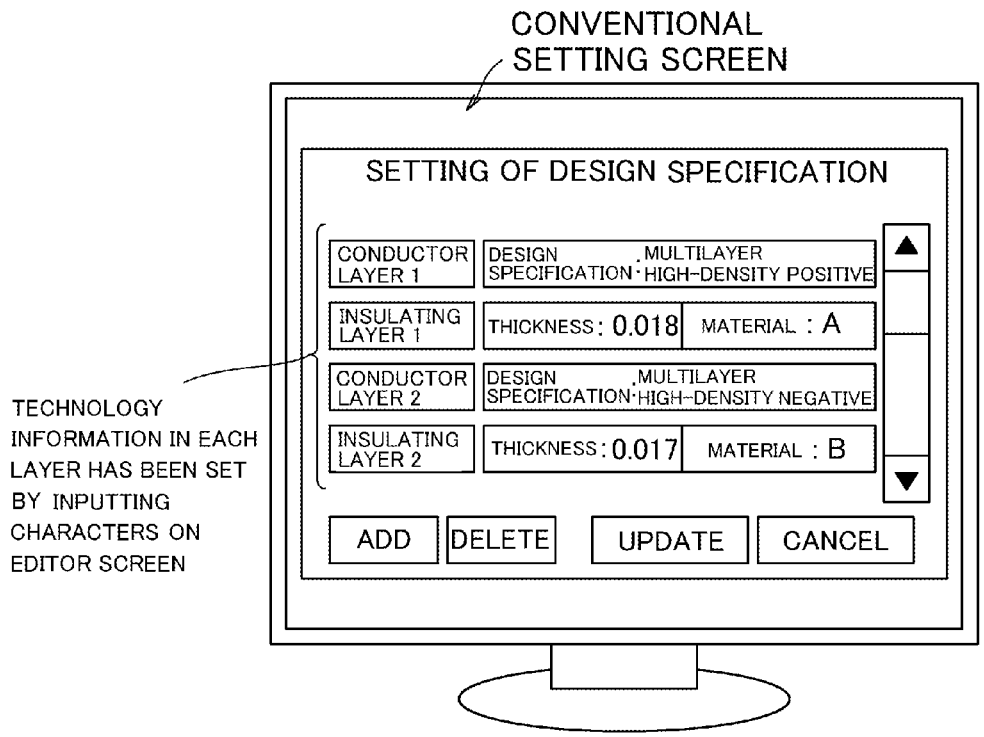
FIG. 24 is a view showing a setting screen in setting technology information in a conventional two-dimensional electrical design CAD.

Conventionally, in the case of setting technology information by a two-dimensional electrical design CAD, an editor screen as shown in a conventional setting screen of FIG. 24 has been displayed and technology information has been set by character information.

On the other hand, in the three-dimensional electrical design apparatus 10 by the present invention, setting of technology information is easier because the design data of three-dimensional shape itself displayed on the screen is used as a technology editor.

An example of the technology editor will be explained below. First, a method will be explained in which technology information is set by visualizing design information in height direction such that the information can be instantly checked on the design screen.

FIG. 25 shows a display example in setting technology information by the three-dimensional electrical design apparatus 10 by the present invention.

Figure 25A:
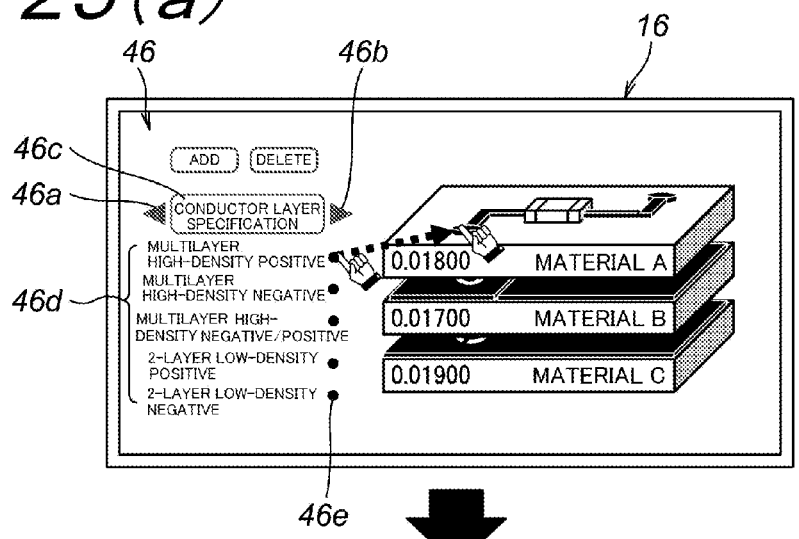
FIGS. 25(*a*)(*b*)(*c*) are views showing display examples in setting the technology information of the three-dimensional electrical design apparatus by the present invention.

In this embodiment, in the case where specification of the conductor layer is set as the setting of technology information in three-dimensional display, a technology information setting display 46 displayed on the left side of a three-dimensionally displayed electronic substrate is displayed in the display screen 16 as shown in the design screen of FIG. 25(a).

Now, in the technology information setting display 46, by selecting an object three-dimensionally displayed on the right side of the display screen 16 by the mouse 18, the technology information setting display 46 is displayed on the left side of on the display screen 16.

In the example of FIG. 25(a), specification of the conductor layer is displayed.

Now, FIGS. 25(a)(b)(c) show displays for setting conductor layer specification as the technology information setting display 46, but it goes without saying that the display is not limited to them, and technology information different from the conductor layer specification can be set as well.

As described above, in addition to selecting an object on three-dimensional display displayed on the right side of the display screen 16 by the mouse 18, it is possible to select various types of technology information (such as clearance between wiring patterns) other than the conductor layer specification by pushing arrows 46a, 46b of the technology information setting display 46. Then, a type name of selected technology information is displayed on a setting target 46c.

Then, as shown in FIG. 25(a), specification selection items 46d are displayed in a lower area of the technology information setting display 46.

A plurality of specifications is displayed in the specification selection items 46d. Therefore, the designer selects a desired specification from a plurality of usage, and selects an object to which he/she desired to associate with a mark 46e shown on the right side of the specification by using the mouse 18 on three-dimensional display.

Figure 25B:
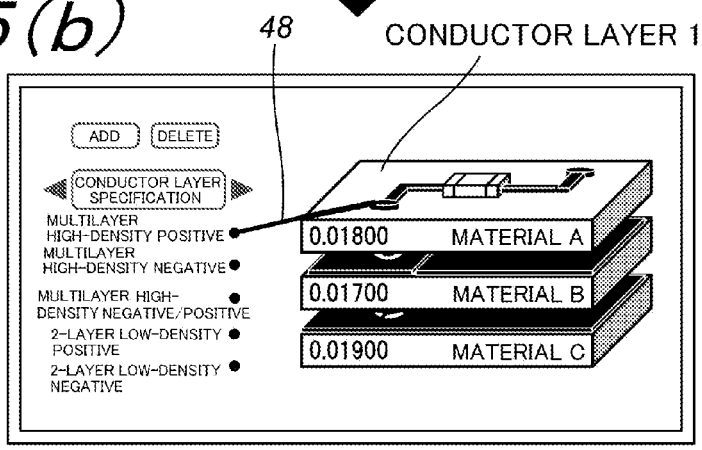

Specifically, as shown in FIG. 25(b), the specification and the object are connected by a line indicated by numerical character 48.

Herein, the figure shows that multilayer high-density positive in the conductor layer specification and the object of the three-dimensionally displayed conductor layer 1 are selected and conductor layer specification of the conductor layer 1 is set as multilayer high-density positive.

After setting, the conductor layer specification and three-dimensionally displayed conductor layer are connected by the line as shown in FIG. 25(b), so that specification set to the conductor layer can be instantly checked while performing three-dimensional design.

Figure 25C:
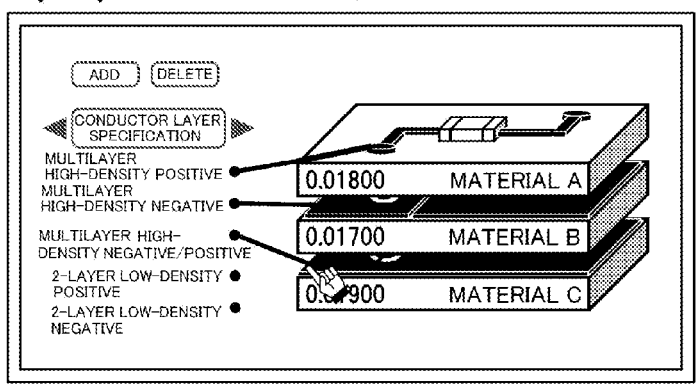

Further, FIG. 25(c) shows that the conductor layer specification is also set to the conductor layer 2 and the conductor layer 3 of inner layer in addition to the conductor layer 1.

As described above, in technology setting, design specification can be easily set on the three-dimensional design screen.

Further, in technology setting, a layer constitution of the electronic substrate being designed can be easily set, which will be explained below.

Next, FIG. 26 shows a view for explaining a method of changing the layer constitution of the electronic substrate. Further herein, an example of adding a layer to the three-dimensional display shown in FIG. 26 will be explained.

Now, as the constitution of the electronic substrate, it is constituted such that an insulating layer is provided between a conductor layer and a conductor layer.

In the three-dimensional electrical design apparatus 10 by the present invention, the conductor layer and the insulating layer are displayed and handled after the layers are grouped, its details will be described later.

Figure 26A:
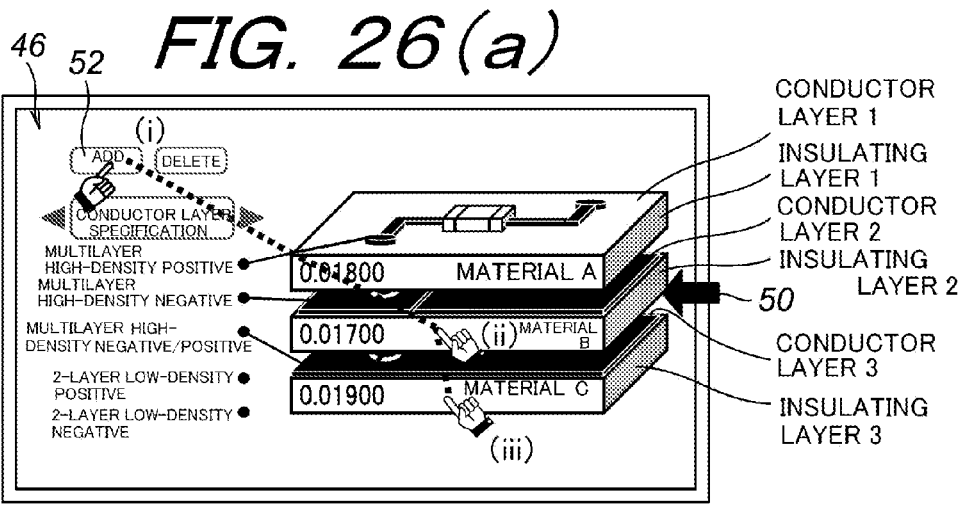
FIGS. 26(*a*)(*b*)(*c*) are views showing display examples in setting the technology information of the three-dimensional electrical design apparatus by the present invention.

For example, in the case of adding a layer at the position of an arrow 50 shown between the insulating layer 2 and the conductor layer 3 of the three-dimensional display of FIG. 26, an add button 52 in the technology information setting display 46 is clicked by using the mouse 18 first (refer to (i) shown in FIG. 26(a)). After that, the insulating layer 2 is clicked (refer to (ii) shown in FIG. 26(a)), and then the insulating layer 3 is clicked (refer to (iii) shown in FIG. 26(a)).

Such an operation means adding a layer between the target clicked in (ii) and the target clicked in (iii).

Specifically, by performing the above-described operation of continuously clicking in the order of (i)→(ii)→(iii), a new conductor layer and a new insulating layer are inserted as shown in FIG. 26 (b).

Then, after clicking the add button 52 of the layer, by continuously clicking layers that exist above and below the position to which a layer needs to be added in three-dimensional display, it is possible to detect that a layer is added between the clicked layers.

Figure 26B:
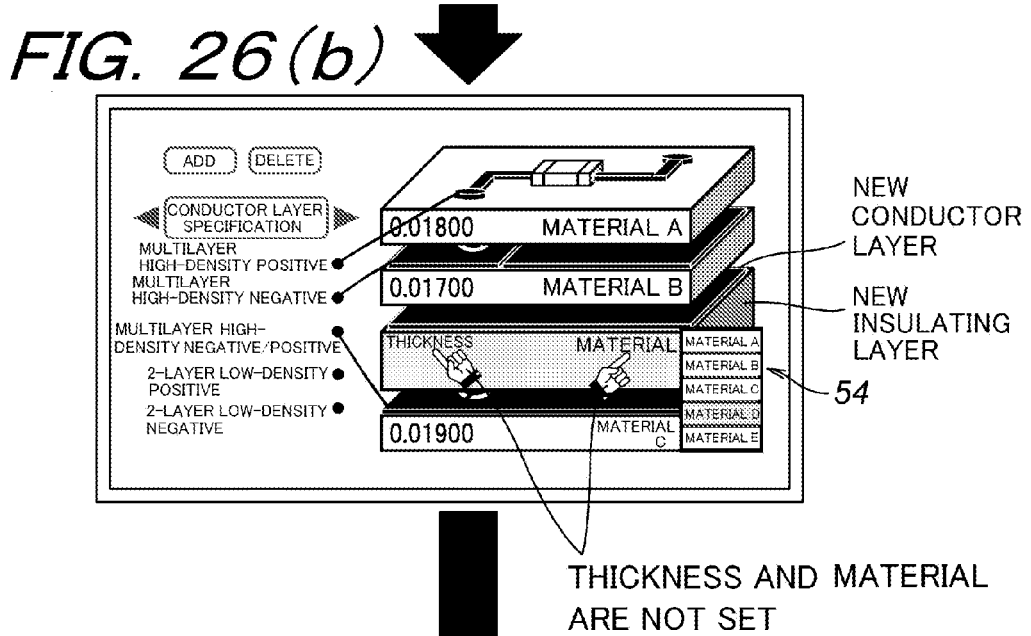

Further, the layer added as described above is in a state where design information such as the thickness or the material of the insulating layer is not set as shown in FIG. 26(b).

In such a case as well, design information of the insulating layer is settable by the above-described technology information setting on the design data of three-dimensional display according to the three-dimensional electrical design apparatus 10 without displaying an editor screen on which conventional character information is described.

As a setting method of the design information of the newly added insulating layer, in the case of setting the thickness of the insulating layer, a cursor is displayed as an area of the insulating layer, which displays "thickness", is selected by the mouse 18, and it becomes possible to input a numerical value from the keyboard 22 (herein, input as 0.01600 for example). Further, in the case of setting the material of the insulating layer, a material menu 54 is displayed as an area displaying "material" is selected by the mouse 18, so that a material can be selected from the material menu 54 (herein, material D is selected for example).

Figure 26C:
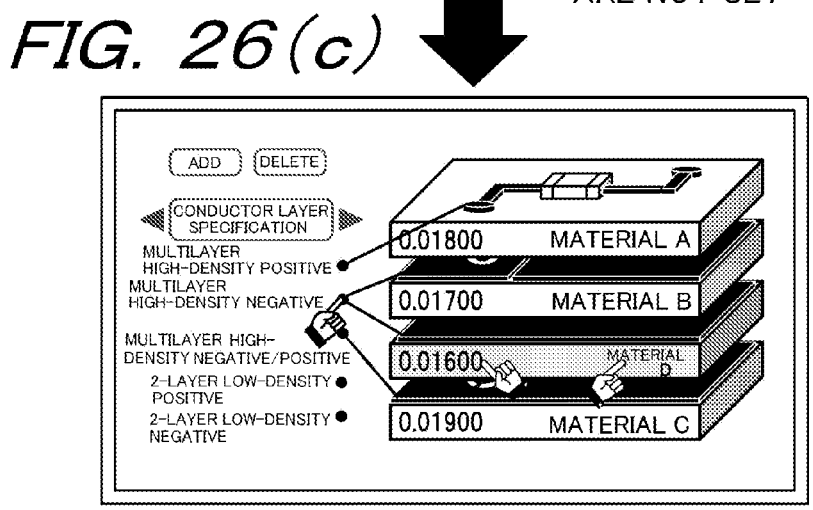

By the above-described operation, the added insulating layer was in the state where the thickness and the material were not set as shown in FIG. 26(b), but three-dimensional display of the insulating layer is changed by changing various settings on three-dimensional display, as shown in FIG. 26(c).

FIG. 26(c) shows the state where the thickness of the added insulating layer is set to 0.01600 and the material is set to material D. By furthermore performing setting of the conductor layer specification explained in FIG. 25, a conductor layer which was added together with the added insulating layer can be set to "multilayer high-density negative".

Further, physical shape information that the insulating layer has is also changed in real-time to the set thickness. Specifically, both conditions which are the set thickness of the insulating layer=0.016 and power 10 times being the default setting are reflected, and displayed in the state of "insulating layer thickness 0.016×power 10 times".

(3-2) Grouping of Conductor Layer and Insulating Layer

As described above, the conductor layer and the insulating layer are grouped in FIGS. 26(a)(b)(c), and are displayed as 1 set without a gap between the conductor layer and the insulating layer.

This derives from the fact that the electronic substrate is manufactured by forming conductor being the conductor layer on the surface of an insulating substrate being the insulating layer.

Since it is necessary to perform design that space between the conductor layer and the conductor layer is always insulated by the insulating layer, on which surface of insulating layer a conductor pattern should be formed can be grasped when the conductor layer and the insulating layer are grouped in 1 set, and a design error such that there is no insulating substrate on which a conductor pattern is formed can be reduced. Therefore, in the three-dimensional electrical design apparatus 10 by the present invention, the conductor layer and the insulating layer should be displayed in a grouped state.

For example, as shown in FIG. 27, design is performed such that two layers of the conductor layer 1 and the insulating layer 1 make 1 set, two layers of the conductor layer 2 and the insulating layer 2 make 1 set, and the insulating layer 3 is grouped by two layers, which are the conductor layer 3 above and the conductor layer 4 below the insulating layer 3, to make 1 set by the 3 layers, and layers are displayed by 3 sets in total.

Space between each set is displayed in the state where the sets are arranged by providing distance designated by the gap between insulating substrates on the default setting screen of in three-dimensional display explained above.

Such an operation method of grouping the conductor layer and the insulating layer into 1 set will be explained referring to FIG. 27.

First, in the case of adding a conductor layer, as the side surface of the conductor layer is right-clicked by the mouse 18, a menu 60 is displayed as shown in FIG. 27(b). Then, as a conductor layer having a desired condition is selected and clicked out of the displayed menu 60, a new layer is added.

FIG. 27(b) shows the state where the side surface of the conductor layer 2 is clicked by the right button of by the mouse 18, and "add copy above" is selected from the displayed menu by the mouse 18. Herein, "add copy above" means that the same conductor layer as the conductor layer 2 and an insulating layer are copied above the selected conductor layer.

By this operation, a new conductor layer 3 and a new insulating layer 3 are added (copied) above the conductor layer 2 as shown in FIG. 27(c).

In this occasion, to secure space for inserting the conductor layer 3 and the insulating layer 3 simultaneously, the conductor layer 1 and the insulating layer 1 automatically move to an upper side and the conductor layer 2 and the insulating layer 2 automatically move to a lower side, and the layers are displayed in the state where the "gap between insulating layers" designated by the default setting of three-dimensional display explained above is secured.

Further, together with the newly added conductor layer, an insulating layer which makes a set with the conductor layer is also copied as the insulating layer 3.

Since design specification (such as the thickness or the material of insulating substrate and conductor layer specification) of the copied conductor layer 3 and the insulating layer 3 is copied in the same design specification as the conductor layer 2 and the insulating layer 2, it will be changed later as needed if a change is necessary.

Now, in the newly copied conductor layer and insulating layer, objects (such as wiring pattern, component, and thermal land) arranged on the layer of a copy source are not copied, but only design specification of the layer is copied and displayed.

Then, in FIG. 27(*b*), "add copy above" was selected in selecting a menu, and in the case where "add copy below" is selected out of the menu for example, a new layer is copied and added on the lower side of the selected layer.

Further, in the case where "add above" or "add below" is selected out of the menu, design specification such as the material is not copied, but only addition of a layer is simply performed in the state where design specification is not set yet, and a new layer is added to the upper side or the lower side of the selected layer.

Figure 28B:
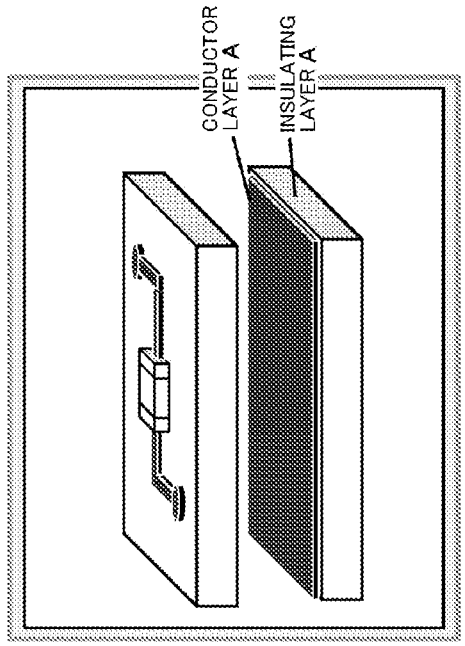
FIGS. 28(*a*)(*b*) are explanatory views explaining a display method of a conductor layer and an insulating layer in performing three-dimensional display.
Figure 28A:
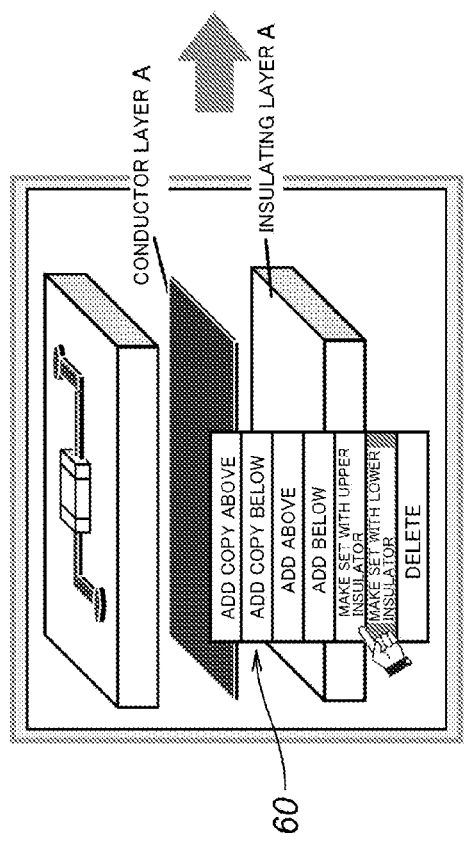

Herein, the example of FIG. 28(*a*) shows a state where a conductor layer A exists singly and does not make a set with the insulating layer.

In such a case, as the conductor layer A is selected out of the displayed menu 60 and "make set with lower insulator" is selected, the conductor layer A is grouped with an insulating layer A on its lower side as shown in FIG. 28(*b*), which are recognized as 1 set and displayed without a gap.

Figure 29A:
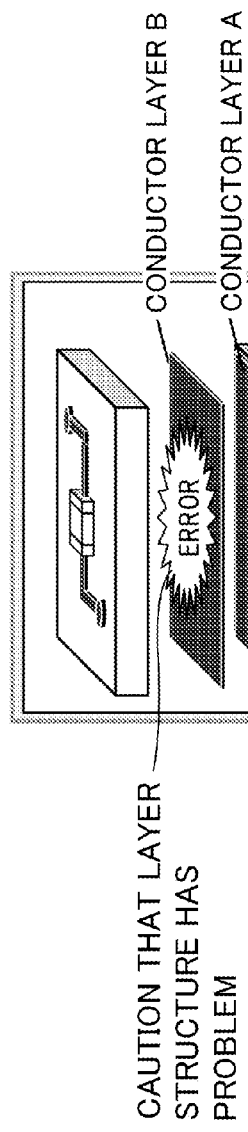
FIG. 29(*a*) is a view showing an example of error display which notifies an error generated in three-dimensional design, and FIG. 29(*b*)(*c*) are views for explain how the cross-section of a multilayer substrate is displayed.
Figure 29B:
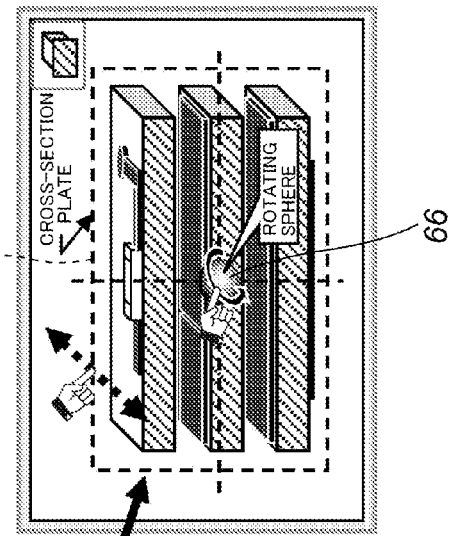
Figure 29C:
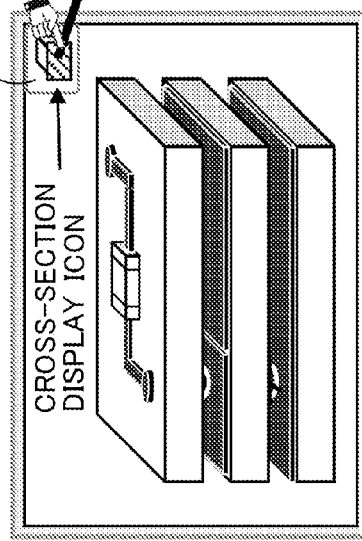

Now, in the case where a design error occurs regarding the setting in the above-described conductor layer and insulating layer, the three-dimensional electrical design apparatus 10 by the present invention is adapted to display an error as shown in FIG. 29(*a*).

In FIG. 29(*a*), the conductor layer A and a conductor layer B are vertically arranged so as to contact directly, and in such a case, the conductor layers are not in an insulated state. Therefore, this apparatus detects that there is a design error and displays "ERROR".

Such a caution makes it possible to find an error on electrical design in advance.

Furthermore, regarding the setting in the above-described conductor layer and insulating layer, in the three-dimensional electrical design apparatus 10 by the present invention, as a cross-section display icon 62 shown on the display screen 16 is clicked as shown in FIGS. 29(*b*) and (*c*), a cross-section plate 64 shown in FIG. 29(*c*) is displayed. Accordingly, a cross-section of a figure of three-dimensional display in the cross-section plate 64 becomes referable. Further, as the cross-section plate 64 is dragged to move by the mouse, a position of a cross-section which needs to be referred can be changed.

Furthermore, as a rotating sphere 66 displayed at the central portion of cross-section plate is rotated by the mouse vertically and horizontally, the cross-section plate 64 rotates and checking a cross-sectional shape cut off at a free angle is made possible.

(3-3) Data Structure of Technology Information

Next, referring to FIG. 30, a data structure of technology information related to technology information setting of three-dimensional display will be explained.

Herein, as described above, the technology information should indicate design information which is mainly made up of design information of design specification such as structure information of a layer constitution or a structure in height direction of an electronic substrate or a semiconductor package, thickness information of each layer and each substrate, size and shape information of land/resist, via, hole diameter and the like which are components used in performing electrical design, width information of wiring patterns, clearance information between components, wiring patterns and vias, and each substrate attribute such as negative, positive, and negative/positive.

In the three-dimensional electrical design apparatus 10 by the present invention, as new design is started, technology information stored in shared setting is read, and the technology information is stored in design data regarding newly performed design to create new design data.

Figure 30A:
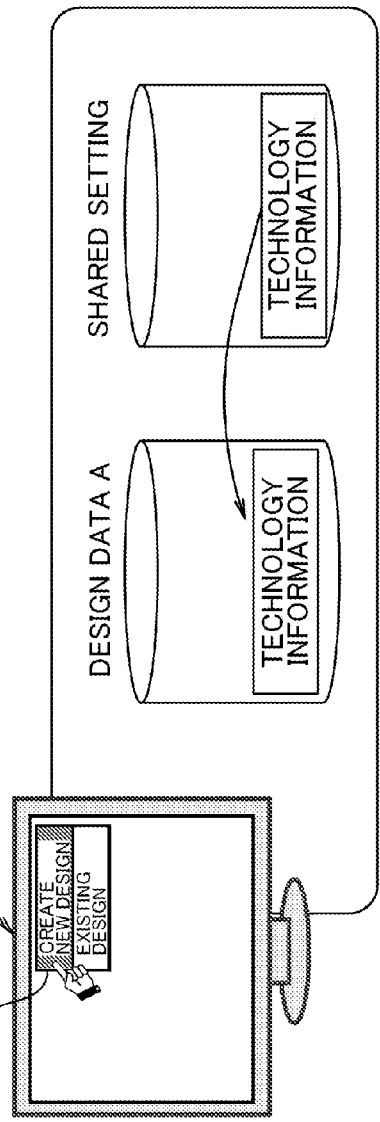
FIGS. 30(*a*)(*b*) are views for explaining a data structure of the technology information of three-dimensional display.
Figure 30B:
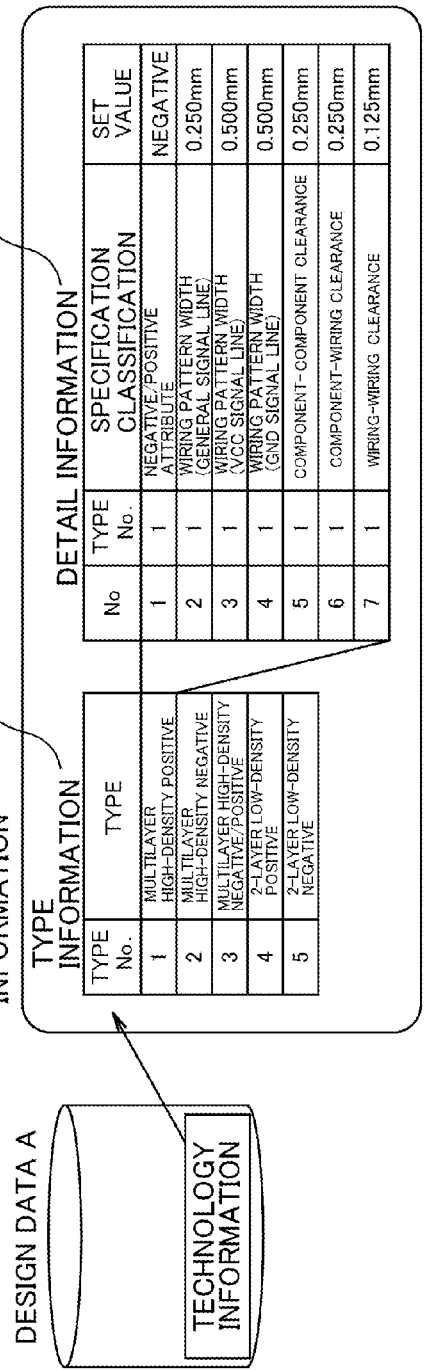

For example, in the example shown in FIG. 30(*a*), a menu 70 is displayed on the display screen 16 in performing "create new". As "new design" is selected out of such a menu 70, data being the design data A is newly created.

Then, the example shows that the technology information is read from data in which shared setting is stored, and the technology information is stored also in the design data A.

The information regarding the design specification explained above is stored in such technology information, and an example of the information will be explained referring to FIG. 30(*b*).

First, as shown in FIG. 30(*b*), type information 72 and detail information 74 of the technology information are stored in the technology information stored in the design data.

Five types which are multilayer high-density positive, multilayer high-density negative, multilayer high-density negative/positive, 2-layer low-density positive and 2-layer low-density negative are stored as type information of the technology information (the five types are merely an example and not limited to the five types) in the technology information stored in the design data A.

Further, information of a set value of wiring pattern width, a set value of clearance or the like is stored as the detail information 74 in the multilayer high-density positive of the type information 72 other than setting that negative/positive attribute is negative.

Then, in FIGS. 25 and 26, an operation of setting the technology information to each layer while displaying the technology information setting display 46 was explained, in which contents of the type information 72 of the technology information explained above is displayed on the technology information setting display 46 displayed on the display screen 16 in the operation (refer to FIG. 31(*a*)).

By performing setting of the technology information on the design screen in this manner, design specification of each layer is set on the basis of the detail information 74 of the technology information.

More particularly, for example, specification such that negative/positive attribute stored in the detail information 74 of the technology information shown in FIG. 31(*b*) is negative or clearance between a component and a component is 0.250 mm is reflected as design specification on all of layers for which multilayer high-density positive was selected in the type information 72.

Therefore, the conductor layer 1 is set to multilayer high-density positive on the design screen in the example of FIG. 31(*a*), so that the specification of the conductor layer 1 is set to a value set in the detail information 74 such that clearance between a component and a component is 0.250 mm.

As explained above, the three-dimensional electrical design apparatus 10 by the present invention is designed to be capable of setting the technology information on the design data of three-dimensional shape, so that setting of the technology information is enabled without performing the screen switching between a conventional setting screen and a display screen for displaying two-dimensionally as shown in FIG. 24.

Further, only information by characters has been displayed on the conventional setting screen, and the design data has also been designed referring to only two-dimensionally displayed design data. So, a mistake of inputting the thickness of the insulating layer as 0.16 instead of 0.016 by a single digit for example was easily overlooked. However, since the three-dimensional electrical design apparatus 10 by the present invention is capable of setting technology information while visually checking by using the design data of three-dimensional shape, it becomes possible to instantly find the mistaking of the thickness of the insulating layer as described above or the like, and it is possible to lighten the design error.

(4) Input Method of Differential Wiring Data

Next, referring to FIG. 32, an example of a differential wiring function making use of a structure in height direction will be explained by using the three-dimensional electrical design apparatus 10 by the present invention which is capable of seamless display switching between two-dimensional display and three-dimensional display and three-dimensional display specific to electrical design.

Figure 32A:
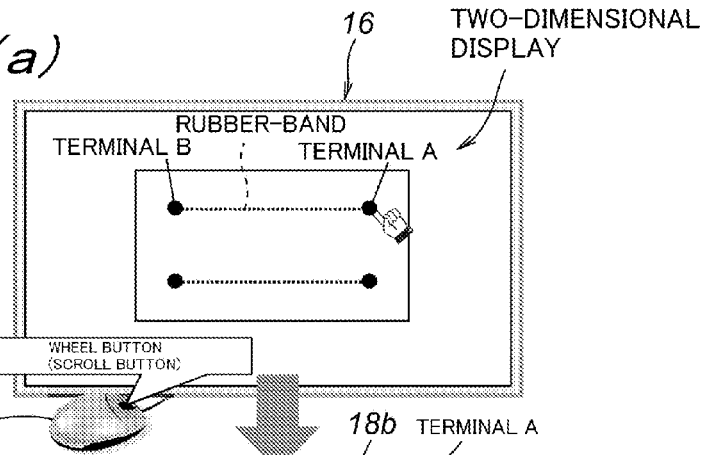
FIGS. 32(*a*)(*b*)(*c*)(*d*) are views for explain a method of wiring differential wiring of the three-dimensional electrical design apparatus by the present invention.

First, as shown in FIG. 32(a), a method will be explained in which two differential wirings are wired extending across two layers from the state where electrical design data is two-dimensionally displayed on the display screen 16.

FIG. 32(a) is the state where design data is two-dimensionally displayed, and when a terminal A and a terminal B are set as terminals used in differential wiring, it is recognized that the terminal A and the terminal B should be electrically connected. However, because the state shown in FIG. 32(a) is an unconnected state, so rubber-band of a dashed line indicating that wire connection between the terminal A and the terminal B is necessary is displayed.

FIG. 32(a) shows the state where wiring is started by clicking to select the terminal A.

Next, as the wheel button 18a of the mouse 18 is double-clicked while moving the mouse 18 in the direction of the terminal B, the design data is seamlessly switched from two-dimensional display to three-dimensional display.

Figure 32B:
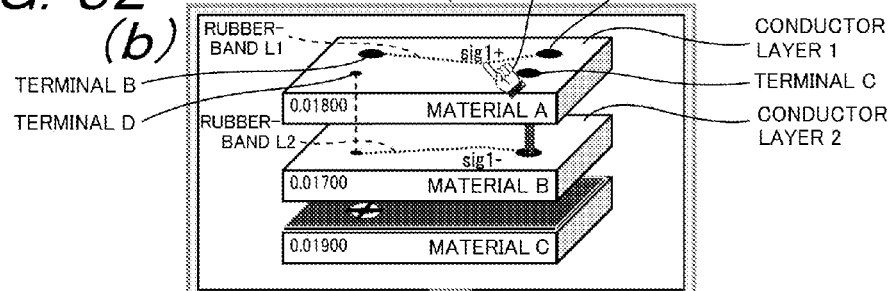

Herein, the three-dimensional display shown in FIG. 32(b) shows the state where rubber-band (L1) is also wired following the movement of a mouse pointer 18b in differential wiring wired between the terminals A-B on the conductor layer 1.

It is to be noted that the rubber-band L1 should have a signal name of "sig1+", and such a signal name should be stored as the design data for each wiring.

Then, regarding the other rubber-band (L2) of differential wirings which should be wired in a pair, the rubber-band L2 which makes a pair with the rubber-band L1 is automatically recognized and wired following the movement of the mouse pointer 18b.

Such a rubber-band L2 should have a signal name of "sig1−".

Next, the three-dimensional electrical design 10 by the present invention is set so as to identify a portion of the above-described signal name from which the end "+" or "−" is removed, that is, the portion of "sig1", rubber-bands in which the "sig1" portion of the signal names is the same are recognized as ones which should be wired in a pair.

Therefore, in the differential wiring, the signal name of the rubber-band L1 and the signal name of the rubber-band L2 are the same, so that it is possible to automatically determine that they are a pair wirings.

Then, as shown in FIGS. 32(b), (c) and (d), it is possible to automatically recognize wirings which make a pair and to execute differential wiring.

Figure 32C:
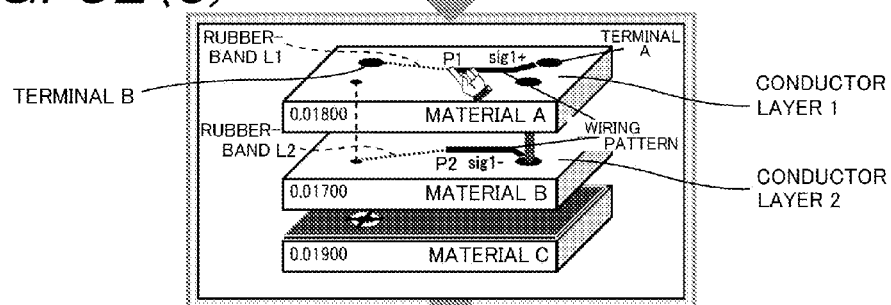

Next, FIG. 32(c) shows the state where a pass point "P1" of wiring pattern is clicked.

As described, as the pass point "P1" of wiring pattern is clicked, a wiring pattern is drawn from the terminal A to P1 in the rubber-band L1. Accordingly, simultaneously the rubber-band L2 is also in the state where the fact that the pass point P1 of the wiring making a pair had been clicked was detected, and wiring from a terminal C to P2 was automatically performed. Then, herein, the rubber-band is displayed between P2 and the terminal B because of no wiring is performed yet.

It is to be noted that the wiring starting from the terminal A is set to be automatically wired at 45 degrees.

Figure 32D:
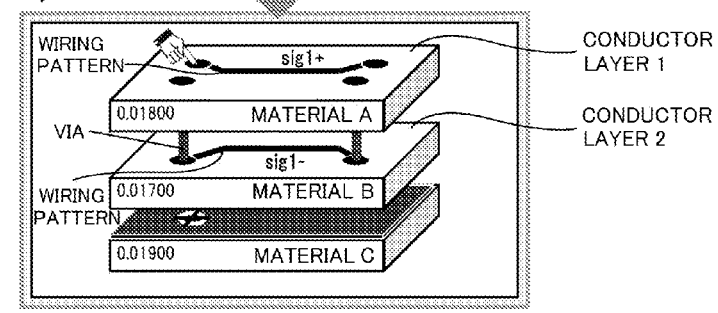

Then, FIG. 32(d) is in the state where confirmation of the wiring is performed by clicking the terminal B after clicking the pass point P1 of the rubber-band L1, and the wiring between the terminals A-B is completed.

Further, simultaneously, in the rubber-band L2 as well, wiring from P2 to the terminal C and generation of vias between the conductor layer 1 and the conductor layer 2 are automatically performed, and wiring between terminals C-D is in a completed state. Then, as wiring is completed as described above, a rubber-band indicating unconnected becomes hidden.

Conventionally, as differentially wired design data is displayed on the two-dimensional electrical design CAD, information such as on which layer wiring is performed and between which layers vias are formed in the multilayer substrate cannot be judged instantly as shown in FIG. 1(b), which was a factor of causing a design error. However, as explained above, the three-dimensional electrical design apparatus 10 by the present invention is capable of performing differential wiring in three-dimensional display, so it becomes possible to lighten the design error.

Specifically, since it is possible to instantly visually check judgment such as on which layer wiring is performed and between which layers vias are formed in the multilayer substrate, by which the design error is lightened.

Furthermore, in differentially wiring in the state of three-dimensional display, connection making a pair automatically recognized and wired, so design efficiency is also improved.

Herein, referring to the flowchart shown in FIG. 33, a processing procedure in actually performing the above-described processing of differential wiring will be explained.

First, in step S3302, as an operation of selecting a single terminal or rubber-band by the designer is performed, a processing flow of differential wiring is started, and procedure proceeds to step S3304.

Next, in step S3304, processing of reading a signal name given to a terminal or a rubber-band selected in step S3302 is performed.

Herein, processing of reading a signal name such as "sig1+" and "sig1−" given to the rubber-band explained in FIG. 32 is performed.

Next, in step S3306, judgment processing whether or not the end of the read signal name is "−(minus)" is performed.

Herein, assuming that the end of the signal name read above is minus, it is judged as Yes in step S3306, and procedure proceeds to step S3308.

Next, in step S3308, processing of finding a differential signal in which the end of the signal name, which is "−", is changed to "+" from design data being edited is performed.

Next, in the judgment processing of step S3310, judgment processing whether or not a differential signal having a different end was detected in step S3308 is performed.

Herein, procedure proceeds to step S3312 on the assumption that a signal of differential pair is judged to exist in step S3310.

Then, in step S3312, processing of starting differential wiring is performed.

Next, in step S3314, processing of displaying differential wiring to end wiring is performed.

Thus, the processing flow of differential wiring ends.

On the other hand, in step S3306, in the case where the end of the read signal name is not "−(minus)", it is judged as No, and procedure proceeds to step S3316.

In step S3316, judgment processing whether or not the end of the read signal name is "+(plus)" is further performed.

Herein, assuming that the end of the read signal name be "+(plus)", it is judged as Yes in step S3316, and procedure proceeds to step S3318.

Further, in step S3318, processing of finding a differential signal in which the end of the signal name, which is "+", is changed to "−" from design data being edited is performed.

Next, in the judgment processing of step S3310, judgment processing whether or not a differential signal having a different end was detected in step S3318 is performed.

Herein, assuming that a signal of differential pair does not exist, it is judged as No in step S3310, procedure proceeds to step S3320.

Then, in step S3320, processing of displaying a message that "No differential wiring" is performed.

Then, the processing flow of differential wiring ends.

Next, in step S3316, processing in the case where the end of the read signal name was not "+(plus))" will be explained. In the judgment processing of step S3316, judgment of No is made, and processing of starting single wiring is performed in step S3322.

Herein, the selected terminal or rubber-band is judged as a single wiring based on a result of judgment that a signal name does not have the reference code of +(plus) or −(minus), and single wiring is performed.

Then, procedure proceeds to step S3324, and processing of displaying wiring to end wiring is performed.

Thus, the processing flow of differential wiring ends.

As explained above, the input processing of differential wiring shown in FIG. 32 is performed on the basis of the processing flow of differential wiring shown in FIG. 33.

Next, using FIG. 34 and FIG. 35, a wiring method of differential wiring in which a plurality of wirings are performed simultaneously will be explained.

High-speed communication through optical fiber or the like is referred to as broad band, and differential wiring used for the broad band has conventionally been wired on the same layer, and an example of differentially wiring 16 buses using a plurality of layers by this apparatus will be explained.

Figure 34A:
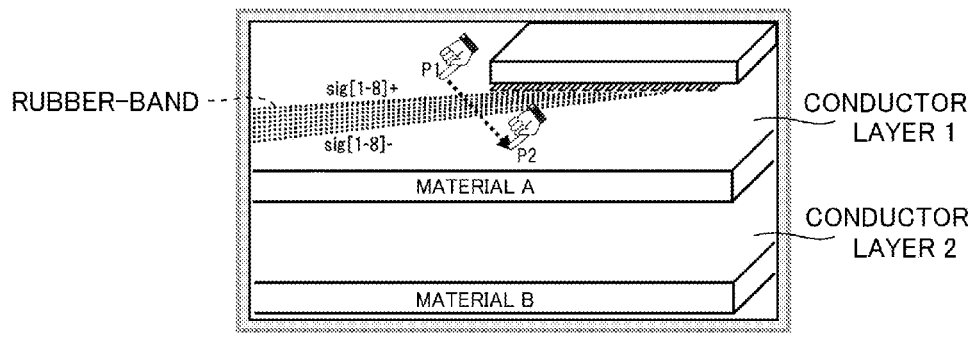
FIGS. 34(*a*)(*b*)(*c*) are views for explaining a method of wiring broad band differential wiring.

FIG. 34(a) shows that rubber-bands are displayed from 16 bus terminals and differential wiring is in an unconnected state.

Herein, signal names of the 16 rubber-band should be "sig1+", "sig2+", "sig3+", "sig4+", "sig5+", "sig6+", "sig7+", "sig8+", and "sig1−", "sig2−", "sig3−", "sig4−", "sig5−", "sig6−", "sig7−" and "sig8−", and the signal names are displayed in a simplified notation of "sig[1-8]+" and "sig[1-8]−".

In the present invention, wirings having the signal name +(plus) and wirings having the signal name −(minus) are displayed in displaying rubber-bands in an unconnected state. As shown in FIG. 34(a), as 2 points of a point P1 and a point P2 are continuously clicked using the mouse 18 so as to cross the rubber-bands, a line segment P1-P2 appears.

Then, it is recognized that a wiring instruction is given to a connection of a region where the line segment P1-P2 crosses the rubber-bands. Furthermore, as the above-described line segment P1-P2 is dragged using the mouse 18, differential wiring of the 16 buses is started with the movement of the mouse, and an instruction of differential wiring start is made with the movement of the mouse 18.

Figure 34B:
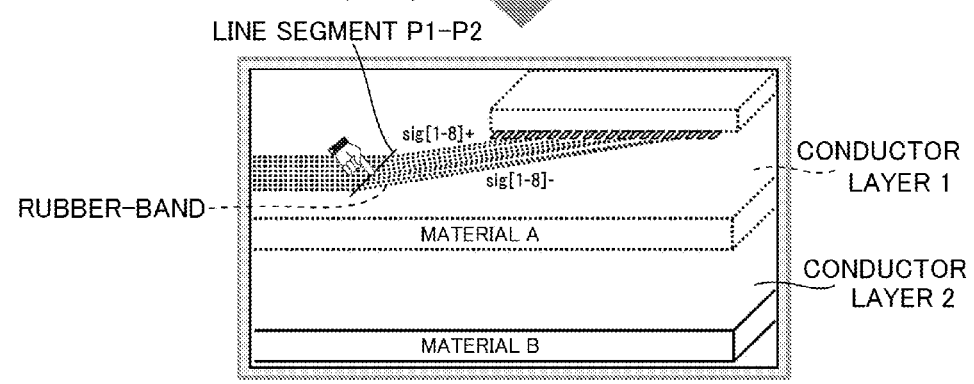

Therefore, FIG. 34(b) shows the state where wiring of the 16 buses is started, and the rubber-bands follow with the movement of the mouse 18.

Figure 34C:
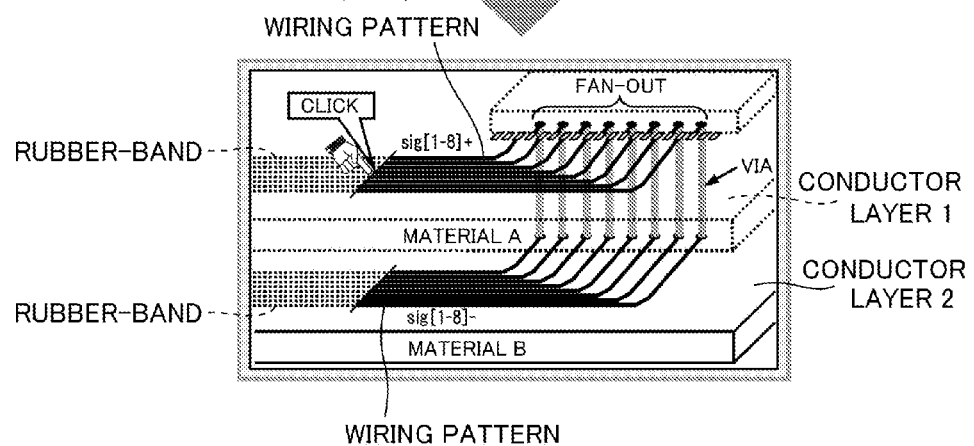

Next, as the line segment P1-P2 being the pass point of the wiring is clicked, the line segment P1-P2 moves and differential wiring to a clicked area is executed as shown in FIG. 34(c).

In this occasion, similarly to the examples shown in FIGS. 32(c) and (d), the three-dimensional electrical calculation apparatus automatically recognizes that connections in which an area other than the end "+" "−" of the signal names is the same make a pair, by which a pair of differential wirings is wired (for example, the apparatus recognizes that "sig1+" and "sig1−" are a pair).

Because the existence of a pair of differential wirings is recognized in this manner, half wirings out of the 16 wirings displayed on the conductor layer 1 are wired to the conductor layer 2 which is the lower layer of the conductor layer 1.

More particularly, as shown in FIG. 34(c), 8 wirings having the signal names "sig1+" to "sig8+", that is, sig[1-8]+ are wired to the conductor layer 1, and 8 wirings having the signal names "sig1−" to "sig8−", that is, sig[1-8]− are wired to the conductor layer 2, and wirings making a pair are wired on the conductor layer 1 and the conductor layer 2 which are vertically adjacent layers.

Further, in the wirings wired in a pair in such upper/lower layers, wiring patterns having sig1+ and wiring patterns having sig1− are wired at the same position on each layer. Specifically, since the wiring patterns are wired at the same coordinates when seen on XY plane, they are wired in an overlapped state when seen from above the substrate.

Further, in wiring to the conductor layer 2 by the differential wiring, fan-out processing (processing of reading out from terminal by wiring patterns to generate vias) is automatically performed and wiring is performed.

Specifically, as shown in FIG. 34(c), end portions of wiring patterns wired to the conductor layer 2 being a lower layer are electrically connected to the conductor layer 1 through vias which are generated so as to connect to objects of the conductor layer 1 being an upper layer.

The differential wiring used for broad band explained above is a case of performing differential wiring particularly to a bus having a large number of wirings, wiring efficiency is better when differential wiring is performed extending across upper/lower layers than wiring patterns having a large number of wirings on the same layer by arranging laterally as in conventional case.

For example, as shown in FIG. 35(a), in the case of wiring all of 16 buses on the same layer by arranging laterally, wiring was difficult in the state where clearance from a substrate external shape was kept based on design criterion due to a reason that enough wiring space could not be secured and a part of a wiring pattern extruded outside the substrate.

In the case of wiring all of the 16 wirings on the same layer in this manner, a component A shown in FIG. 35(a) needs to be moved to an inner side of the substrate, and arrangement space being a destination needs to be secured in order to move the component A to an inner side of the substrate. Accordingly, problems such that a need for changing component arrangement or wiring of the entire substrate arises or a need for spending enormous time for designing arises are caused.

On the other hand, as shown in FIG. 35(b), in the case where the 16 wirings are differentially wired on upper/lower layers, wiring in which clearance from a substrate external shape is kept based on design criterion is possible, and differential wiring is made possible without moving the component A.

Further, not limited to the above-described example, differential wiring on the same layer as shown in FIG. 35(a) requires wide wiring space and has limited arrangement positions of components and wiring routes, but as in FIG. 35(b) of the present invention, dividing necessary space for wiring into two for upper/lower layers and wiring on a ½ width increases options for arrangement positions of components and wiring routes and has better design efficiency.

In electronic substrates in recent years, substrate thickness is becoming thinner, and coupling performance is better when differential wiring is performed on upper/lower layers. Specifically, there is also an advantage that electromagnetic interference (Electro Magnetic Interference: EMI) is highly effectively reduced, so that a function of checking the structure of wirings and vias in height direction by the 3D display explained previously while differentially wiring easily on upper/lower layers is necessary.

As explained above, according to the three-dimensional electrical design apparatus 10 of the present invention, whether or not differential wiring in which wiring is performed extending across 2 layers is correctly wired between desired layers, the presence of disconnection, or the like can be instantly checked visually, so that it is possible to lighten the design error.

(5) Design Method of a Component-embedded Substrate

Demands for smaller and thinner electric products have increased in recent years, and even higher density of an electronic substrate or a semiconductor package has been required accordingly. To make the density of the electronic substrate higher, technique for easily designing a component-embedded substrate which is capable of mounting electronic components, which were mounted on the surface of the electronic substrate, on the inner layer of the electronic substrate is required.

The three-dimensional electrical design apparatus 10 by the present invention includes a function of easily designing a component-embedded substrate.

(5-1) Moving Components to a Component-embedded Substrate

FIG. 36(a) shows the state where electronic components (hereinafter, appropriately referred to as component) are mounted on the surface of the electronic substrate (hereinafter, appropriately referred to as substrate).

For example, in the three-dimensional electrical design apparatus 10 by the present invention, in the case of moving the components to an inner layer of the substrate and incorporate the components in the substrate, the movement is performed by dragging a component which is a target to be moved to a layer being a destination by using the mouse on the design screen of three-dimensional display.

Specifically, in FIG. 36(a), by selecting the component A by the mouse and dragging/moving it, the component A is moved to the fourth layer as shown in FIG. 36(b).

Further, with the movement of the component A between layers, a cavity necessary in mounting the component to an inner layer of the substrate is adapted to be automatically produced. Herein, the cavity indicates a hollow or a hole having space for embedding a component into the multilayer substrate, and the component is embedded into the formed hollow or hole. After embedding the component into the cavity being such a hollow or a hole, resin is poured into space left around the component, by which the embedded component is fixed.

In the three-dimensional electrical design apparatus 10 by the present invention, as the component is moved inside the substrate as shown in FIG. 36(b), a cavity suitable for the size of the component is automatically formed around the component.

Furthermore, in the case where a key component being an active component such as semiconductor, which is a primary part of the substrate, is dragged and moved, this apparatus detects that peripheral components or wiring patterns which are electrically connected with the key components exist, and automatically move the peripheral components and the wiring patterns as well together with the key component.

In the example shown in FIG. 36(b), a component X which is connected with the component A via a wiring pattern and a wiring pattern Z are moved to the inner layer together with the component A.

On the other hand, a component Y is not moved because it does not have electrical connection with the component A.

Further, in the case where the component to which moving instruction was given is not a key component but a passive component such as a resistor and a capacitor, it is adapted that peripheral components do not move and only the selected component is moved.

Now, in the generated cavity as explained above, grouping processing (described later) is performed together with a target component by this apparatus when the cavity is generated at the same time when it is generated, so in the case where an instruction of moving the component is made as shown in FIG. 36(c) for example, the cavity also moves following the movement of the component.

(5-2) Connection Method of an Embedded Component in a Component-embedded Substrate Herein, a method of performing electrical connection to a substrate-embedded component which is incorporated into the substrate explained above will be explained.

Figure 37A:
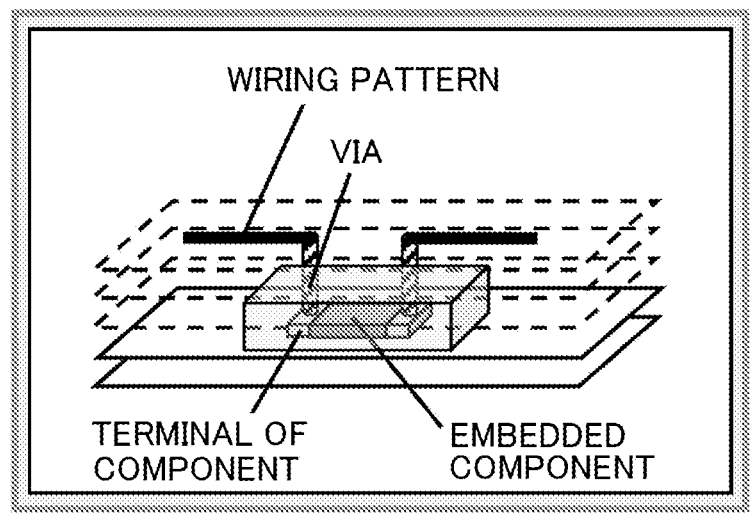
FIGS. 37(*a*)(*b*) are views for explaining a wiring method of a substrate-embedded component.
Figure 37B:
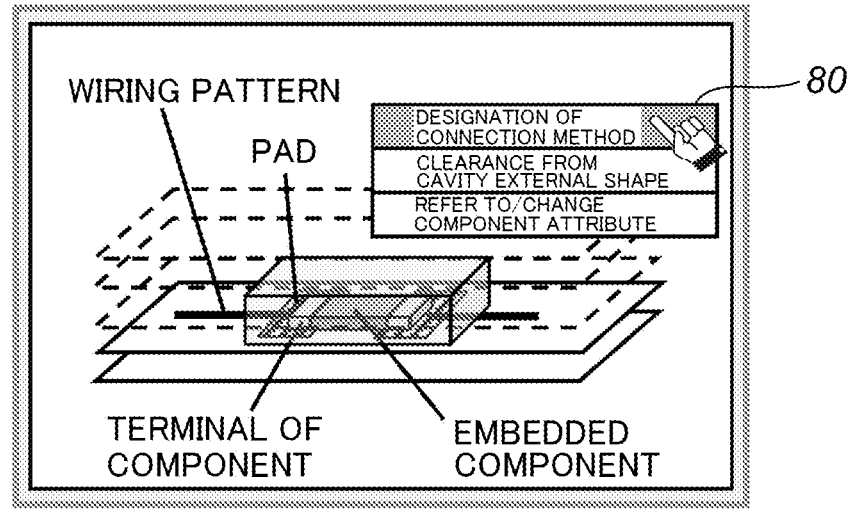

As shown in FIG. 37(a), in order to perform wiring of a substrate-embedded component, a method of performing wiring in which wirings are led out from the terminals of an embedded component to the first layer through vias, a method of performing wiring in which pads are generated for a layer on which the embedded component is arranged as shown in FIG. 37(b), or the like is given, and there is a need for wiring the embedded component by some methods.

Therefore, the three-dimensional electrical design apparatus 10 by the present invention, as shown in FIG. 37(b) made it possible to select a substrate-embedded component to which wiring is performed, and select a connection method out of a displayed menu.

More particularly, as designation of a connection method is selected out of the displayed menu 80 as shown in FIG. 37(b), a selection screen 82 of connection methods shown in FIG. 38(a) is displayed. The selection screen 82 of connection methods are adapted such that a connection method of wiring performed to the substrate-embedded component can be selected.

On the selection screen 82 of connection methods in FIG. 38(*a*), connection methods which are an upper side via connection which is a connection method by generating vias from the terminals of a component to an upper side, a lower side via connection which is a connection method by generating vias from the terminals of a component to a lower side, an upper/lower via connection which is a connection method by generating vias on both sides of the upper side and the lower side of the terminals of a component, a lower side pad connection which is a connection method by generating pads on the lower side of the terminals, a via/pad connection which is a connection method by generating vias on the upper side and generating pads on the lower side of the terminals, and an upper side pad connection which is a connection method by generating pads on the upper side of the terminals of a component are selectable for example.

Herein, the state where the lower side pad connection is selected by clicking using the pointer 18*c* is shown.

Further, pads and vias are automatically generated in the case where a connection method is selected on the selection screen 82 of connection methods shown in FIG. 38(*a*), and pads and vias to be generated are automatically generated by reading out the shapes of pads and vias registered in the component database shown in FIG. 38(*b*).

Herein, the component database shown in FIG. 38(*b*) indicates the shapes of connection pads and connection vias which are generated in selecting a shape and a connection method of a component whose model name is registered as "RMC1/16K". In the case where "RMC1/16K" is to be a substrate-embedded component, connection pads and connection vias having the shapes shown in FIG. 38(*b*) are severally automatically generated in arrangement at the positions shown in FIG. 38(*b*) as relative positions from the terminals of the component.

Now, as such a component database, component database stored in the external storage device 24 is read out.

With the movement of the substrate-embedded component to an area between layers in this manner, connection pads and connection vias for disposing in a connection destination are semi-automatically generated.

(5-3) Data Structure Regarding Design of a Component-embedded Substrate

Next, a data structure used in the case of incorporating components inside a substrate will be explained.

Figure 39:
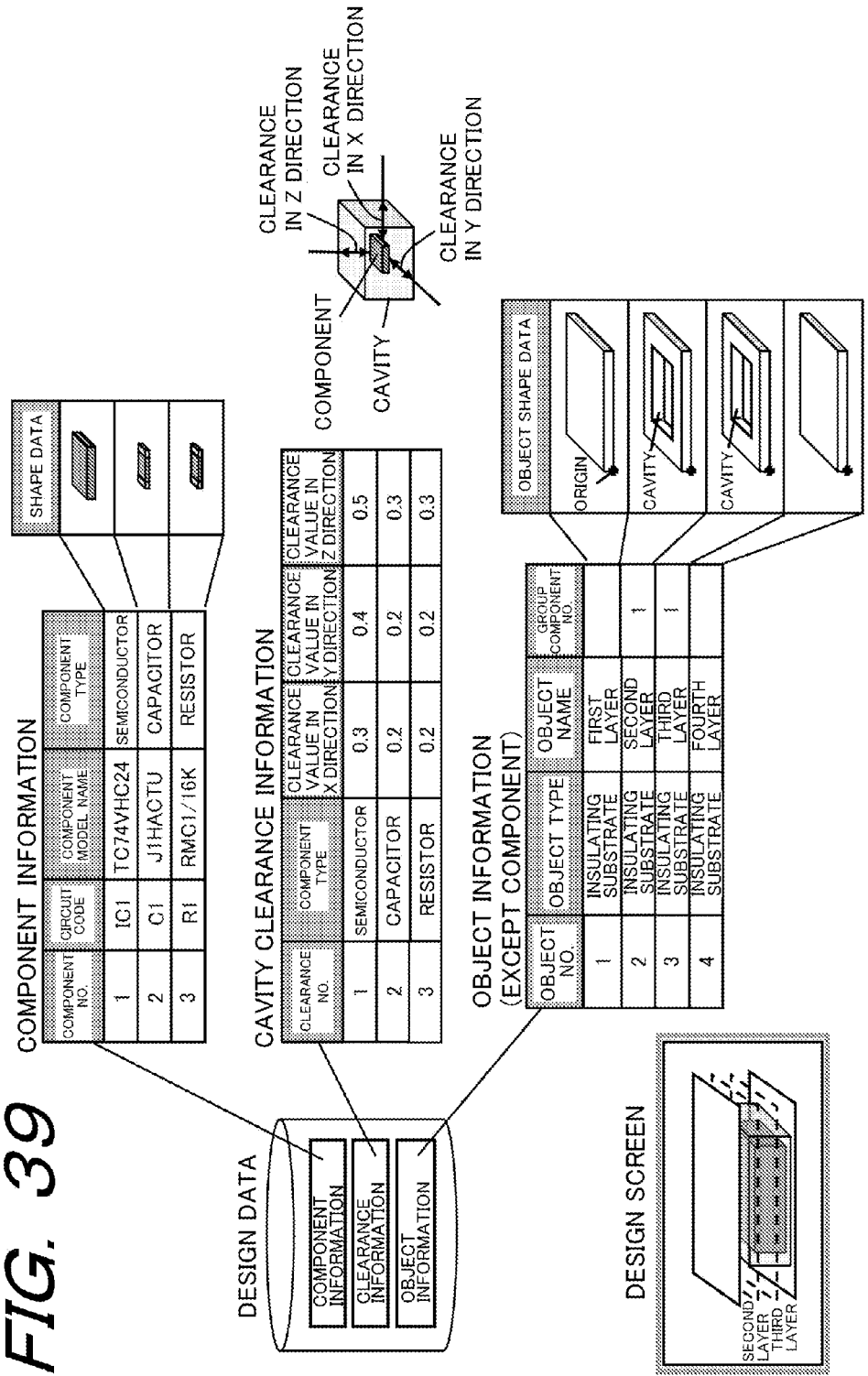
FIG. 39 is a view for explaining a data structure of the component database.

In this embodiment, component information, cavity clearance information and object information are stored in the design data as shown in FIG. 39.

Herein, information of each component and shape data of each component are stored as the component information.

Further, clearance values of a cavity external shape corresponding to component types are stored as the cavity clearance information.

Furthermore, information of objects other than objects such as an insulating substrate and shape data of each object are stored as the object information.

Components are incorporated in the substrate inner layer by using the information stored in such design data.

In the case where an operation of interlayer movement of components to an inner layer is performed by the designer, a clearance value suitable for a component type is read from the cavity clearance information for the selected component, and a cavity based on the obtained clearance value is generated for an object such as an insulating substrate.

For example, in the case where a component No. 1 stored in the component information shown in FIG. 39 is selected and an operation of moving it to the inner layer is performed, clearance values of semiconductor is read out from the cavity clearance information because the component type of the component No. 1 is semiconductor.

In this case, the clearance values of semiconductor are clearance value in X direction=0.3 mm, clearance value in Y direction=0.4 mm, and clearance value in Z direction=0.5 mm, so that a cavity is generated in an outer shape extended from the external shape of the component by 0.3 mm in X direction, 0.4 mm in Y direction, and 0.5 mm in Z direction respectively.

Then, in the case where the cavity is formed extending across a second layer to a third layer as the design screen shown in FIG. 39, cavities are generated on the insulating substrates of the second layer and the third layer respectively as shown in the object shape data in the object information.

Further, when cavities are generated on the insulating substrates of the second layer and the third layer as described above, group component No. is stored as 1 as a target embedded component in the group component No. of the object information, in the example of FIG. 39.

Thus, component No. 1 being an embedded component and the cavities of the insulating substrates are grouped, and as the embedded component is moved, the cavities also move following the movement.

Figure 40:
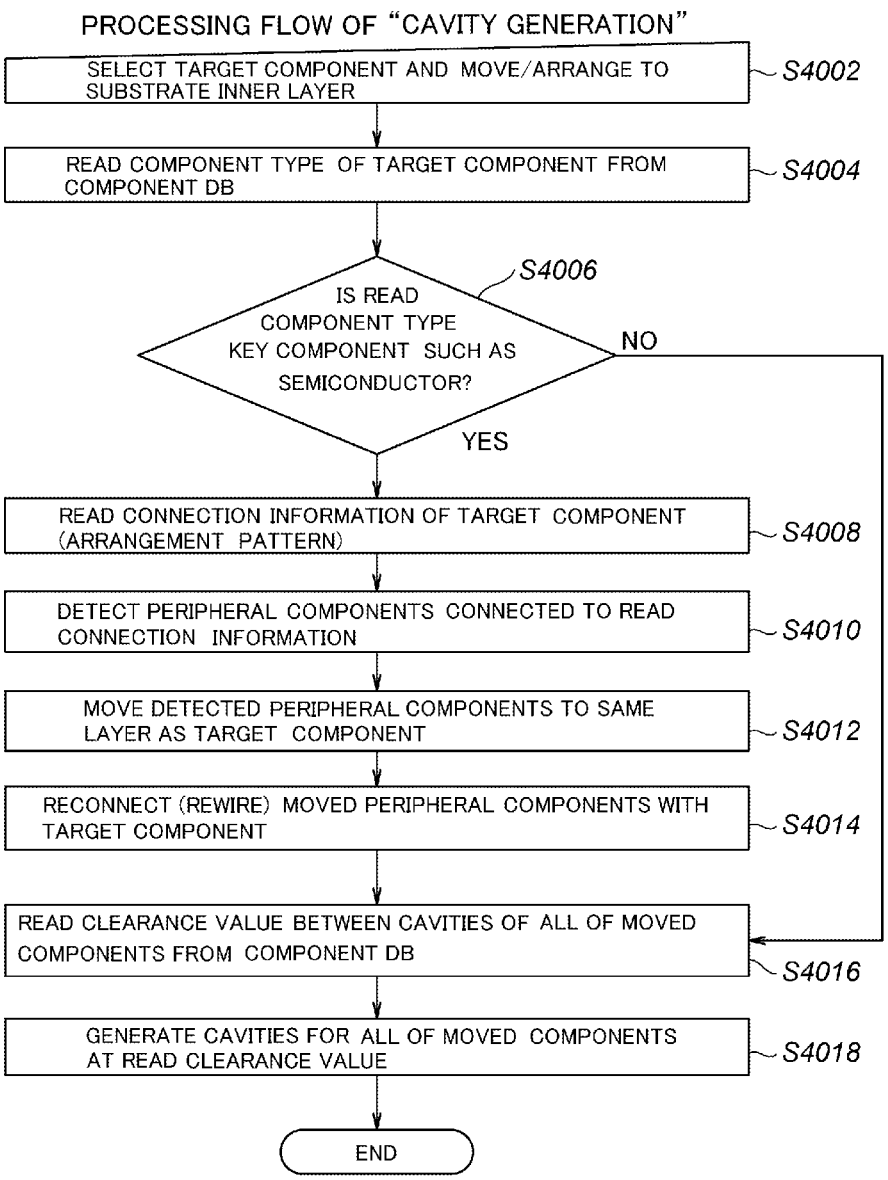
FIG. 40 is a flowchart for explaining a processing procedure of cavity generation processing.

Herein, based on the data structure, processing flow of generating a cavity will be explained below referring to the flowchart of FIG. 40.

First, as an operation of selecting a target component and moving/arranging the component to a substrate inner layer by the designer is performed, processing flow of generating a cavity is started (step S4002).

Next, in step S4004, processing of reading a component type of the target component from the component database performed.

Herein, processing of acquiring a component type for a component being a target to be moved out of the design data is performed.

Next in step S4006, processing whether or not the read component type is a key component such as semiconductor is performed.

Herein, as explained in FIGS. 36(*a*) and (*b*), judgment whether or not the component type is an active component (key component) such as semiconductor which is a primary part of the substrate is performed. In this embodiment, assuming that the component type is semiconductor, it is judged as Yes in the judgment processing on step S4006 and procedure proceeds to step S4008.

Then, in step S4008, connection information (wiring pattern) of the target component is read.

Herein, processing of checking a wiring state of the target component is performed.

Next in step S4010, processing of detecting peripheral components connected to the read connection information is performed.

Herein, details of components connected to the target component are checked.

Next, in step S4012, processing of moving the detected peripheral components to the same layer as the target component is performed.

Specifically, the peripheral components are moved to the destination of the selected target component by the designer. Then, in the layer of the destination, components are arranged such that the same state as the target component and the peripheral components before moving is reproduced.

Next, in step S4014, processing of reconnecting the moved peripheral components with the target component is performed. In the processing here, wiring is performed again so as to connect the moved peripheral components with the target component in the layer of the destination.

Then, in step S4016, processing of reading clearance values between cavities of all of the moved components from the component database is performed.

Herein, as explained above by using FIG. 39, processing of reading each clearance value from the cavity clearance information formed based on the component types of the moved components, from the design database, is performed.

Next, in step S4018, based on each clearance value read in the step S4016, processing of generating cavities for all of the moved components in the read clearance values is performed, and the processing flow of generating cavities ends.

On the other hand, in step S4006, in the judgment processing whether or not the read component type is a key component such as semiconductor, in the case where the component type is not a key component such as semiconductor, it is judged as No and procedure proceeds to step S4016.

In the case where the component being a target to be moved is not a key component as explained in FIGS. 36(*a*) and (*b*), peripheral components are not needed to be moved together with the target component, so that only the target component is moved, and processing of step S4016 and after is executed.

The processing above is the processing flow of generating cavities.

Next, based on the connection method and the data structure of a substrate-embedded component explained above, processing of connecting embedded components will be explained referring to the flowchart shown in FIG. 41.

Figure 41:
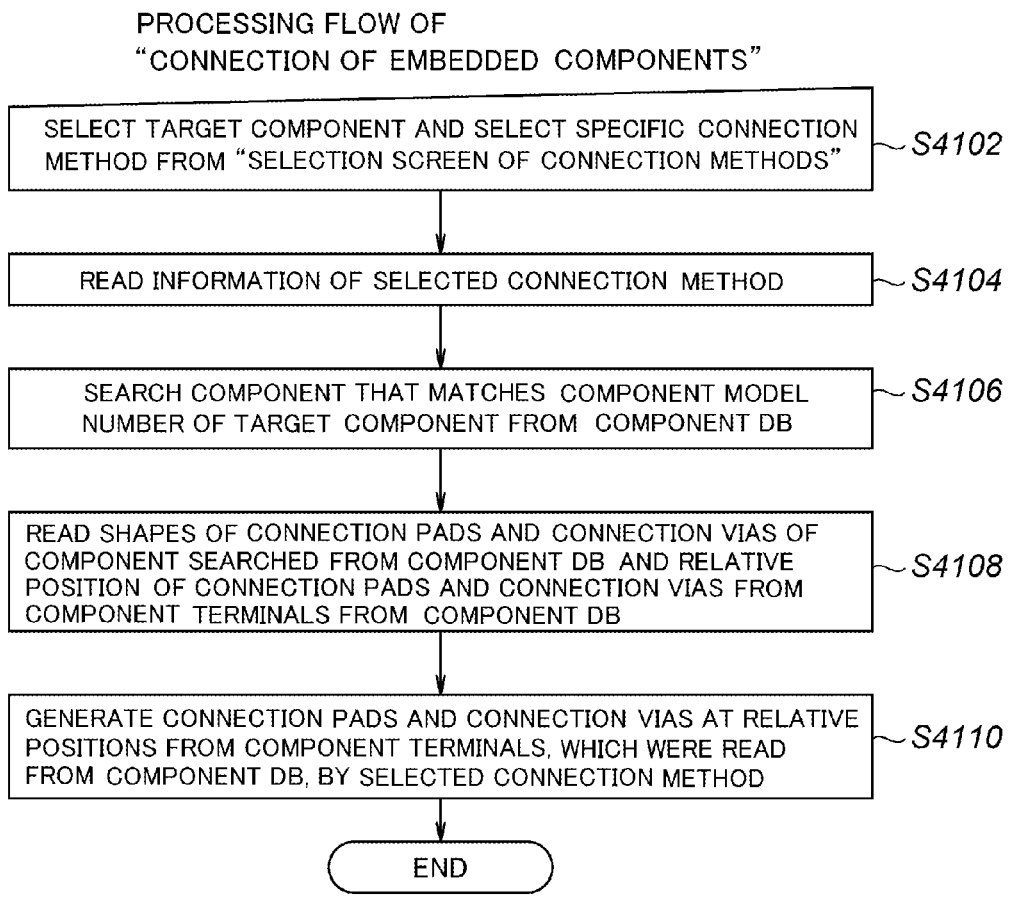
FIG. 41 is a flowchart for explaining a processing procedure of connection processing of an embedded component.

FIG. 41 shows the processing flow of the connection of embedded components.

In step S4102, as an operation of selecting a target component and selecting a specific connection method from the selection screen of connection methods is performed by the designer, the processing flow of the connection of embedded components is started.

The processing indicates an operation of selecting a desired connection method out of the selection screen 82 of connection methods, which is displayed by selecting the designation of a connection method out of the menu 80 shown in FIG. 37(*b*).

Next, in step S4104, processing of reading the information of the selected connection method is performed.

Herein, a type of the selected connection is read on the selection screen of connection methods.

Then, in step S4106, processing of searching a component which matches the component model number of the target component from the component database is performed.

Subsequently in step S4108, processing of reading the shapes of connection pads and connection vias of a component searched from the component database and relative positions of connection pads and connection vias from the terminals of the component from the component database is performed.

Herein, reading of the connection pad and the connection via of the target component as shown in FIG. 38(*b*), which corresponds to the component model number of the target component detected in step S4106 is performed.

Then, in step S4110, processing of generating the connection pads and the connection vias which were read from the component database on relative positions from the read component terminals in the selected connection method is performed.

Herein, the target component, the connection pads and the connection vias, which are disposed on the layer being a desired destination, are connected to the target component by the same method as the ones connected to the target component before movement.

The above-mentioned processing is the processing flow of the connection of embedded components.

As explained above, according to the three-dimensional electrical design apparatus 10 by the present invention, cavities are automatically formed for the substrate-embedded components which moved between layers, and connection pads and connection vias can be generated only by selecting a connection method, so it becomes possible to easily design a component-embedded substrate.

Figure 42A:
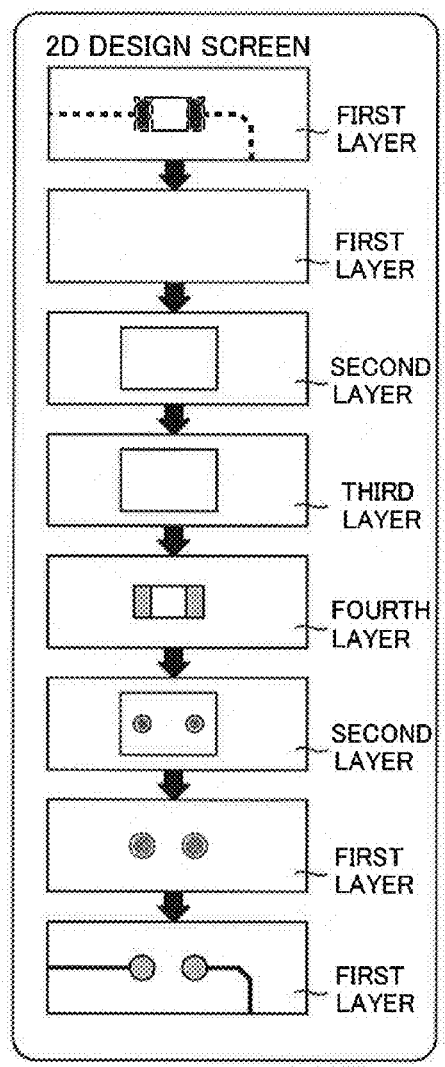
FIGS. 42(*a*)(*b*)(*c*) are views for explaining a processing method of design for the component-embedded substrate in the three-dimensional electrical design apparatus by the present invention.
Figure 42B:
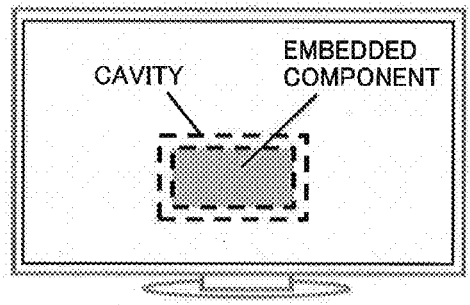
Figure 42C:
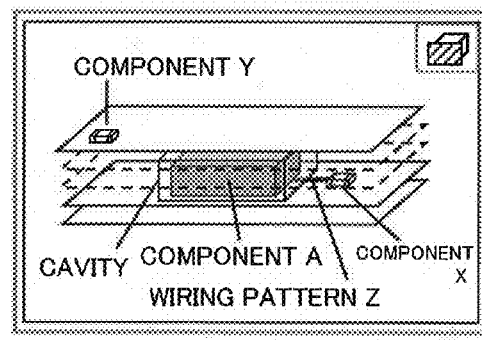

Specifically, in a conventional two-dimensional electrical design CAD, as shown in the design procedure of a component-embedded substrate of the two-dimensional electrical design CAD of FIG. 42(*a*), setting needs to be performed by each layer in arranging components on an inner layer of the multilayer substrate, which required many procedures.

Further, on the design screen of a conventional two-dimensional electrical design CAD, a two-dimensional shape in which the electronic substrate is seen from above is displayed as shown in FIG. 42(*b*), it was difficult to grasp information in height direction only by visually observing the substrate.

Furthermore, it was difficult to judge on which layer an embedded component was arranged or extending across which layers the cavities of the embedded component were arranged only by visually observing the substrate, and instantly judging it was difficult.

According to the three-dimensional electrical design apparatus 10 by the present invention, in incorporating components into the substrate, movement of components and automatic generation of cavities are performed only by an operation of dragging to move a component which is a target to be moved to a desired inner layer, so that design of a component-embedded substrate can be easily performed.

Further, design can be performed while three-dimensionally displaying electrical design data and visually checking information regarding height direction as to extending across which layers the cavities are arranged or the like as shown in FIG. 42 (*c*), and it becomes possible to reduce a design error.

As explained above, according to the three-dimensional electrical design apparatus 10 by the present invention, by making two-dimensional display and three-dimensional display easily switchable on the electrical design screen of the electronic substrate, a design error such as disconnection and arrangement error can be instantly checked, and it becomes possible to easily judge whether or not design corresponding to the specification of electrical design is secured.

It is to be noted that the above-described embodiment may be modified as shown in (1) to (3) below.

(1) in the embodiment described above, switching between two-dimensional display and three-dimensional display in the multilayer substrate in three-dimensional display is switched at the timing when the designer clicked the wheel button 18*a* of the mouse 18. However, it goes without saying that the invention is not limited to this, but the touchpad 20 and the mouse 18 may be combined to perform switching instruction between two-dimensional display and three-dimensional display, instead of the wheel button 18*a*.

(2) In the embodiment described above, two-dimensional display and three-dimensional display were selected and displayed on the display screen. However, it goes without saying that the invention is not limited to this, and two-dimensional display and three-dimensional display may be displayed side by side on the same screen.

(3) The above-described embodiment and the modified examples (1) and (2) may be appropriately combined.

INDUSTRIAL APPLICABILITY

The present invention can be used in designing an electronic substrate, and specifically, can be used in electrical design of an electronic substrate of various products.

EXPLANATION OF NUMERICAL CHARACTER

10 Three-dimensional electrical design apparatus
12 CPU
14 Internal storage device
16 Display device
18 Mouse
20 Touchpad
22 Keyboard
24 External storage device
30 Camera

The invention claimed is:

1. An apparatus for designing an electronic substrate using three-dimensional space, the apparatus comprising:
  a memory for storing a program; and
  a processor configured to operate on the program to generate:
    a user interface configured to set a first position coordinate indicating a viewpoint position when three-dimensionally displaying an electronic substrate including a plurality of conductor layers and a plurality of insulating layers each arranged between adjacent two conducting layers of the plurality of conductor layers, and a first direction indicating a visual line direction, wherein the first position coordinate and the first direction are set in accordance with an editing target conductor layer of the plurality of conductor layers;
    a controller configured to control generation of a three-dimensional display image of the electronic substrate, based on the first position coordinate and the first direction set by the user interface, such that one or more upper conductor layers and one or more upper insulating layers, which are arranged above the editing target conductor layer, are displayed in a mode selected from a plurality of modes, the plurality of modes including a first mode in which the one or more upper conductive layers and the one or more upper insulating layers are displayed in a transparent manner and a second mode in which the one or more upper conductive layers and the one or more upper insulating layers are displayed at positions higher than original positions thereof so that the editing target layer can be visually checked, while one or more lower conductor layers and one or more lower insulating layers, which are arranged below the editing target conductor layer, and the editing target layer are displayed at original positions thereof;
    a display controller configured to cause a display device to display the three-dimensional display image generated by the controller; and
    an editor configured to perform electrical design of the electronic substrate on the three-dimensional display image displayed by the display device.

2. The apparatus according to claim 1, wherein the user interface sets a second position coordinate indicating a viewpoint position when two-dimensionally displaying the electronic substrate and a second direction indicating a visual line direction, wherein the second position coordinate and the second direction are set in accordance with the editing target layer out of the plurality of layers,
  the controller, based on the second position coordinate and the second direction, controls the generation of a two-dimensional display image of the electronic substrate, and
  the display controller causes the display device to display the two-dimensional display image generated by the controller.

3. The apparatus according to claim 2, wherein the controller controls the display controller so as to select one of the three-dimensional display image and the two-dimensional display image as a display image displayed by the display device.

4. The apparatus according to claim 1, wherein
  the display controller causes the display device to display specification information used for designing the electronic substrate together with a three-dimensionally displayed electronic substrate, and
  the editor associates the specification information with the electronic substrate, and controls the display controller so as to reflect the specification information on the display of the electronic substrate.

5. The apparatus according to claim 1, wherein the editor allows a user to move an interlayer arrangement of electronic components constituting the electronic substrate, wherein the controller controls generation or movement of cavities by the editor.

6. The apparatus according to claim 1, wherein a first wiring pattern of a plurality of wiring patterns is differentially wired to the electronic substrate by the editor, and the controller wires a second wiring pattern of the plurality of wiring patterns to a layer adjacent to the first wiring pattern.

7. The apparatus according to claim 1, wherein the plurality of modes includes a third mode in which outer frames of the one or more upper conductive layers, among the one or more upper conductive layers and the one or more upper insulating layers, are displayed in a dashed line.

8. A method for designing an electronic substrate including a plurality of conductor layers and a plurality of insulating layers each arranged between adjacent two conductor layers of the plurality of conductor layers, the method comprising:
  setting, in accordance with an editing target conductor layer of the plurality of conductor layers, a first position coordinate indicating a viewpoint position when three-dimensionally displaying the electronic substrate, and a first direction indicating a visual line direction,
  generating a three-dimensional display image of the electronic substrate, based on the first position coordinate and the first direction, such that one or more upper conductor layers and one or more upper insulating layers, which are arranged above the editing target layer, are displayed in a mode selected from a plurality of modes, the plurality of modes including a first mode in which the one or more upper conductive layers and the one or more upper insulating layers are displayed in a transparent manner and a second mode in which the one or more upper conductive layers and the one or more upper insulating layers are displayed at positions higher than original positions thereof so that the editing target conductor layer can be visually checked, while one or more lower conductor layers and one or more lower insulating layers, which are arranged below the editing target conductor layer, and the editing target layer are displayed at original positions thereof, displaying the three-dimensional display image, and performing electrical design of the electronic substrate on the three-dimensional display image.

9. A non-transitory memory medium storing a program for causing a computer to perform a method for designing an electronic substrate including a plurality of conductor layers and a plurality of insulating layers each arranged between adjacent two conductor layers of the plurality of conductor layers, the method comprising:

setting, in accordance with an editing target conductor layer of the plurality of conductor layers of an electronic substrate, a first position coordinate indicating a viewpoint position when three-dimensionally displaying the electronic substrate, and a first direction indicating a visual line direction, generating a three-dimensional display image of the electronic substrate, based on the first position coordinate and the first direction, such that one or more upper conductor layers and one or more upper insulating layers, which are arranged above the editing target conductor layer, are displayed in a mode selected from a plurality of modes, the plurality of modes including a first mode in which the one or more upper conductive layers and the one or more upper insulating layers are displayed in a transparent manner and a second mode in which the one or more upper conductive layers and the one or more upper insulating layers are displayed at positions higher than original positions thereof so that the editing target conductor layer can be visually checked, while one or more lower conductor layers and one or more lower insulating layers, which are arranged below the editing target conductor layer, and the editing target layer are displayed at original positions thereof, displaying the three-dimensional display image, and performing electrical design of the electronic substrate on the three-dimensional display image.

* * * * *